United States Patent [19]
Tobita

[11] Patent Number: 6,087,885
[45] Date of Patent: Jul. 11, 2000

[54] SEMICONDUCTOR DEVICE ALLOWING FAST AND STABLE TRANSMISSION OF SIGNALS

[75] Inventor: Youichi Tobita, Hyogo, Japan

[73] Assignee: Mitsubishi Denki Kabushiki Kaisha, Tokyo, Japan

[21] Appl. No.: 09/149,050

[22] Filed: Sep. 8, 1998

Related U.S. Application Data

[63] Continuation-in-part of application No. 09/041,687, Mar. 13, 1998.

[30] Foreign Application Priority Data

Sep. 11, 1997 [JP] Japan ................................ 9-246643
Jun. 19, 1998 [JP] Japan ................................ 10-173363

[51] Int. Cl.$^7$ .................................................. H03K 17/16
[52] U.S. Cl. ........................................ 327/379; 327/538
[58] Field of Search ................................ 327/333, 379, 327/382, 383, 384, 389, 391, 538, 540, 541, 543, 310, 311, 313, 530; 326/33, 81

[56] References Cited

U.S. PATENT DOCUMENTS

| | | | |
|---|---|---|---|
| 4,791,326 | 12/1988 | Vajdic et al. ........................... | 327/541 |
| 4,833,350 | 5/1989 | Frisch ...................................... | 326/64 |
| 4,837,460 | 6/1989 | Uchida .................................... | 327/382 |
| 5,760,640 | 6/1998 | Girard et al. ........................... | 327/543 |
| 5,767,699 | 6/1998 | Bosnyak et al. ....................... | 327/543 |
| 5,880,623 | 3/1999 | Levinson ................................ | 327/540 |

FOREIGN PATENT DOCUMENTS

| | | |
|---|---|---|
| 2-290327 | 11/1990 | Japan . |
| 4-117717 | 4/1992 | Japan . |
| 6-326591 | 11/1994 | Japan . |

OTHER PUBLICATIONS

"Development of 16M bit Synchronous Graphics RAM", M. Harada et al., NEC Giho vol. 50, No. Mar. 1997, pp. 16–19.

*Primary Examiner*—Toan Tran
*Attorney, Agent, or Firm*—McDermott, Will & Emery

[57] ABSTRACT

Internal power supply voltages at predetermined voltage levels are produced on output nodes of an output circuit in accordance with internal voltages generated by first and second voltage generating circuits which in receive a reference voltage on their inputs having high impedances. Stabilizing capacitors are connected to internal power supply nodes of this output circuit. The internal power supply voltage depends on MOS transistors operating in a source follower mode. During operation of the output circuit, charging and discharging currents are driven through the stabilizing capacitors, and an output signal having a limited amplitude can be reliably generated to an output node.

20 Claims, 37 Drawing Sheets

FIG. 45A
| Cv | 0.1 | 0.2 | 0.3 | 0.4 | 0.5 |
|---|---|---|---|---|---|
| Cc | 0.8 | 0.6 | 0.4 | 0.2 | 0 |
| Cg | 0.1 | 0.2 | 0.3 | 0.4 | 0.5 |
| Ct | 0.188 | 0.35 | 0.47 | 0.53 | 0.5 |
FIG. 45B
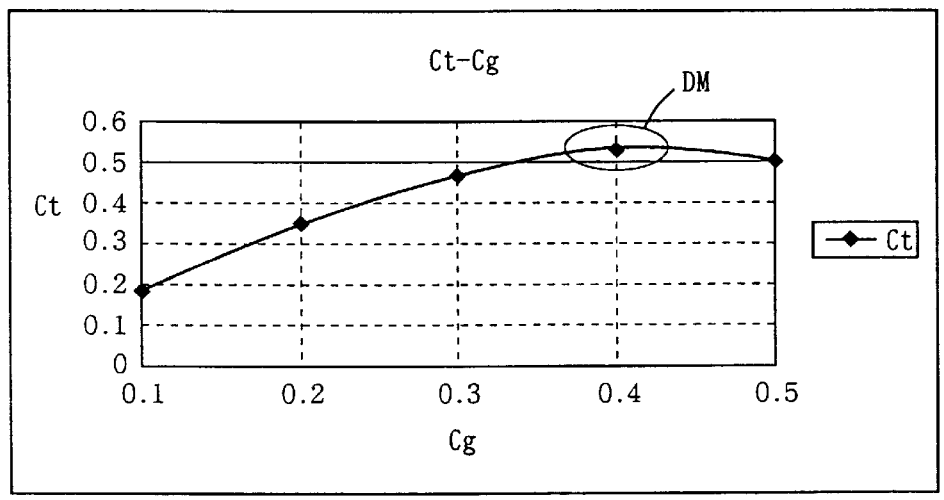
FIG. 46A
| Cv | 0.39 | 0.4 | 0.41 | 0.42 | 0.43 | 0.44 | 0.45 |
|---|---|---|---|---|---|---|---|
| Cc | 0.22 | 0.2 | 0.18 | 0.16 | 0.14 | 0.12 | 0.12 |
| Cg | 0.39 | 0.4 | 0.41 | 0.42 | 0.43 | 0.44 | 0.45 |
| Ct | 0.5306 | 0.533 | 0.5351 | 0.5359 | 0.5356 | 0.533 | 0.532 |
FIG. 46B
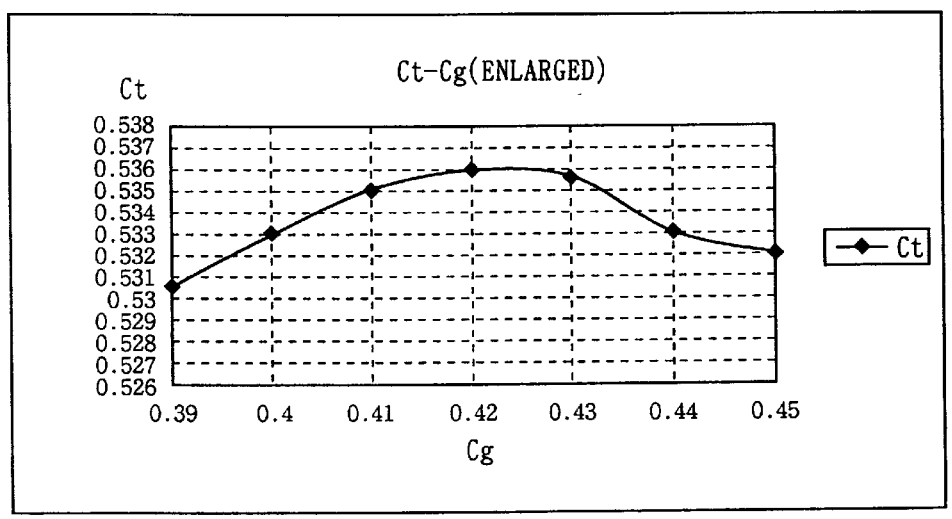

SEMICONDUCTOR DEVICE ALLOWING FAST AND STABLE TRANSMISSION OF SIGNALS

RELATED APPLICATIONS

This application is a Continuation-In-Part application of U.S. patent application Ser. No. 09/041,687, filed Mar. 13, 1998.

BACKGROUND OF THE INVENTION

1. Field of the Invention

The present invention relates to an output circuit in a semiconductor device including a logic circuit and/or a memory circuit, and in particular to a structure of an output circuit which is arranged at an output stage of a semiconductor integrated circuit chip, for fast and stable transmission of signals.

2. Description of the Background Art

With increase in operation speed of semiconductor integrated circuits, speeds of signal transmission between a plurality of integrated circuit devices have been increased. For fast transmission, it is necessary to reduce transition times (i.e., rising time and falling time) of a signal to be transmitted. If the signal amplitude is large, the issues in connection with crosstalk noises caused by capacitive coupling between signal lines, switching noises causing ringing of signals, electromagnetic radiation resulting from fast charging and discharging of signal lines and increase in power consumption become more significant. For overcoming these problems, various methods for transmitting signals with reduced signal amplitude have been proposed or developed, and such a method has been known that a terminating resistance is arranged at a signal input side for reducing the signal amplitude by this terminating resistance. As one of the methods for reducing the signal amplitude in the above manner, the class I method in SSTL-3 (Stub Series Terminated Logic for 3.3 V) has been proposed.

Also, Japanese Patent Laying-Open No. 6-326591 (1994) has disclosed an amplitude limiting circuit of such type.

In the structure wherein the signal amplitude is limited by such a terminating resistance, a signal level depends on a resistance ratio between a resistance (on-resistance) of a transistor (MOS transistor) in the on state included in an output circuit and a terminating resistance. However, a DC current flows from the terminating resistance through a transmission path to the transistor in the on state of the output circuit, which increases the current consumption.

The resistance value of the terminating resistance depends on the value of the intrinsic impedance of the transmission line (because the impedance matching is established to prevent waveform distortion due to reflection of signals). Therefore, when the signal amplitude is determined, the resistance value of this terminating resistance is determined in advance, so that the on-resistance of the transistor at the final output stage of this output circuit is uniquely determined for achieving the required amplitude limitation. In an unsaturated region, a ratio between a drain current of a MOS transistor and a voltage between a drain and a source, i.e., a drain-source voltage is given as a function of a ratio $\beta$ between the channel width and the channel length. When the on-resistance is determined, therefore, the value of this coefficient or ratio $\beta$ is determined, so that a current drive capability of this output MOS transistor is determined in advance. Therefore, a fan-out at the output circuit is limited, and fast driving of a large number of circuits becomes difficult.

For overcoming the problems in the structure which uses the terminating resistance for achieving the small amplitude operation, such a structure has been proposed that the operation power supply voltage level of the output circuit is adjusted, so that the output circuit itself adjusts the output signal amplitude (see Japanese Patent Laying-Open No. 6-326591 (1994)).

FIG. 65 shows a structure of an output portion of a semiconductor integrated circuit device in the prior art, which is disclosed, e.g., in the foregoing prior art reference.

In FIG. 65, a conventional semiconductor integrated circuit device CH includes a power supply circuit PW1 which produces an internal power supply voltage VCC1 lower than a power supply voltage VCC in accordance with an internally generated reference voltage VTT, a power supply circuit PW2 which produces another internal power supply voltage VSS1 higher than a ground voltage VSS in accordance with reference voltage VTT, and an output circuit OB which operates using, as operation power supply voltages, both of internal power supply voltage VCC1 on internal power supply line CL and power supply voltage VSS1 on internal ground line SL, and drives an output node ND in accordance with an internal signal NI to produce an output signal OUT to be transmitted to another chip (not shown). A stabilizing capacitance C is connected between internal power supply line CL and internal ground line SL.

Output circuit OB is formed of a CMOS inverter formed of a p-channel MOS transistor Qa and an n-channel MOS transistor Qb.

Voltage levels of internal power supply voltages VCC1 and VSS1 produced by power supply circuits PW1 and PW2 depend on the resistance value of the terminating resistance provided at the destination chip, the on-resistances of MOS transistors Qa and Qb, output voltage VOUT of output signal OUT, and an input signal voltage VIN at the destination chip.

Reference voltage VTT is set to a voltage level of VCC/2, i.e., a half of power supply voltage VCC (VSS=0V). Now, a signal output operation of the semiconductor integrated circuit device shown in FIG. 65 will be described below with reference to a signal waveform diagram of FIG. 66.

Power supply circuit PW1 supplies internal power supply voltage VCC1 lower than power supply voltage VCC. Power supply circuit PW2 supplies another internal power supply voltage VSS1 higher than ground voltage VSS. The internal circuit operates using both power supply voltage VCC and ground voltage VSS as the operation power supply voltages, and internal signal NI changes between power supply voltage VCC and ground voltage VSS.

When internal signal NI is at L-level, output circuit OB is in such a state that MOS transistor Qa is on while MOS transistor Qb is off, and output signal OUT is held at the voltage level determined by the terminating resistance and the on-resistance of MOS transistor Qa. When internal signal rises from L-level to H-level, MOS transistor Qa is turned off, and MOS transistor Qb is turned on. When the voltage difference between the internal signal NI and the other power supply potential VSS1 exceeds a threshold voltage of MOS transistor Qb, discharging of output node ND starts, so that the voltage level of output signal OUT lowers. Finally, output signal OUT is stabilized at the voltage level determined by the ratio between the terminating resistance and the on-resistance of MOS transistor Qb. If the terminating resistance is not present, the H-level (VOH) of output signal OUT is the voltage level of internal power supply voltage VCC1, while the L-level of output signal OUT is the voltage level of the other power supply voltage VSS1.

In the structure of the semiconductor integrated circuit device shown in FIG. 65, the values of on-resistances of MOS transistors Qa and Qb are adjusted by setting the voltage levels of internal power supply voltages VCC1 and VSS1 to appropriate values, respectively, if the terminating resistance is present.

For example, consider a differential amplifier DA at an input portion of the destination chip CHa as shown in FIG. 67. Differential amplifier DA receives input signal VIN (output signal OUT of integrated circuit device CH shown in FIG. 65) at its negative input through a terminating resistance RT, and receives input signal VIN at its positive input. The negative input of differential amplifier DA is held at reference voltage VTT. The terminating resistance RT has a resistance value which is determined in accordance with a characteristic impedance of a transmission path for transmitting output signal OUT. It is now assumed that the terminating resistance RT has the resistance value of 50 Ω, the L-levels of output signal OUT and input signal VIN shown in FIG. 65 are equal to (VTT−400 mV), and the on-resistances of transistors Qa and Qb in output circuit OB shown in FIG. 65 are 25 Ω. In this case, lower potential internal power supply voltage VSS1 is set to a value of (VTT−600 mV). Likewise, internal power supply voltage VCC1 is set to (VTT+600 mV) if the H-levels of output and input signals OUT and VIN are (VTT+400 mV). In this case, the voltage levels of internal power supply voltages VCC1 and VSS1 are determined in accordance with the on-resistances of MOS transistors Qa and Qb. In other words, by changing the voltage levels of internal power supply voltages VCC1 and VSS1, the on-resistances of MOS transistors Qa and Qb are changed, and thereby the current driving capability is adjusted. In this manner, a required fan-out can be achieved.

If terminating resistance RT is not employed, DC current can be prevented from flowing from terminating resistance RT and the on-state MOS transistor included in output circuit OB to reference voltage VTT supply (in destination chip CHa). Even in this case, internal power supply voltages VCC1 and VSS1 determine the voltage level of output signal OUT, so that the small amplitude operation can be achieved.

FIG. 68 shows a structure of power supply circuit PW1 shown in FIG. 65. In FIG. 68, power supply circuit PW1 includes resistance elements Ra and Rb of high resistances which are connected in series between power supply line VL and a node NDb, an n-channel MOS transistor Qc having a gate and a drain connected to node NDb, and an n-channel MOS transistor Qd having a drain connected to power supply line VL and a gate connected to a node NDa. MOS transistor Qc receives reference voltage VTT at its source. MOS transistor Qd has its source connected to internal power supply line CL, and generates internal power supply voltage VCC1 onto internal power supply line CL.

In the structure of the power supply circuit PW1 shown in FIG. 68, a minute current flows through high-resistance resistance elements Ra and Rb, so that MOS transistor Qc operates in the diode mode. Therefore, the voltage level on node NDb takes the value of (VTT+|Vth|), where Vth represents the threshold voltage of MOS transistor Qc. The voltage level on node NDa connecting resistance elements Ra and Rb is determined by the resistance ratio between resistance elements Ra and Rb. When resistance elements Ra and Rb have equal resistance value to each other, the voltage level on node NDa is given by the following representation with respect to ground voltage VSS.

$$(VCC+VTT+Vth)/2=(\sqrt[3]{4})VCC+(Vth/2)$$

MOS transistor Qd at the output stage operates in a source-follower mode because its gate voltage is lower than power supply voltage VCC (Vth<VTT=VCC/2). Therefore, internal voltage VCC1 on internal power supply line CL is given by the following representation:

$$VCC1=(\sqrt[3]{4})VCC-(\sqrt[1]{2})Vth$$

By setting the resistance ratio between resistance elements Ra and Rb to an appropriate value, the value of internal power supply voltage VCC1 expressed by the above representation can be adjusted. In this case, internal power supply voltage VCC1 changes in accordance with the voltage level of power supply voltage VCC. Power supply circuit PW2 has a structure similar to that of the power supply circuit shown in FIG. 68, and can be implemented by changing the voltage polarities and the conductivity types of the transistors. In this case, lower potential internal power supply voltage VSS1 is given by the following representation:

$$VTT/2+Vthp/2=VCC/4+Vthp/2$$

The Vthp represents an absolute value of the threshold voltage of the p-channel MOS transistor. If threshold voltages Vth and Vthp are equal to each other, a signal has upper and lower amplitudes each equal to (VCC/4−Vth/2) at opposite sides with respect to a center defined by reference voltage VTT (=VCC/2).

In the structure of the power supply circuit shown in FIG. 68, however, a current flows from power supply line VL through resistance elements Ra and Rb as well as MOS transistor Qc, and the voltage level of reference voltage VTT changes, so that the internal power supply voltages VCC1 and VSS1 cannot be accurately set to the intended voltage levels. The high and low levels of the signal have different amplitudes with respect to the center, and therefore symmetry in signal amplitude cannot be achieved, so that the timings at which the H- and L-levels of input signal are defined are different from each other. Accordingly, it is necessary to determine the input signal definition timing taking the worst case into account, so that a fast operation cannot be ensured.

Since the output circuit transmits signals to a large number of semiconductor integrated circuit devices, a large current flows. In this case, it is necessary to compensate for the consumed current by the stabilizing capacitance C shown in FIG. 65. If the fan-out is large, however, the stabilizing capacitance must have a large capacitance in order to compensate for the large consumed current. It is difficult to implement such a stabilizing capacitance within a restricted region on the semiconductor integrated circuit device, resulting in a disadvantage that the internal power supply voltage cannot be produced stably.

In the structure of the above prior art, the intermediate voltage VTT between the power supply voltage VCC and ground voltage VSS is produced within the semiconductor integrated circuit device, and is set to the voltage level (VCC/2) equal to a half of power supply voltage VCC. When variation in internal power supply voltage occurs in the semiconductor integrated circuit devices (semiconductor chips), the reference voltage level in each semiconductor integrated circuit device (semiconductor chip) differs from those in the other devices. Therefore, signal transmission between the semiconductor integrated circuit devices cannot be performed accurately because the reference voltage levels of the devices are different from each other.

In recent years, a system LSI in which a processor or a logic is integrated with a memory on a common semiconductor chip has been developed. In this system LSI, a data bus of a sufficiently large width can be arranged between the memory and the processor or logic (which will be referred to as a processing circuit), because these are arranged on the same semiconductor chip and there is no restriction by the number of pin terminals. This allows fast transmission of data between the processing circuit and the memory. Upon driving of the bus of such a large bit width, many circuits which drive the internal data bus operate simultaneously so that a current consumption increases to lower a power supply voltage, resulting in a reduced operation margin with respect to the power supply voltage. This is true also for the ground voltage. In the system LSI, internal data is usually transferred in synchronization with a clock signal. Therefore, a charge/discharge frequency of the internal data bus is high, and EMI (Electromagnetic Interference) caused by the semiconductor chip increases due to such fast charging and discharging so that electronic equipments near the chip may malfunction.

The foregoing large current consumption results in a large heat emission so that reliability of the system LSI decreases (because the heating may cause malfunction and/or open-circuit of internal interconnection lines).

SUMMARY OF THE INVENTION

An object of the invention is to provide a semiconductor integrated circuit capable of normally stably producing an output signal having an amplitude of which center is defined by a constant voltage level.

Another object of the invention is to provide a semiconductor integrated circuit capable of outputting a signal having a signal amplitude center is set at a voltage level independent of a power supply voltage.

Still another object of the invention is to provide a semiconductor integrated circuit provided with a stabilizing capacitance having a good area efficiency for implementing an output signal amplitude limiting function.

Yet another object of the invention is to provide a semiconductor integrated circuit which can stably output a signal at a desired voltage level even during a signal output operation.

Further another object of the invention is to provide a semiconductor integrated circuit which can stably produce an output signal while sufficiently suppressing variation in its operation power supply voltage even during a signal output operation.

A circuit to a first aspect of the present invention includes: a first MOS transistor coupled between a first node and an output node for electrically connecting the output node and the first node in accordance with an internal signal; a second MOS transistor coupled between a second node and the output node for being turned on complementarily with the first MOS transistor to connect electrically the output node and the second node in accordance with the internal signal; a first voltage generating circuit for receiving a reference voltage on its input having a high input impedance, and generating a constant voltage between the reference voltage and a voltage of a first voltage source; a second voltage generating circuit for receiving the reference voltage on its input having a high input impedance, and generating a constant voltage between the reference voltage and a voltage of a second voltage source; a first internal power supply circuit for supplying a current from a first power supply to the first node in accordance with a difference between an output voltage of the first voltage generating circuit and a voltage on the first node; and a second internal power supply circuit for supplying a current from the second node to the second power supply different from the first power supply in accordance with a difference between an output voltage of the second voltage generating circuit and a voltage on the second node.

A circuit according to a second aspect of the invention, a circuit includes a first voltage generating circuit for generating and transmitting a voltage lower than a voltage of a first power supply to a first node; a second voltage generating circuit for generating and transmitting a voltage higher than a voltage of a second power supply to a second node; an output circuit connected between the first and second nodes for transmitting a signal at a level of the voltage on one of the first and second nodes in accordance with a supplied internal signal; a first capacitance element connected to the first node; a second capacitance element connected to the second node; and a third capacitance element connected between the first and second nodes.

A circuit according to a third aspect of the invention, includes: a first voltage generating circuit for generating and transmitting a voltage lower than a voltage on a first power supply to a first node; a second voltage generating circuit for generating and transmitting a voltage higher than a voltage on a second power supply to a second node; an output circuit for operating with the voltages on the first and second nodes as operation power supply voltages, and driving an output node in accordance with an applied internal signal; a first capacitance element connected between the first node and a first reference node receiving a voltage of the same polarity as the first power supply; a second capacitance element connected between the second node and a second reference node receiving a voltage of the same polarity as the second power supply; a third capacitance element connected between the first node and the second reference node; and a fourth capacitance element connected between the second node and the first reference node.

Preferably, the circuit further includes a memory array having a plurality of memory cells, a plurality of internal data bus lines for transferring data with a selected memory cell in the memory array, and a processing circuit for transferring data with the memory array through the plurality of internal data bus lines. An output circuit formed of a pair of first and second insulated gate field effect transistors is provided corresponding to each of the plurality of internal data bus lines and is arranged between the memory array and the processing circuit.

In accordance with the reference voltage on the input of the high input impedance the internal power supply voltage is produced. Thus, the operation of generating the internal power supply voltage does not affect the reference voltage, and therefore the reference voltage is stably held at a desired voltage level. An internal power supply voltage having an intended voltage level can be stably generated. Accordingly, an output signal having an intended small amplitude can be stably produced.

Owing to connection of the two capacitance elements in parallel with each of the first and second nodes, the voltages on the first and second nodes can be stabilized during a circuit operation, so that a signal at an intended voltage level can be stably output.

In addition, when the above described configuration is applied to a bus driver output in a circuit device having a logic or processor and a memory integrated on a common chip, data and signal can be stably transferred at high speed between the memory and the logic or processor.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 45A and 45B show relationships between combined capacitances and capacitance values of capacitor elements in the stabilizing capacitance shown in FIG. 43;

FIGS. 46A and 46B show more specifically a region near the maximum values of the combined capacitance value shown in FIGS. 45A and 45B;

DESCRIPTION OF THE PREFERRED EMBODIMENTS

[Embodiment 1]

Figure 1:
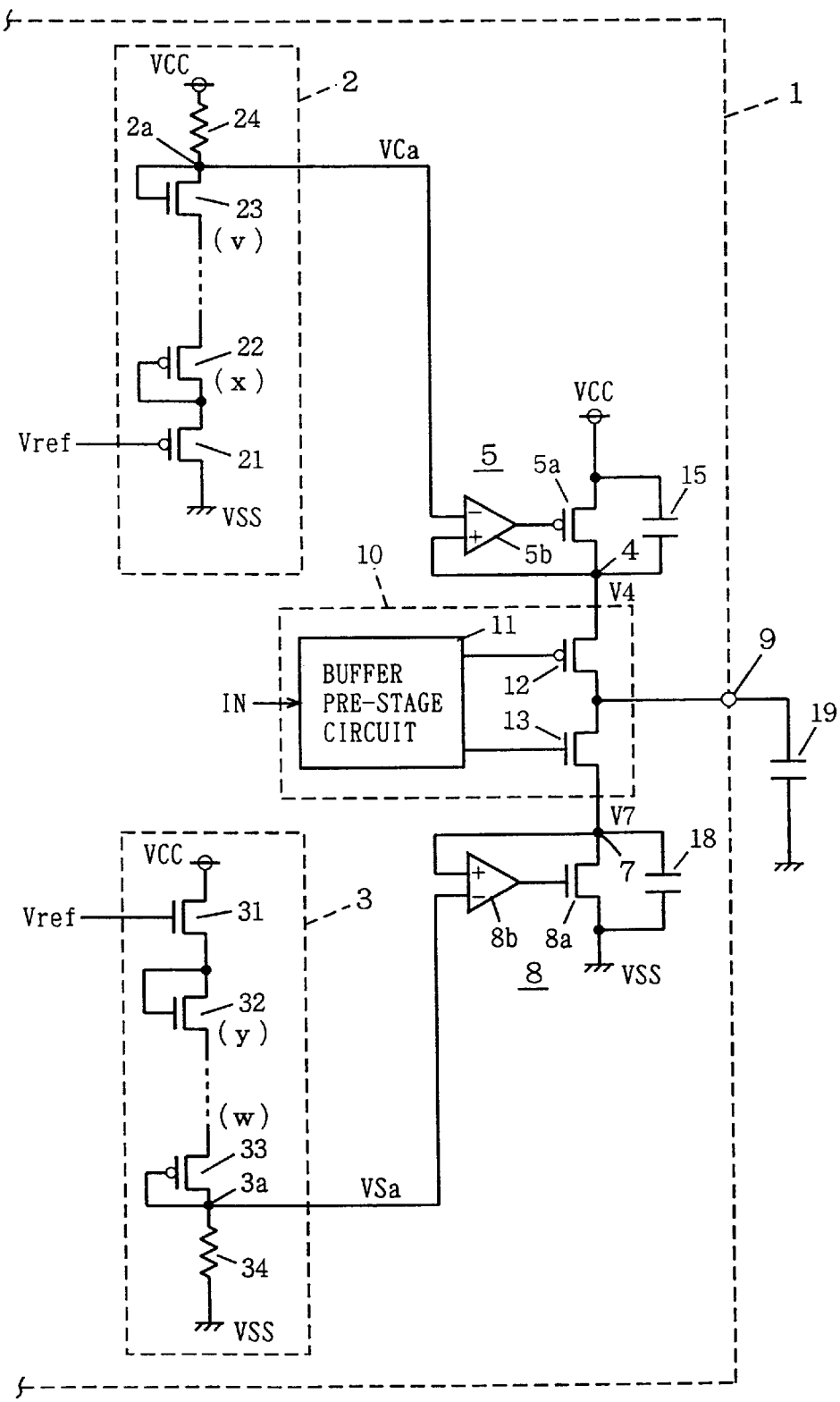
FIG. 1 specifically shows a structure of a main portion of a semiconductor integrated circuit according to an embodiment 1 of the invention.

FIG. 1 shows a structure of a signal output portion of a semiconductor integrated circuit according to an embodiment 1 of the invention. In FIG. 1, semiconductor integrated circuit 1 includes a first voltage generating circuit 2 which receives a reference voltage Vref through a high input impedance, and produces a voltage VCa at a level between reference voltage Vref and a power supply voltage VCC in accordance with reference voltage Vref, a second voltage generating circuit 3 which receives reference voltage Vref through a high input impedance, and produces a voltage VSa at a level between a ground voltage VSS and reference voltage Vref in accordance with reference voltage Vref, a first power supply circuit 5 which is connected between a first node 4 and a first power supply (voltage source) VCC (each power supply and its voltage are indicated by the same reference character) supplying a power supply voltage VCC, and produces an internal power supply voltage V4 in accordance with a voltage VCa supplied from the first voltage generating circuit 2 for transmission onto first node 4, a second power supply circuit 8 which is connected between a second node 7 and a second power supply (voltage source) VSS supplying ground voltage VSS, and produces a lower internal power supply voltage V7 in accordance with a voltage VSa supplied from the second voltage generating circuit 3 for transmission onto second node 7, and an output circuit 10 which transmits one of voltages on first and second nodes 4 and 7 to an output node 9 in accordance with an internal signal IN.

First power supply circuit 5 includes a p-channel MOS transistor 5a connected between first power supply VCC and first node 4, and a comparison circuit 5b which makes a comparison between voltage VCa supplied from first voltage generating circuit 2 and higher internal power supply voltage V4 on first node 4, and adjusts a conductance of p-channel MOS transistor 5a in accordance with a result of this comparison. Comparison circuit 5b is formed of a differential amplifier which receives voltage V4 on first node 4 on its positive input, and voltage VCa supplied from first voltage generating circuit 2 on its negative input.

Second power supply circuit 8 includes an n-channel MOS transistor 8a connected between second power supply VSS and second node 7, and a comparison circuit 8b which makes a comparison between voltage VSa supplied from second voltage generating circuit 3 and voltage V7 on second node 7, and adjusts a conductance of n-channel MOS transistor 8a in accordance with a result of this comparison. Comparison circuit 8b is formed of a differential amplifier which receives voltage V7 on second node 7 on its positive input, and voltage VSa supplied from second voltage generating circuit 3 on its negative input.

When voltage VCa is higher than the voltage on first node 4, the output signal of comparison circuit 5b attains a low level in accordance with a difference between voltages VCa and V4, and the conductance of MOS transistor 5a increases, so that a current is supplied from first power supply VCC to first node 4, and the voltage level of voltage V4 increases. When voltage V4 is higher than voltage VCa, the output signal of comparison circuit 5b attains H-level, so that MOS transistor 5a cuts off a current path from first power supply VCC to first node 4. Therefore, voltage V4 on first node 4 is held at the level of voltage VCa.

Likewise, when voltage V7 on second node 7 is higher than voltage VSa, the output signal of comparison circuit 8b attains a high level in accordance with a difference between them, and the conductance of MOS transistor 8a increases, so that a current is supplied from first node 7 to second power supply VSS to lower the voltage level of voltage V7. When voltage V7 is lower than voltage VSa, the output signal of comparison circuit 8b attains L-level, so that MOS transistor 8a is turned off to cut off a current path from second node 7 to second power supply VSS. Therefore, voltage V7 is held at the level of voltage VSa.

Output circuit 10 includes a buffer pre-stage circuit 11 which receives and buffers internal signal IN for outputting, a p-channel MOS transistor (first MOS transistor) 12 which is connected between first node 4 and output node 9, and is turned on in accordance with a signal from buffer pre-stage circuit 11 to electrically connect first node 4 and output node 9 together, and an h-channel MOS transistor (second MOS transistor) 13 which is responsive to the signal from buffer pre-stage circuit 11 to be turned on complementarily with MOS transistor 12 to electrically connect output node 9 and second node 7 together. MOS transistor 12 drives output node 9 to the voltage level on first node 4 when turned on. MOS transistor 13 drives output node 9 to the voltage level on second node 7 when turned on.

First voltage generating circuit 2 includes a resistance element 24 connected in series between first and second power supplies VCC and VSS, diode-connected n-channel MOS transistors 23 of v in number (v=0, 1, 2, . . . ), diode-connected p-channel MOS transistors 22 of x in number (x: an integer larger than 0), and a p-channel MOS transistor 21 receiving reference voltage Vref on its gate. Resistance element 24 has a sufficiently large resistance value, and sufficiently reduces a current flowing from first power supply VCC to second power supply VSS in first voltage generating circuit 2. Therefore, MOS transistors 23 and 22 operate in the diode mode, and cause voltage drop of the absolute values of threshold voltages VTN and VTP, respectively.

MOS transistor 21 receives reference voltage Vref on its gate. The gate of MOS transistor 21 is connected to an internal node via a gate insulating film, and provides a high input impedance. Even when a minute current flows from first power supply VCC to second power supply VSS in first voltage generating circuit 2, this current does not exert any influence on reference voltage Vref, and reference voltage Vref is stably held at an intended voltage level.

Second voltage generating circuit 3 includes an n-channel MOS transistor 31 connected in series between first and second power supplies VCC and VSS, diode-connected n-channel MOS transistors 32, diode-connected p-channel MOS transistors 33 and a resistance element 34. In second voltage generating circuit 3, n-channel MOS transistor(s) of y in number (y: an integer of 0 or more) and p-channel MOS transistor(s) of w in number (w: an integer of 0 or more) operate in the diode mode owing to the resistance element 34 of a high resistance, and cause voltage drop of the absolute values of threshold voltages VTN and VTP, respectively. MOS transistor 31 receives reference voltage Vref on its gate, and operates in the source-follower mode. In second voltage generating circuit 3, reference voltage Vref is applied to the gate of MOS transistor 31, and likewise the high impedance is achieved, so that a current in second voltage generating circuit 3 does not affect reference voltage Vref, and reference voltage Vref can be stably held at a constant voltage level.

Semiconductor integrated circuit device 1 further includes a stabilizing capacitance 15 connected between first power supply VCC and first node 4, and a stabilizing capacitance 18 connected between second node 7 and second ground voltage VSS. These stabilizing capacitances 15 and 18 have capacitance values sufficiently larger than the capacitance value of an external load capacitance 19. Now, an operation of the circuit shown in FIG. 1 will be described below.

In first voltage generating circuit 2, resistance element 24 has a resistance value sufficiently larger than equivalent resistance values (on-resistances) of MOS transistors 21–23. MOS transistors 22 and 23 operate in the diode mode, and MOS transistor 21 operates in the source-follower mode. Therefore, voltage VCa from a connection node 2a between resistance element 24 and MOS transistor 23 can be expressed by the following representation:

$$VCa = Vref + |VTP| + x \cdot |VTP| + v \cdot VTN \quad (1)$$

where x, v=0, 1, 2, . . .

MOS transistor 5a has a gate potential set to a voltage level corresponding to a difference between voltages VCa and V4 in accordance with the output signal of comparison circuit 5b, and transmits voltage V4, which is expressed by the following representation, onto first node 4.

$$V4 = VCa \quad (2)$$

Likewise, in second voltage generating circuit 3, MOS transistor 31 operates in the source-follower mode to transmit a voltage lower by threshold voltage VTN than the reference voltage, and MOS transistors 32 and 33 operate in the diode mode to cause voltage drop in absolute values of threshold voltages VTN and VTP, respectively. Therefore, voltage VSa from a connection node 3a between MOS transistor 33 and resistance element 34 can be expressed by the following representation:

$$VSa = Vref - VTN - y \cdot VTN - w \cdot |VTP| \quad (3)$$

where y, w=0, 1, 2, . . .

MOS transistor 8a has a gate voltage set in accordance with a voltage difference between voltage V7 on second node 7 and voltage VSa. Therefore, second power supply circuit 8 operates to supply voltage V7, which is expressed by the following representation, onto second node 7.

$$V7 = VSa \quad (4)$$

When output circuit 10 drives output node 9 in accordance with internal signal IN, voltage V4 on first node 4 or voltage V7 on second node 7 is transmitted onto output node 9. Therefore, the voltages at high and low levels of the signal at output node 9 are set to values expressed by the foregoing representations (2) and (4). By changing the number v or x of diode-connected MOS transistors 22 and 23 in first voltage generating circuit 2, the voltage level of voltage V4 on first node 4 can be changed by a step of |VTP| or VTN. The voltage level of voltage V7 on second node 7 can likewise be changed by a step of |VTP| or VTN.

Figure 2:
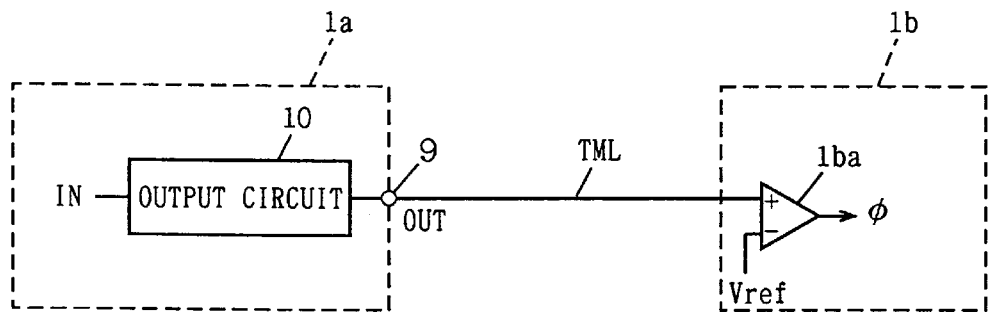
FIG. 2 shows a connection between semiconductor integrated circuits.

FIG. 2 shows an example of a form of connection between two semiconductor integrated circuits. In FIG. 2, an output signal OUT is transferred from a semiconductor integrated circuit 1a to a semiconductor integrated circuit 1b. Output node 9 of output circuit 10 included in semiconductor integrated circuit 1a is coupled to an input circuit 1ba included in semiconductor integrated circuit 1b through a transmission line TML. Input circuit 1ba compares reference voltage Vref with the signal transmitted through transmission line TML, and produces an internal signal φ in accordance with a result of this comparison. Input circuit 1ba is formed of a differential amplifier circuit. More specifically, reference voltage Vref which determines an amplitude of signal OUT generated from output circuit 10 is used as a reference level for logically determining the input signal at the input circuit of destination semiconductor integrated circuit 1b. Reference voltage Vref is supplied from a portion outside the chip.

In the structure shown in FIG. 1, it is assumed that first voltage generating circuit 2 includes diode-connected p-channel MOS transistor 22 of x in number equal to 1 as well as n-channel MOS transistor 23 of v in number equal to 0, and second voltage generating circuit 3 includes diode-connected n-channel MOS transistor 32 of y in number equal to 1 as well as p-channel MOS transistor 33 of w in number equal to 0. In this case, voltages V4 and V7 on first and second nodes 4 and 7 are expressed by the following representations, respectively:

$$V4 = Vref + 2 \cdot |VTP|$$

$$V7 = Vref - 2 \cdot VTN$$

Figure 3:
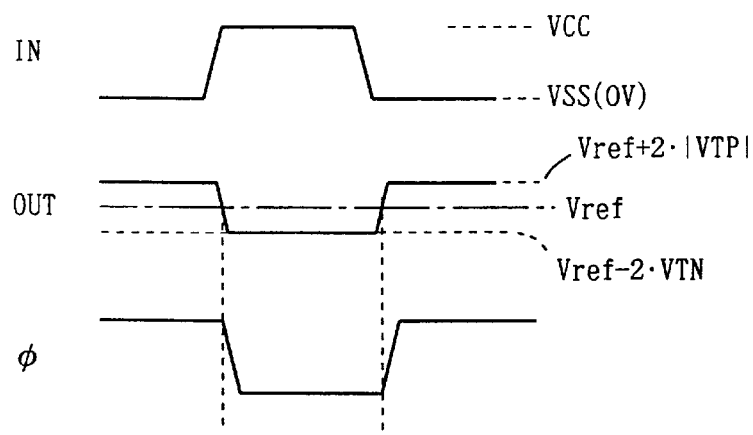
FIG. 3 is a signal waveform diagram representing an operation of the semiconductor integrated circuit shown in FIGS. 1 and 2.

Accordingly, as shown in FIG. 3, the high level of signal OUT generated from output circuit 10 onto output node 9 is equal to (Vref+2·|VTP|), and the low level thereof is equal to (Vref−2·VTN). Therefore, output signal OUT changes by 2·|VTP| upward and by 2·VTN downward with reference voltage Vref as a center. Usually, the absolute value |VTP| of the threshold voltage of the p-channel MOS transistor is substantially equal to the value of the threshold voltage VTN of the n-channel MOS transistor. Therefore, it is possible to generate the signal which changes by the substantially equal magnitude with reference voltage Vref as a center.

In input semiconductor integrated circuit 1b, input circuit 1ba determines the voltage level of the signal received through transmission line TML relative to measurement reference of reference voltage Vref. Signal OUT transmitted through transmission line TML has upper and lower amplitudes of equal values with respect to the center of reference voltage Vref. Therefore, input circuit 1ba can determine the high and low levels of the input signal at the same timing, and the voltage level of the input signal can be determined rapidly and accurately for producing internal signal φ.

This reference voltage Vref may be set to a voltage level of VCC/2 or of 0.45·VDDQ as shown in the class I system of SSTL-3 already described. In order to retain compatibility with the class I system of SSTL-3 and others, it is preferable to set reference voltage Vref to 0.45·VDDQ. Here, voltage VDDQ is the power supply voltage which is used only at the final stage of the output circuit.

Figure 4:
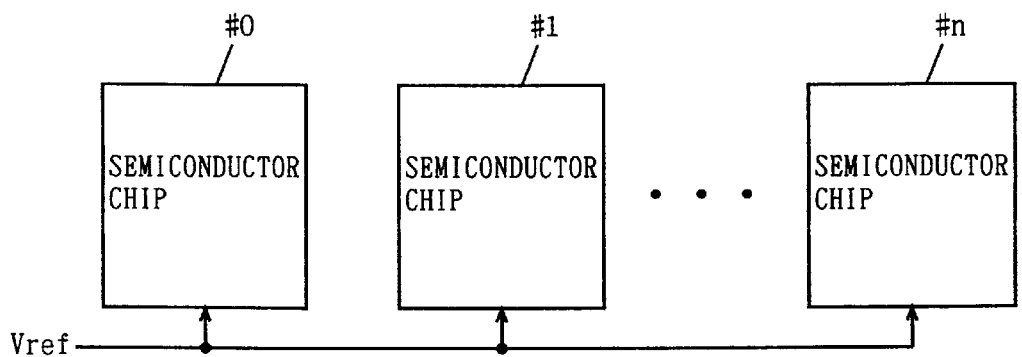
FIG. 4 schematically shows a structure of a system having the invention applied.

Referring to FIG. 4, description will now be made on a structure in which reference voltage Vref is externally supplied commonly to semiconductor chips #0–#n each including a semiconductor integrated circuit. In this arrangement, reference voltage Vref is kept at a constant voltage level independent of operation situations of semiconductor chips #0–#n. Even if reference voltage Vref varies, a signal from the output circuit of each of semiconductor chips #0–#n has a center at reference voltage Vref, and its output signal level changes in accordance with variation of reference voltage Vref. Reference voltage Vref is used also as the comparison reference voltage of the input circuit. Even when the voltage level of reference voltage Vref changes, therefore, the semiconductor integrated circuit device at the input side can accurately determine the logical level of the input signal, and erroneous determination of the input signal does not occur even when reference voltage Vref changes, so that an accurate circuit operation can be ensured.

In the circuit shown in FIG. 1, a load capacitance 19 is connected to output node 9. The capacitance value of load capacitance 19 changes depending on a fan-out of output circuit 10. During operation of the output circuit, charging and discharging are performed through MOS transistors 5a and 8a. It is now assumed that MOS transistor 12 is turned on, and load capacitance 19 is charged to a high level. In this case, fast charging and discharging of load capacitance 19 to the high level are required for the fast operation. MOS transistor 5a has a gate voltage determined by the output signal of comparison circuit 5b, and is off in a steady state.

For preventing occurrence of ringing, comparison circuit 5b operates with a relatively small operation current and a relatively low response speed, so that rapid transition of MOS transistor 5a to a deep on-state is suppressed. Therefore, it is difficult to supply a current rapidly from first power supply 2 to first node 4. For rapidly supplying a current without ringing, first capacitance element (stabilizing capacitance) 15 is connected between first power supply VCC and first node 4. When the voltage on first node 4 rapidly lowers, charges are transmitted from first capacitance element (stabilizing capacitance) 15 to load capacitance 19. The voltage level on first node 4 at this time is determined by capacitive division of capacitances 15 and 19.

In order to suppress lowering of the voltage level on first node 4 due to this transfer of charges, it is preferable that stabilizing capacitance 15 has the capacitance value sufficiently larger than the capacitance of load capacitance 19. Practically, a capacitance ratio between load capacitance 19 and stabilizing capacitance 15 is set to 1:10 or more, and preferably to 1:100 or more in view of an area occupied by load capacitance 15. Thereby, lowering of voltage on first node 4 can be suppressed without causing the ringing, and load capacitance 19 can be rapidly charged to a predetermined voltage level. For example, in a fast system, load capacitance 19 has a capacitance value of about 50 pF ($50 \times 10^{-12}$ F), and therefore stabilizing capacitance 15 has the capacitance value of about 5 nF ($5 \times 10^{-9}$ F).

Even during discharging of load capacitance 19, MOS transistor 8a operates in a saturated region, and its equivalent (effective) resistance is relatively high, so that fast discharging of charges on second node 7 is difficult. In this case, stabilizing capacitance (second capacitance element) 18 absorbs the supplied charges to achieve fast discharging. In this case, therefore, stabilizing capacitance 18 has the capacitance value sufficiently larger than the capacitance value of load capacitance 19 and similar to that of stabilizing capacitance 15.

According to the embodiment 1 of the invention, as described above, the voltage generating circuit having a high input impedance is used to produce the internal voltage in accordance with the reference voltage, and the internal power supply voltage determining the amplitude of the output signal is produced through the internal voltage. Therefore, the internal voltage at an intended voltage level can be produced stably and accurately with the internal voltage generating operation exerting no influence on the reference voltage.

Since the power supply circuit is formed of the comparison circuit and the drive element of which conductance is adjusted by the output signal of the comparison circuit, the internal power supply voltage at the intended voltage level can be accurately produced.

Owing to the structure in which the reference voltage is commonly supplied to a plurality of semiconductor integrated circuits, the level of the reference voltage is not affected even during the operation of the integrated circuit, and the internal voltage at a constant level can be stably and accurately produced without an influence by power supply noises during the operation of the circuit.

The central value of the amplitude of the output signal is set to the reference voltage level which provides the reference for determining the high and low levels of the input signal. Even when the reference voltage varies, therefore, a destination device can stably and accurately determine the logical level of the input signal without being affected by the variation in the reference voltage.

Since the stabilizing capacitance is connected to each of the first and second nodes serving as the internal power supply voltage supply nodes, charging and discharging can be rapidly performed in the signal output operation owing to these stabilizing capacitances. Therefore, charging and discharging of the output node can be rapidly and reliably performed while suppressing power supply noises, and the output circuit capable of fast operation can be implemented.

[Embodiment 2]

Figure 5:
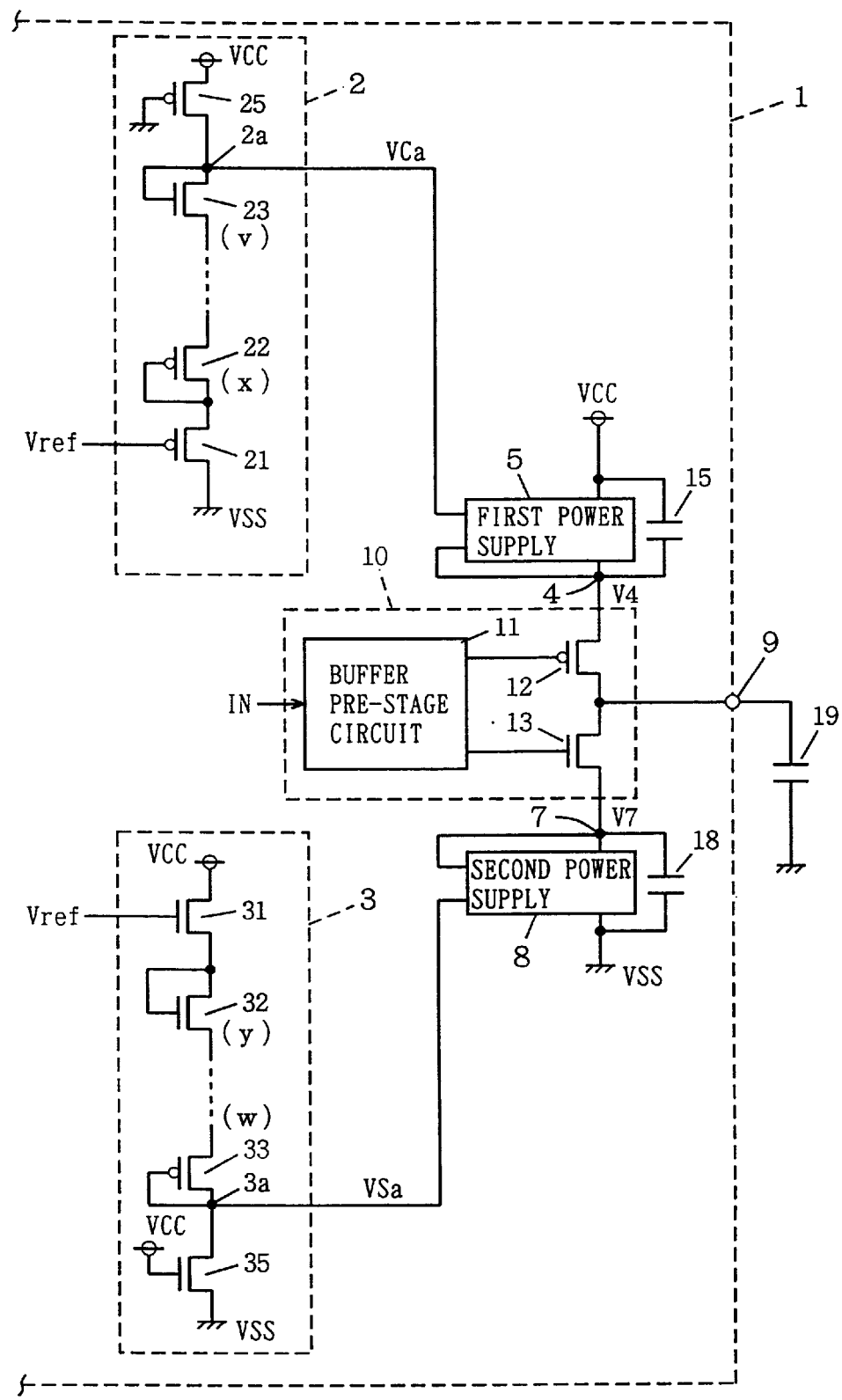
FIGS. 5 to 9 show structures of main portions of the semiconductor integrated circuits according to embodiments 2 to 6 of the invention, respectively.

FIG. 5 shows a structure of an output portion of a semiconductor integrated circuit according to an embodiment 2 of the invention. In the structure shown in FIG. 5, first voltage generating circuit 2 includes, as a resistance element, a p-channel MOS transistor 25 which has a gate coupled to receive the ground voltage and is connected between first power supply VCC and internal node 2a. Second voltage generating circuit 3 likewise includes, as a resistance element, an n-channel MOS transistor 35 which has a gate connected to first power supply VCC and is connected between internal node 3a and the second power supply. Structures other than the above are the same as those shown in FIG. 1. Corresponding portions bear the same reference numerals, and will not be described below in detail.

In the structure shown in FIG. 5, p-channel MOS transistor 25 and n-channel MOS transistor 35 have high channel resistances. These high channel resistances are achieved by reducing an amount of impurity implanted into channel regions. As the resistance elements, p-channel MOS transistor 25 and n-channel MOS transistor 35, which usually have channel resistances higher than a resistance element formed of, e.g., polycrystalline silicon, are used, whereby area occupied by the resistance elements can be reduced, and an area of the chip can be reduced (because the MOS transistor has a larger resistance value per area than the resistance element of, e.g., polycrystalline silicon).

According to the embodiment 2 of the invention, as described above, the MOS transistor is used as the resistance element for supplying a minute current in the voltage generating circuit. Therefore, an area of a region in which the resistance element is formed can be reduced, and the chip area can be reduced.

[Embodiment 3]

Figure 6:
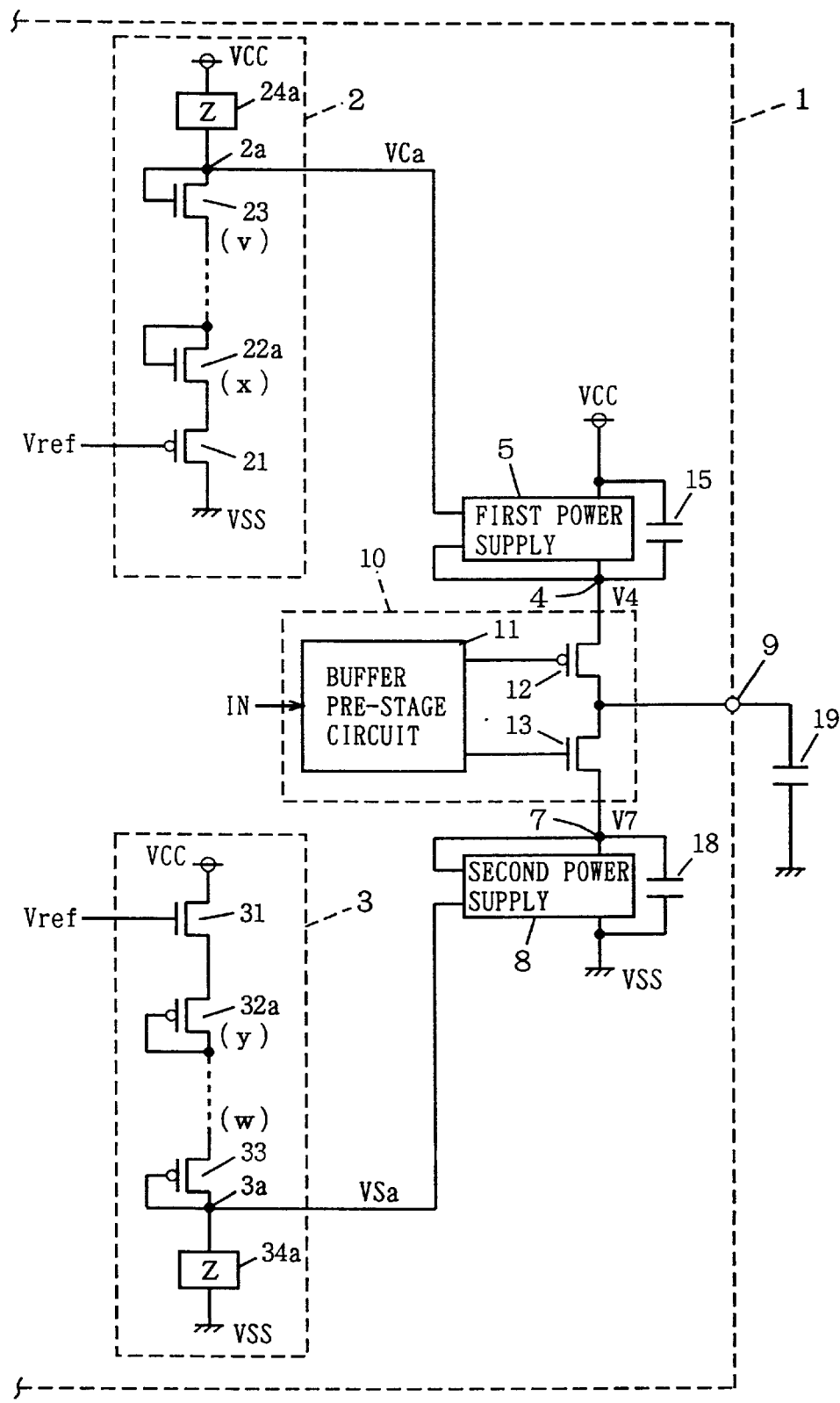

FIG. 6 shows a structure of a signal output portion of a semiconductor integrated circuit according to an embodiment 3 of the invention. The semiconductor integrated circuit shown in FIG. 6 differs from the semiconductor integrated circuit shown in FIG. 1 in the following point.

First voltage generating circuit 2 includes n-channel MOS transistors 22a of x in number and diode-connected n-channel MOS transistor 23 of v in number, which are arranged between internal node 2a and p-channel MOS transistor 21 receiving reference voltage Vref on its gate. The above x and v each are an integer of any of 0, 1, . . .

Second voltage generating circuit 3 includes diode-connected p-channel MOS transistors 32a of y in number and diode-connected p-channel MOS transistor 33 of w in number, which are arranged between internal node 3a and n-channel MOS transistor 31 receiving reference voltage Vref on its gate. The above y and w each are an integer of any of 0, 1, 2, . . . Structures other than the above are the same as those shown in FIG. 1, and corresponding portions bear the same reference numerals.

In first voltage generating circuit 2, a resistance element (Z) connected between first power supply VCC and internal node 2a may be a polycrystalline silicon resistance as shown in FIG. 1, or may be a MOS transistor. Therefore, this resistance element is indicated by the reference numeral 24a. In second voltage generating circuit 3, a resistance element (Z) connected between internal node 3a and second power supply VSS may be either a polycrystalline silicon resistance or a MOS transistor. Therefore, this resistance element (Z) is indicated by the reference numeral 34a.

Internal voltage VCa generated from first voltage generating circuit 2 is expressed by the following representation:

$$VCa = Vref + |VTP| + x \cdot VTN + v \cdot VTN$$

Internal voltage VSa generated from second voltage generating circuit 3 is expressed by the following representation:

$$VSa = Vref - VTN - y \cdot |VTP| - w \cdot |VTP|$$

Therefore, voltage V7 on second node 7 is expressed by the following representation:

$$V7 = Vref - VTN - (y + w) - |VTP|$$

Assuming that x=y=1 and v=w=0, voltage V4 on first node 4 and voltage V7 on second node 7 are expressed by the following representations:

$$V4 = Vref + |VTP| + VTN$$

$$V7 = Vref - |VTP| - VTN$$

Therefore, a signal applied to output node 9 has upward and downward amplitudes of (|VTP|+VTN) with reference voltage Vref as a center. In other words, a voltage difference between the reference voltage Vref and the high-level voltage is equal to a voltage difference between the reference voltage Vref and the low-level voltage, so that the MOS transistor may have any conductivity type provided that first and second voltage generating circuits 2 and 3 include the same number of diode-connected MOS transistors.

According to the embodiment 3 of the invention, as described above, the diode-connected MOS transistors for level correction in each of the first and second voltage generating circuits are formed of MOS transistors of the same conductivity type. Therefore, the internal voltage at an intended voltage level can be easily produced, and an effect similar to that by the embodiment 1 can be achieved.

[Embodiment 4]

Figure 7:
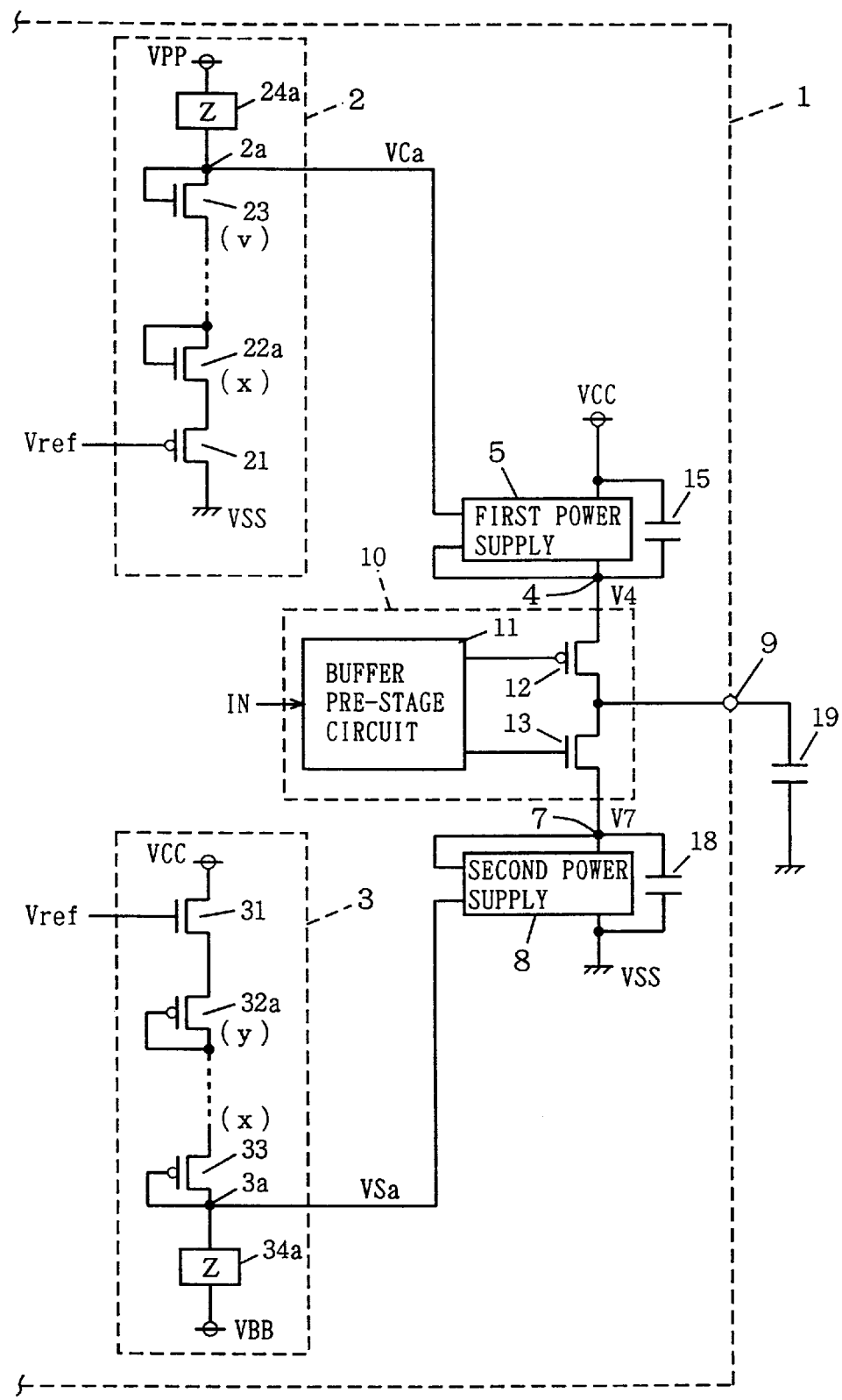

FIG. 7 shows a structure of a signal output portion of a semiconductor integrated circuit according to an embodiment 4 of the invention. The semiconductor integrated circuit shown in FIG. 7 differs from the semiconductor integrated circuit shown in FIG. 1 in the following point. First voltage generating circuit 2 is coupled between a third power supply VPP supplying a boosted voltage VPP higher than power supply voltage VCC and second power supply VSS supplying ground voltage VSS. Second voltage generating circuit 3 is coupled between first power supply VCC supplying power supply voltage VCC and a fourth power supply VBB which supplies a negative voltage VBB lower than ground voltage VSS. Structures other than the above are the same as those shown in FIG. 1, and corresponding portions bear the same reference numerals.

First voltage generating circuit 2 stably generate internal voltage VCa when all MOS transistors 21, 22 and 23 are on. Therefore, first voltage generating circuit 2 requires a voltage equal to or higher than (VTN+|VTP|) as one operation power supply voltage. The internal voltage VCa is at the voltage level of (Vref+|VTP|) or higher, and first voltage generating circuit 2 requires as one power supply voltage a voltage at a level higher than internal voltage VCa.

There is an increasing tendency to set power supply voltage VCC to a low voltage level such as 2.2 V and 1.2 V for reducing the current consumption of the semiconductor integrated circuit and increasing a speed of the internal operation (for performing fast charging and discharging of an internal signal line). Under such a low power supply voltage, it may be impossible to produce the internal voltage at a required voltage level, depending on the magnitudes of threshold voltages of MOS transistors 21, 22 and 23. Even in this case, internal voltage VCa at an intended voltage level can be stably produced under the low power supply voltage by employing, as one operation power supply voltage, boosted voltage VPP higher than power supply voltage VCC, and thereby the range of the operation power supply voltage of this output circuit can be increased.

In second voltage generating circuit 3, internal voltage VSa is at the voltage level equal to or lower than the voltage level of (Vref−VTN). In this case, internal voltage VSa at an intended voltage level may not be produced if ground voltage VSS is utilized as the other operation power supply voltage, depending on the threshold voltage level of MOS transistors 31, 32 and 33 when a low power supply voltage is used and reference voltage Vref is, for example, at the voltage level of VCC/2. Even in this case, all MOS transistors 31, 32 and 33 can be kept in the on state by using negative voltage VBB, and thereby an internal. voltage VSa at a required voltage level can be produced. Therefore, internal voltage VSa at an intended voltage level can be stably produced, so that the voltage range of operation power supply voltage VCC can be easily increased.

The boosted voltage VPP and negative voltage VBB can be generated, for example, by a general charging pump circuit utilizing a charge pump operation of a capacitor. In particular, if the semiconductor integrated circuit is a dynamic semiconductor memory device, which will be described later, circuits for generating boosted voltage VPP used for driving word lines and negative voltage VBB applied to the substrate region are included. These circuits can be utilized in the embodiment. Alternatively, such a structure may be employed that boosted voltage VPP and negative voltage VBB are externally supplied.

As described above, according to the embodiment 4 of the invention, boosted voltage VPP higher than power supply voltage VCC and negative voltage VBB lower than ground voltage VSS are utilized for generating the internal voltages. Therefore, the internal voltage at an intended voltage level can be stably produced even under a low power supply voltage, so that the internal power supply voltages (voltages on first and second nodes) at intended voltage levels can be stably produced even under a low power supply voltage. Accordingly, the output circuit operating with the operation power supply voltage of a wide range can be achieved.

[Embodiment 5]

Figure 8:
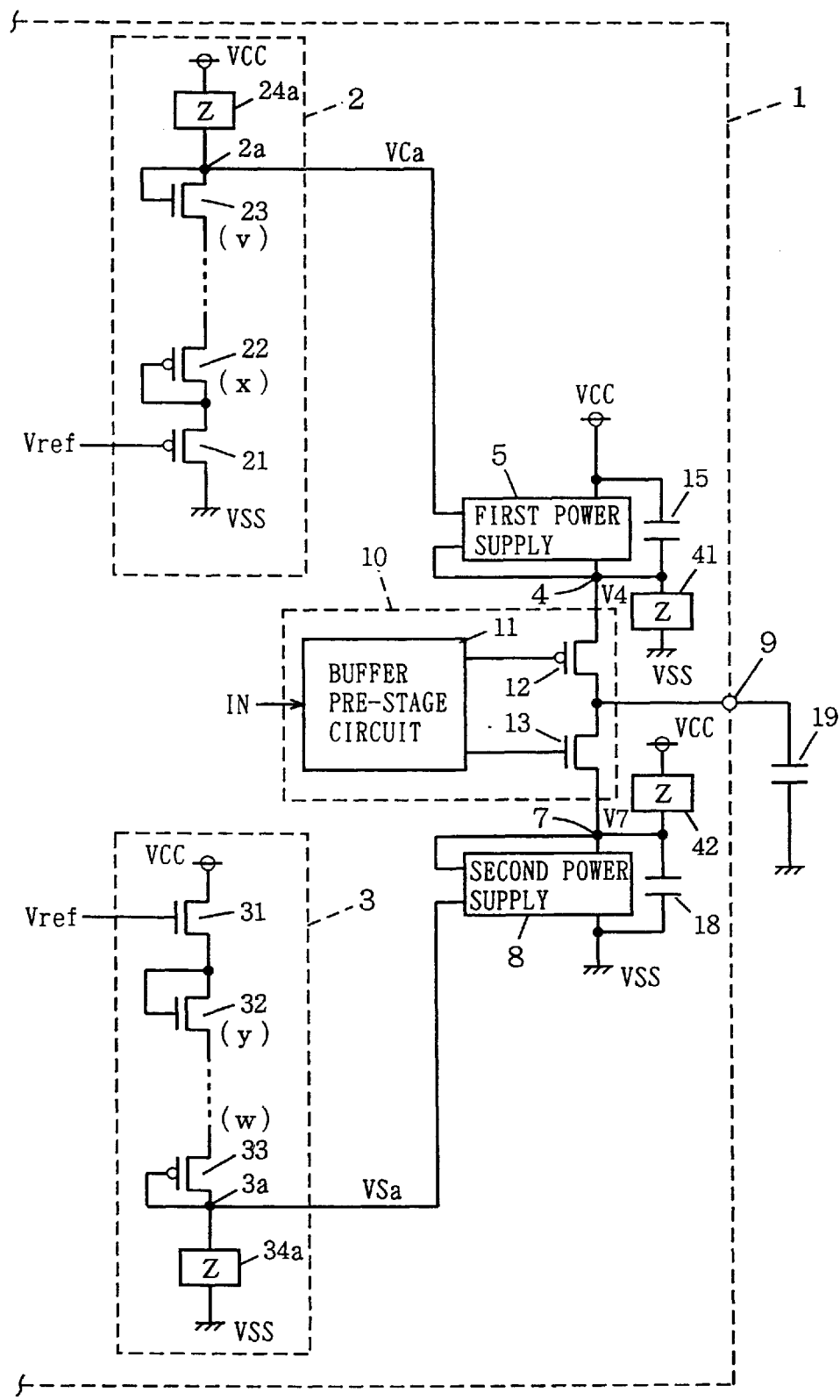

FIG. 8 shows a structure of a signal output portion of a semiconductor integrated circuit according to an embodiment 5 of the invention. The semiconductor integrated circuit has the substantially same structure as the semiconductor integrated circuit shown in FIG. 1 except for the following point, and corresponding portions bear the same reference numerals.

In the semiconductor integrated circuit according to the embodiment 5, a resistance element 41 is connected between first node 4 and second power supply VSS, and a resistance element 42 is connected between second node 7 and first power supply VCC. Resistance elements 41 and 42 have high resistance values, and function as a pull-down element and a pull-up element, respectively. When the voltage level on first node 4 lowers, first power supply circuit 5 operates to supply a current from first power supply VCC to raise the voltage level on first node 4. However, when the voltage level on first node 4 exceeds a predetermined voltage level, MOS transistor 5a in first power supply circuit 5 is merely turned off, and stabilizing capacitance 15 does not absorb this voltage rising, so that the raised voltage on first node 4 is maintained.

The above rising of the voltage occurs, for example, when a large current is consumed during operation of the circuit, when a large current is supplied through MOS transistor 5a and when MOS transistor 12 performs a fast switching operation and is turned off after transmitting a signal at a high level to output node 9.

When the voltage on first node 4 rises as described above, resistance element 41 of a high resistance for pull-down lowers the voltage level on first node 4. Thereby, the voltage on first node 4 can be stably held at an intended level, so that the output signal having an intended high level voltage can be produced.

Likewise, when the voltage level on second node 7 rises, second power supply circuit 8 lowers the voltage level on second node 7. However, when the voltage level on second node 7 lowers below a predetermined voltage level, MOS transistor 8a in second power supply circuit 8 is turned off, and the voltage level on second node 7 holds the low level. The state that the voltage level on second node 7 lowers below the predetermined voltage level occurs, for example, in such a case that ringing or the like occurs due to an impedance component coupled to output node 9, and thereby undershoot occurs.

When the voltage level on second node 7 lowers below the predetermined voltage level as described above, a current is supplied from first power supply VCC through high-resistance resistance element 42, so that the voltage level on second node 7 rises. Resistance element 42 functions as a high-resistance pull-up element.

By connecting the pull-down and pull-up elements to first and second nodes 4 and 7, respectively, as described above, the internal power supply voltage can be stably held at an intended voltage level even in the structure that the transistors operating in the source follower mode produces the internal power supply voltages on the first and second nodes.

[Embodiment 6]

Figure 9:
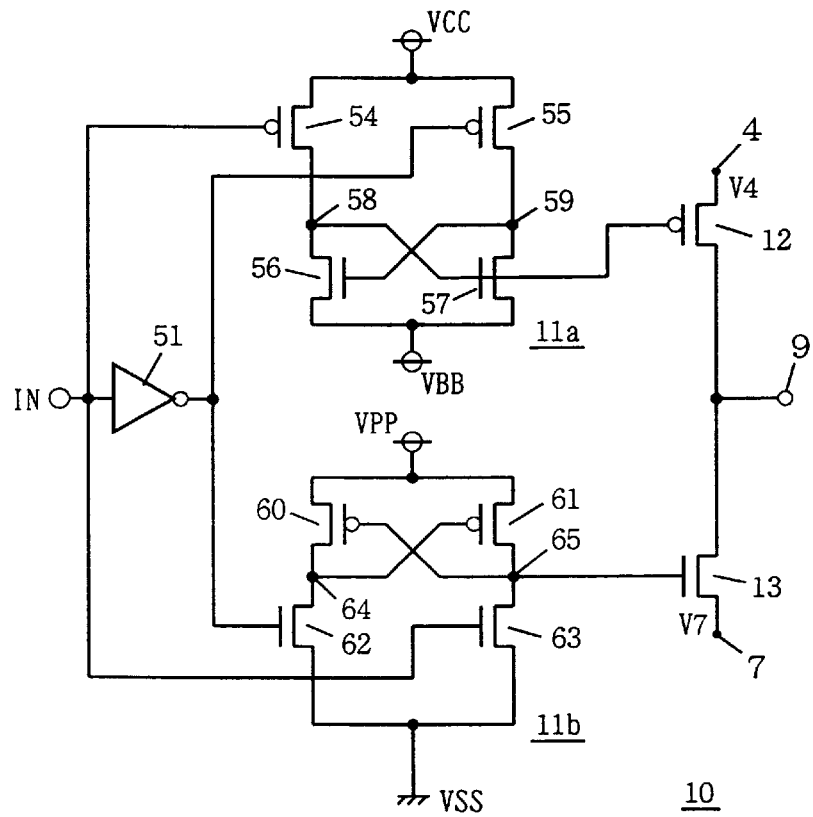

FIG. 9 shows a structure of a main portion of a semiconductor integrated circuit according to an embodiment 6 of the invention. More specifically, FIG. 9 shows a structure of output circuit 10 of the semiconductor integrated circuit.

In FIG. 9, buffer pre-stage circuit 11 included in output circuit 10 includes a level conversion circuit 11a which converts the high level voltage of input signal IN into a level of negative voltage VBB for outputting as well as a level conversion circuit 11b which converts the low level voltage of input signal IN into a level of boosted voltage VPP for outputting.

Level conversion circuit 11a includes a p-channel MOS transistor 54 which is connected between first power supply VCC and a node 58 and receives input signal IN on its gate, a p-channel MOS transistor 55 which is connected between first power supply VCC and a node 59 and receives input signal IN on its gate, an n-channel MOS transistor 56 which is coupled between node 58 and second power supply VBB supplying negative voltage VBB and has a gate connected to node 59, and an n-channel MOS transistor 57 which is coupled between node 59 and fourth power supply VBB and has a gate connected to node 58. Node 58 is connected to a gate of MOS transistor (first MOS transistor) 12 in the output stage.

Level conversion circuit 11b includes a p-channel MOS transistor 60 which is connected between a node 64 and third power supply VPP supplying boosted voltage VPP higher than power supply voltage VCC and has a gate connected to node 65, a p-channel MOS transistor 61 which is connected between third power supply VPP and a node 65, and has a gate connected to node 64, an n-channel MOS transistor 62 which is connected between node 64 and second power supply VSS, and has a gate receiving an output signal of an inverter 51, and an n-channel MOS transistor 63 which is connected between node 65 and second power supply VSS, and has a gate receiving input signal IN. Node 65 is connected to the gate of MOS transistor (second MOS transistor) 13 in the output stage. Then, an operation will be described below.

Input signal IN changes between power supply voltage VCC and ground voltage VSS. When input signal IN is at a high level equal to the level of power supply voltage VCC, MOS transistors 54 and 55 in level conversion circuit 11a are off and on, respectively. Node 59 is charged through MOS transistor 55, and the voltage level on node 59 rises, so that MOS transistor 56 goes to the on state. Thereby, the voltage level on node 58 lowers, and MOS transistor 57 goes to the off state. When the voltage level on node 58 reaches the negative voltage VBB level, MOS transistor 57 is completely turned off, and node 59 is held at the level of power supply voltage VCC.

MOS transistor 12 has its gate connected to node 58, and receives negative voltage VBB on its gate. Thereby, MOS transistor 12 attains a deeper on-state, and rapidly supplies a current from first node 4 onto output node 9.

In level conversion circuit 11b, MOS transistor 63 is on and MOS transistor 62 is off, so that node 65 is set to the level of ground voltage VSS, and node 64 is held at the boosted voltage VPP level. Thereby, MOS transistor 13 has a gate voltage lower than the voltage on second node 7, and attains a deeper off-state. MOS transistor 12 attains a deeper on-state, and the voltage level on output node 9 rapidly rises.

When input signal IN is at L-level, MOS transistors 54 and 55 in level conversion circuit 11a are on and off, respectively, so that node 58 is charged to the power supply voltage VCC level, and node 59 is held at the negative voltage VBB level. Thereby, MOS transistor 12 receives, on its gate, power supply voltage VCC higher than voltage V4 on its source, and attains a deeper off-state.

In the level conversion circuit 11b, MOS transistor 63 is off, and MOS transistor 62 receives a high-level signal from inverter 51 at its gate and thereby attains the on state. Thereby, node 64 is discharged to the level of ground voltage VSS, so that MOS transistor 61 is turned on, and node 65 is charged to boosted voltage VPP level. In this state, MOS transistor 13 is in a deeper on-state, and discharges a current from output node 9 to second node 7 through its large conductance. Thereby, the voltage level on output node 9 rapidly falls.

As described above, turned-on MOS transistors 12 and 13 can be set to the deeper on state by using level conversion circuits 11a and 11b. Thereby, the conductances of MOS transistors 12 and 13 can be increased to achieve rapid charging and discharging of output node 9, and a transition speed of the output signal from output node 9 can be increased.

[Embodiment 7]

Figure 10:
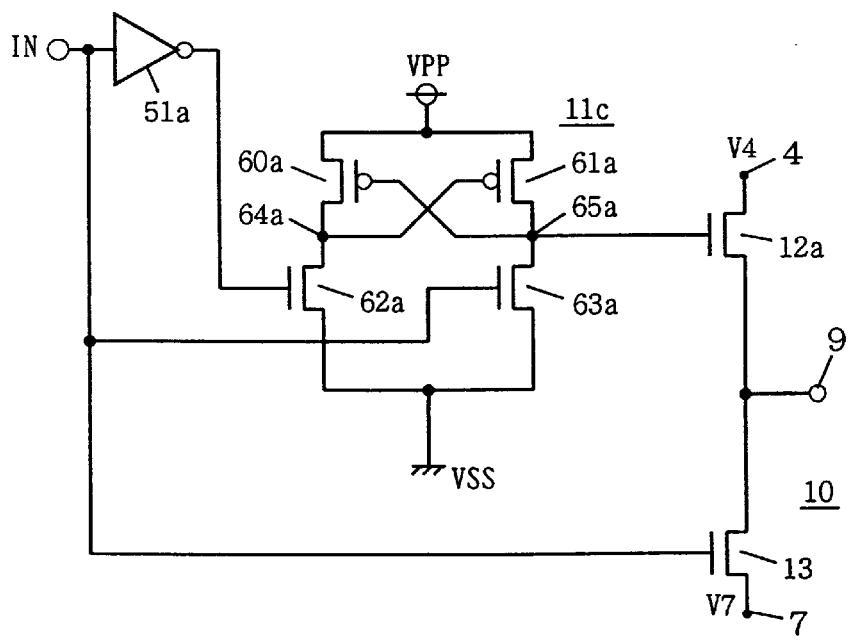
FIGS. 10 and 11 show structures of main portions of the semiconductor integrated circuits according to embodiments 7 and 8 of the invention, respectively.

FIG. 10 shows a structure of a main portion of a semiconductor integrated circuit according to an embodiment 7 of the invention. More specifically, FIG. 10 shows a structure of output circuit 10. Output circuit 10 shown in FIG. 10 included, at its output stage, an n-channel MOS transistor 12a for charging the output node and an n-channel MOS transistor 13 for discharging the output node. For compensating for a loss of threshold voltage across n-channel MOS transistor 12a, there is provided a level conversion circuit 11c which generates a signal changing between boosted voltage VPP and ground voltage VSS.

Level conversion circuit 11c has a structure similar to level conversion circuit 11b shown in FIG. 9, and includes a p-channel MOS transistor 60a which is connected between a node 64a and high (third) power supply (voltage source) VPP supplying boosted voltage VPP, and has a gate connected to a gate of n-channel MOS transistor 12a through a node 65a, a p-channel MOS transistor 61a which is connected between high voltage (power) supply VPP and a node 65a, and has a gate connected to node 64a, an n-channel MOS transistor 62a which is connected between node 64a and second power supply VSS supplying ground voltage VSS, and has a gate receiving input signal IN through inverter 51a, and an n-channel MOS transistor 63a which is connected between node 65a and second power supply VSS supplying ground voltage VSS, and has a gate receiving input signal IN. The gate of n-channel MOS transistor 13 is supplied with input signal IN without level conversion. Node 65a is connected to the gate of MOS transistor 12a.

This level conversion circuit 11c operates in the same manner as level changing circuit 11b shown in FIG. 9 previously described. More specifically, when input signal IN is at H-level, i.e., level of power supply voltage VCC, MOS transistor 63a is on, and MOS transistor 62a is off, so that node 65a attains the voltage level of ground voltage VSS, and MOS transistor 12a maintains the off state. In this state, MOS transistor 13 is on, and output node 9 is discharged through MOS transistor 13 in the on state.

When input signal IN is at L-level, MOS transistors 63a and 62a are off and on, respectively, so that node 64a is discharged to the ground voltage VSS level. Thereby, MOS transistor 61a is on, and the voltage level on node 65a rises to the high voltage VPP level. This node 65a is connected to a gate of MOS transistor 12a, and MOS transistor 12a transmits the voltage on first node 4 onto output node 9 without causing a loss by its threshold voltage.

When the voltage level on first node 4 is lower than (VCC−VTN), the voltage on first node 4 can be transmitted onto output node 9 even if MOS transistor 12a receives at its gate the voltage at the power supply voltage VCC level, and therefore conversion circuit 11c is not needed. Even in this case, since the gate voltage is high, MOS transistor 12a has a large current driving capability, so that fast charging is achieved (by using a boosted voltage).

For achieving the fast charging, a level conversion circuit similar to level conversion circuit 11c may be provided for n-channel MOS transistor 13.

By employing only the n-channel MOS transistors for the transistors in the output stage, well isolation is not required in contrast to a structure of a CMOS inverter, so that an area occupied by the circuit can be reduced. By employing the level conversion circuit, fast charging of the output node to the predetermined voltage level can be achieved without causing a loss by the threshold voltage of the n-channel MOS transistor.

[Embodiment 8]

Figure 11:
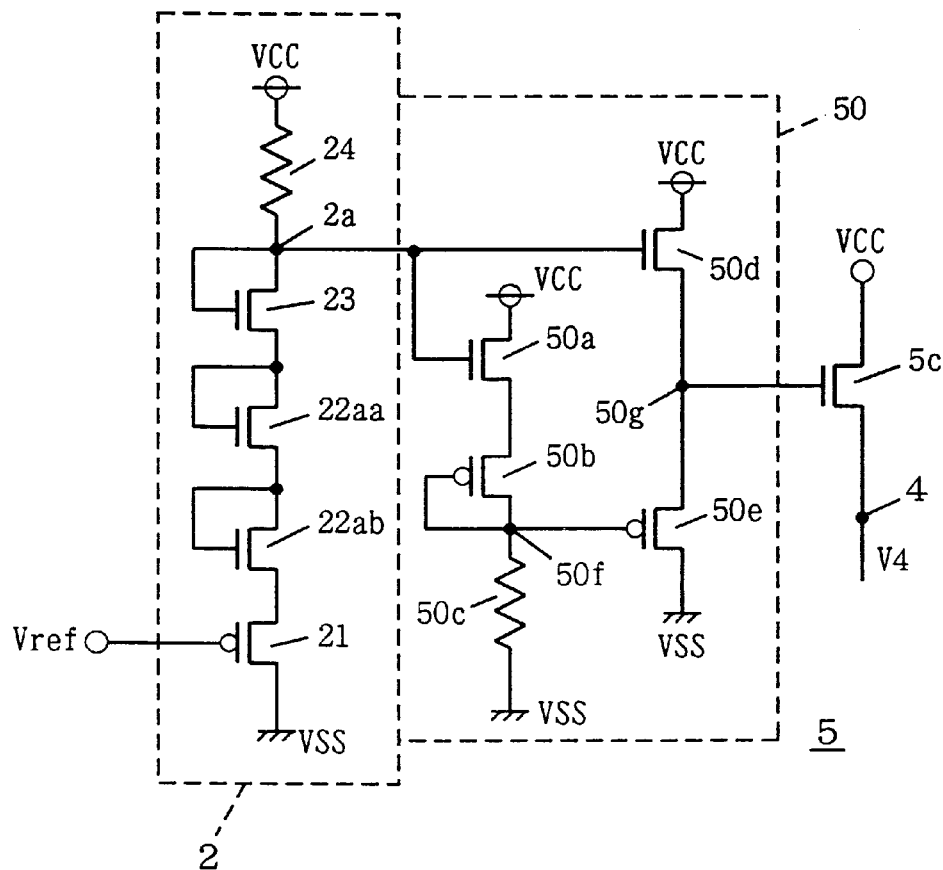

FIG. 11 shows a structure of a main portion of a semiconductor integrated circuit according to an embodiment 8 of the invention. More specifically, FIG. 11 shows the structure of first power supply circuit 5 for holding first node 4 at a predetermined voltage level.

In FIG. 11, first power supply circuit 5 includes an impedance conversion circuit 50 which has an output impedance smaller than an output impedance of first voltage generating circuit 2, and sets the gate voltage of n-channel MOS transistor 5c in accordance with the internal voltage applied from first internal voltage generating circuit 2. MOS transistor 5c is connected between first power supply VCC and first node 4, and operates in the source follower mode.

First internal voltage generating circuit 2 includes resistance element 24 of a high resistance connected between first power supply VCC and node 2a, and diode-connected n-channel MOS transistors 23, 22aa and 22ab which are connected in series between node 2a and p-channel MOS transistor 21 receiving reference voltage Vref on its gate. Resistance element 24 may be formed of the MOS transistor in the embodiment 2 previously described. The resistance of resistance element 24 is set to a value sufficiently larger than the on-resistances of MOS transistors 23, 22aa, 22ab and 21. First voltage generating circuit 2 supplies a current onto node 2a through high-resistance resistance element 24, and therefore has an extremely large output impedance for node 2a.

Impedance conversion circuit 50 includes n- and p-channel MOS transistors 50a and 50b connected in series between first power supply VCC and a node 50f, a high-resistance resistance element 50c connected between node 50f and second power supply VSS, an n-channel MOS transistor 50d which is connected between first power supply VCC and a gate node 50g of MOS transistor 5c, and has a gate connected to node 2a, and a p-channel MOS transistor 50e which is connected between node 50g and second power supply VSS, and has a gate connected to node 50f.

MOS transistor 50a has a gate connected to node 2a, and MOS transistor 50b has gate and drain connected together to node 50f. High-resistance resistance element 50c has a resistance value which is sufficiently larger than the on-resistances of MOS transistors 50a and 50b. An operation will now be described below.

In first voltage generating circuit 2, a voltage V2a expressed by the following representation is produced on node 2a:

$$V2a = Vref + |VTP| + 3 \cdot VTN$$

MOS transistor 50a operates in the source follower mode, and transmits to its source a voltage lower by threshold voltage VTN than its gate voltage. MOS transistor 50b operates in the diode mode, and causes the voltage drop by the absolute value of its threshold voltage. Therefore, a voltage V50f on node 50f can be expressed by the following representation:

$$V50f = Vref + 3 \cdot VTN + |VTP| - VTN - |VTP|$$

$$= Vref + 2 \cdot VTN$$

MOS transistor 50d has a gate connected to node 2a, and transmits onto a node 50g a voltage expressed by the following representation:

$$Vref + 2 \cdot VTN + |VTP|$$

Meanwhile, p-channel MOS transistor 50e operates in the source follower mode, and transmits onto node 50g a voltage expressed by the following representation:

$$Vref + 2 \cdot VTN + |VTP|$$

Therefore, a voltage V50g on node 50g can be expressed by the following representation:

$$V50g = Vref + 2 \cdot VTN + |VTP|$$

A voltage difference between the gate (node 2a) and source (node 50g) of n-channel MOS transistor 50d is equal to VTN. A voltage difference between the gate (node 50f) and source (node 50g) of p-channel MOS transistor 50e is equal to |VTP|.

When the voltage level on node 50g rises, MOS transistor 50d is turned off, and p-channel MOS transistor 50e is turned on, so that the voltage level on node 50g is lowered. When the voltage level on node 50g lowers, p-channel MOS transistor 50e is turned off, and n-channel MOS transistor 50d is turned on, so that the voltage level on node 50g is raised. MOS transistors 50d and 50e have the on-resistances sufficiently smaller than the resistance value of resistance element 24.

MOS transistors 50d and 50e are not turned on at the same time, and a through current does not flow through MOS transistors 50d and 50e. MOS transistors 50d and 50e are kept in a boundary state between the on and off states, and therefore current consumption is extremely small. Therefore, the current consumption in impedance conversion circuit 50g is extremely small. MOS transistor 5c receives voltage V50g on its gate, and operates in the source follower mode. In the structure shown in FIG. 11, voltage V4 appearing on first node 4 is expressed by the following representation:

$$V4 = V50g - VTN = Vref + VTN + |VTP|$$

Therefore, a voltage higher by (VTN+|VTP|) than reference voltage Vref is transmitted.

MOS transistor 5c is required to have a relatively large current driving capability (because the output load must be charged rapidly). Therefore, MOS transistor 5c has a relatively large gate capacitance. For reducing the current consumption, it is necessary to sufficiently increase the resistance value of resistance element 24 in first voltage generating circuit 2. When node 2a is directly connected to the gate of MOS transistor 5c, the voltage level on this gate rises slowly upon power-on and a long time is required until the voltage on first node 4 reaches the stable state after power-on, so that the semiconductor integrated circuit cannot start operating at a fast timing.

MOS transistors 50d and 50e are required only to drive the gate capacitance of MOS transistor 5c. MOS transistors 50d and 50e are not turned on at the same time, and have relatively small impedances in the on state. Accordingly, MOS transistors 50d and 50e can be formed of transistors of smaller sizes than MOS transistor 5c, and therefore can have sufficiently reduced gate capacitancs. Consequently, even in the case that the internal node 2a has a small load and charging is performed with resistance element 24 of a high resistance, MOS transistor 50d can be rapidly driven to the on state to raise the voltage level on node 50g after power-on, and thereby the voltage level on first node 4 can be rapidly stabilized.

By charging high-resistance resistance element 50c, the gate voltage of MOS transistor 50e reaches a predetermined voltage level. Even in this case, MOS transistor 50e has a small gate capacitance, and the gate voltage of MOS transistor 50e can rapidly reach the predetermined voltage level after power-on owing to the current supplied from MOS transistors 50a and 50b even if resistance element 50c of a high resistance is employed for reducing the power consumption. Therefore, the voltage level on node 50g can be stably held at the predetermined voltage level.

Since impedance conversion circuit 50 includes MOS transistor 50d for charging and MOS transistor 50e for discharging, MOS transistor 5c has a gate voltage held at a constant voltage level owing to the operations of MOS transistors 50d and 50e even when the gate voltage of MOS transistor 5c rises or lowers, and therefore the internal power supply voltage at the intended voltage level can be stably transmitted onto node 4.

Figure 12:
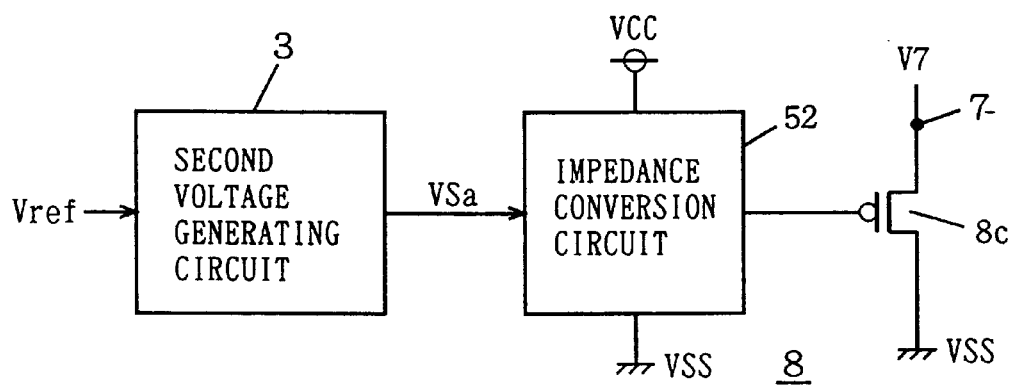
FIG. 12 schematically shows a structure of a modification of the embodiment 8 of the invention.

FIG. 12 shows another structure of second power supply circuit 8. In FIG. 12, second power supply circuit 8 has an impedance conversion circuit 52, which is arranged between second voltage generating circuit 3 and a gate of p-channel MOS transistor 8c, and has an output impedance smaller than the output impedance of second voltage generating circuit 3. MOS transistor 8c is connected between second node 7 and second power supply VSS, and receives on its gate the output signal of impedance conversion circuit 52. These circuits 3 and 5 have structures similar to those in FIG. 13, and operate in a similar manner.

As described above, the embodiment 8 of the invention employs the impedance conversion circuit having the output impedance smaller than the output impedance of the internal voltage generating circuit, and is adapted to operate in the source follower mode and determine the gate voltage of the MOS transistor which sets the voltage level of the first and/or second nodes. Therefore, the gate voltages of these MOS transistors can reach rapidly to the predetermined voltage levels after power-on, and the semiconductor integrated circuit can start the operation at a fast timing after power-on. Owing to provision of the charging and discharging transistors at the output stage of the impedance conversion circuit, the MOS transistors for setting these first and second node voltages can have the gate voltages stably held at the intended voltage levels.

In the structure shown in FIG. 11, each of the first voltage generating circuit 2 and impedance conversion circuit 50 may use boosted voltage VPP instead of power supply voltage VCC. In the structure shown in FIG. 12, second voltage generating circuit 3 and impedance conversion circuit 52 may use negative voltage VBB instead of the ground voltage. In these cases, an allowable range of the operation power supply voltage can be widened. Also, the impedance conversion circuit is not needed in this arrangement.

[Embodiment 9]

Figure 13A:
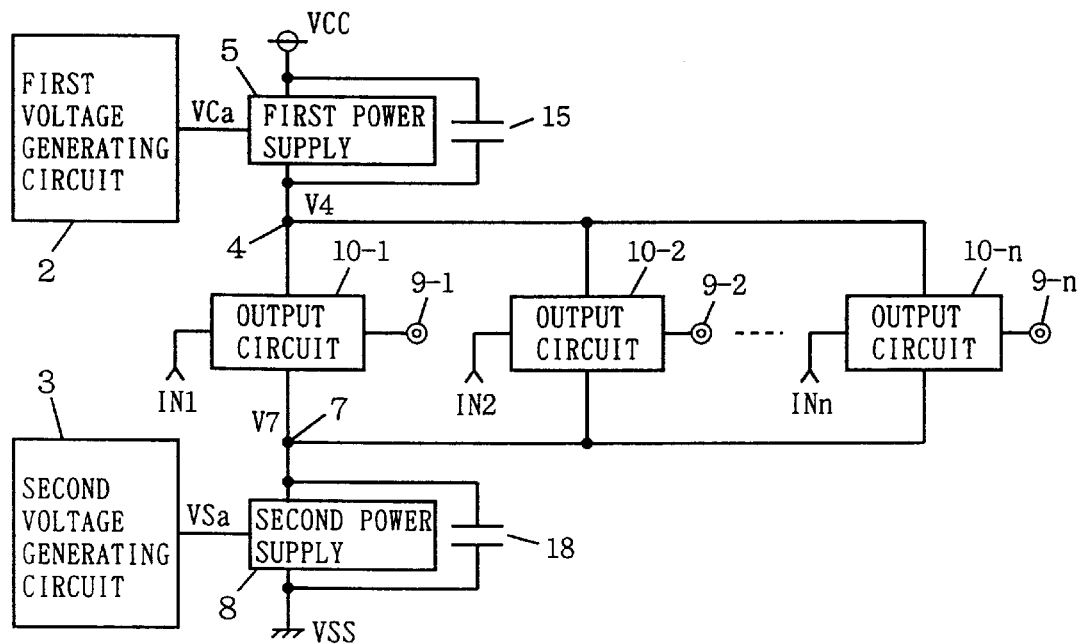
FIGS. 13A to 25 schematically shows structures of main portions of the semiconductor integrated circuits according to embodiments 9 to 21 of the invention, respectively.

FIG. 13A shows a structure of a main portion of a semiconductor integrated circuit according to an embodiment 9 of the invention. In FIG. 13A, the semiconductor integrated circuit includes a plurality of output circuits 10-1 through 10-n arranged in parallel with each other. Output circuits 10-1 through 10-n each have the same structure as output circuit 10 shown in FIG. 13, and operate to buffer and transmit internally supplied signals IN1–INn to corresponding nodes 9-1 through 9-n, respectively.

Thus, the semiconductor integrated circuit outputs a plurality of signals in parallel. First and second nodes 4 and 7 are arranged commonly for the plurality of output circuits 10-1 through 10-n. Output circuits 10-1 through 10-n drive corresponding output nodes 9-1 through 9-n in accordance with the voltages on first and second nodes 4 and 7.

For first node 4, there are provided first voltage generating circuit 2 which produces internal voltage VCa from reference voltage Vref (not shown in FIG. 13), first power supply circuit 5 which produces a voltage at a predetermined voltage level on first node 4 in accordance with internal voltage VCa, and stabilizing capacitance 15 which is connected between first power supply VCC and first node 4.

For second node 7, there are provided second voltage generating circuit 3 which produces internal voltage VSa from reference voltage Vref (not shown in FIG. 13A), second power supply circuit 8 which produces a voltage at a predetermined voltage level on second node 7 in accordance with internal voltage VSa, and stabilizing capacitance 18 which is connected between second power supply VSS and second node 7. Each of first and second power supply circuits 5 and 8 may be formed of either the combination of a differential amplifier and an MOS transistor or a source-follower MOS transistor.

In this structure shown in FIG. 13A, voltage generating circuits 2 and 3, power supply circuits 5 and 8, and stabilizing capacitances 15 and 18 are arranged commonly to output circuits 10-1 through 10-n which operate in parallel. Thereby, these for voltage setting circuits can be arranged commonly to output circuits 10-1 through 10-n, and an area occupied by the voltage setting circuits can be reduced. However, for stably driving output circuits 10-1 through 10-n, the current driving capabilities of MOS transistors 5a and 8a as well as stabilizing capacitances 15 and 18 are made larger than those in the case where only one output circuit is to be driven.

[Modification]

Figure 13B:
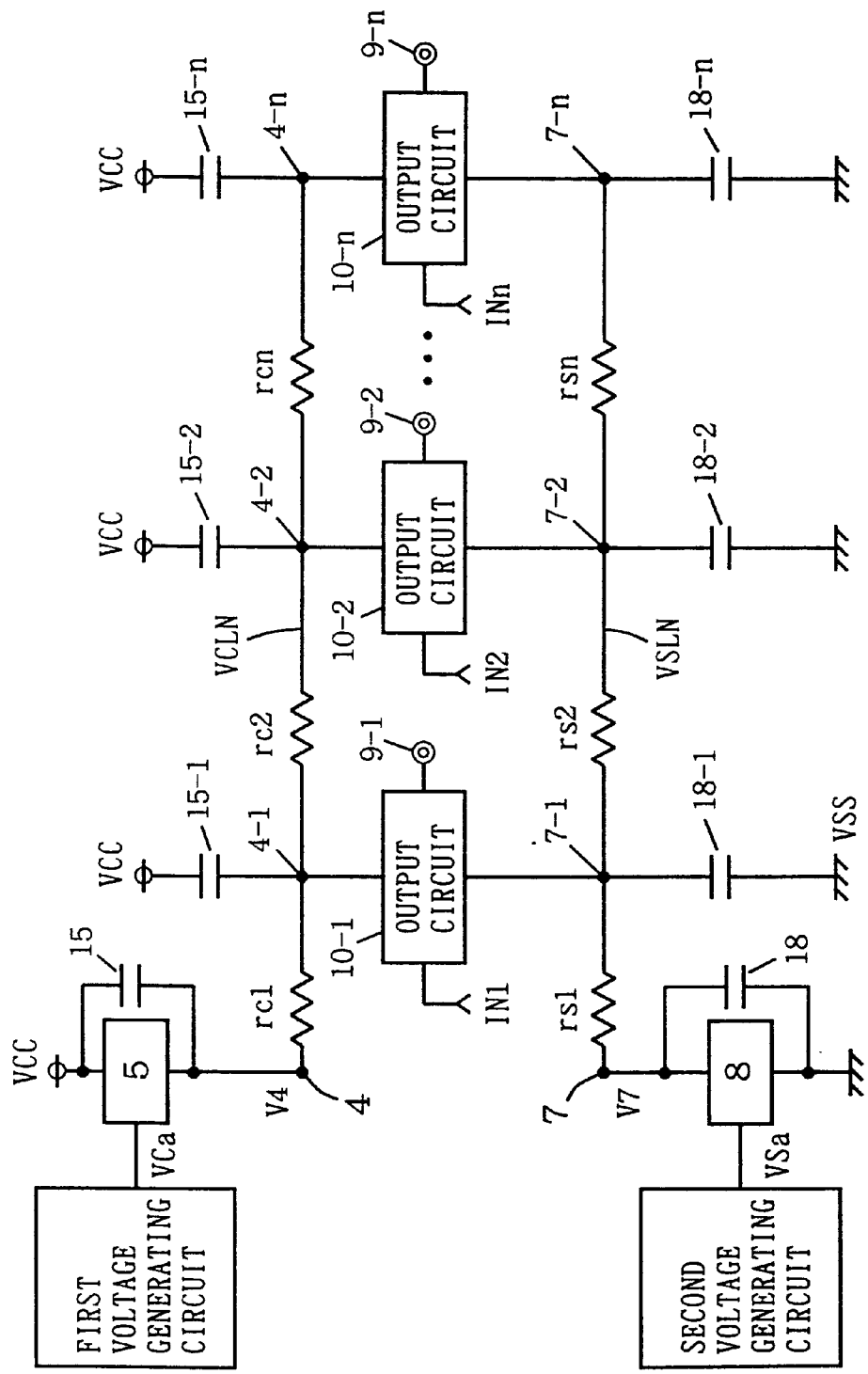

FIG. 13B shows an arrangement of a modification of the embodiment 9. Referring to FIG. 13B, output circuits 9-1 through 9-n each receive a first power supply voltage VCC from first power supply circuit 5 through a first power supply line VCLN and also receive a second power supply voltage (ground voltage) VSS from second power supply circuit 8 through a second power supply line VSLN. First power supply line VCLN has stray resistances rc1, rc2—and rcn present thereon due to interconnection line resistance, and second power supply line VSLN has stray resistances rs1, rs2—and rsn due to interconnection line resistance.

Output circuits 10-1 through 10-n have one-side power supply nodes 4-1 through 4-n coupled to the power supply nodes (VCC) through capacitors 15-1 through 15-n, respectively and other-side power supply nodes 7-1 through 7-n coupled to ground nodes through capacitors 18-1 through 18-n, respectively.

The other portions are the same as those shown in FIG. 13A, and corresponding portions have the same reference numerals allotted thereto.

In the arrangement of FIG. 13B, when output circuits 10-1 through 10-n operate in parallel to charge or discharge the corresponding output nodes 9-1 through 9-n, large currents flow through the power supply lines VCLN and VSLN. Even if the voltage levels on the power supply nodes 4-1 through 4-n and 7-1 through 7-n vary due to the stray resistances rc1–rcn and rs1–rsn upon operation of output circuits 10-1 through 10-n, capacitors 15-1 through 15-n supply currents to the respective first power supply nodes 4-1 through 4-n to compensate for the voltage variation on the nodes 4-1 through 4-n, while capacitors 18-1 through 18-n discharge the currents on the respective second power supply nodes 7-1 through 7-n to the ground nodes to compensate for the voltage variation on the nodes 7-1 through 7-n. Thus, the variation in level of the one-side and other-side power supply voltages of output circuits 10-1 through 10-n can be suppressed, and output circuits 10-1 through 10-n stably operate at high speed.

The capacitance values of capacitors 15-1 through 15-n and 18-1 through 18-n may be appropriately determined depending on load capacitances associated with respective output nodes 9-1 through 9-n.

According to the embodiment 9, as described above, the circuits for setting the voltage which determines the output signal amplitude are arranged commonly to a plurality of output circuits, so that the area occupied by the voltage setting circuitry can be reduced.

In addition, by arranging the stabilizing capacitors at the power supply nodes of the respective output circuits, the power supply voltage variation due to interconnection line resistance can be suppressed, and the output circuits can stably operate in parallel at high speed without causing a power supply voltage noise.

[Embodiment 10]

Figure 14:
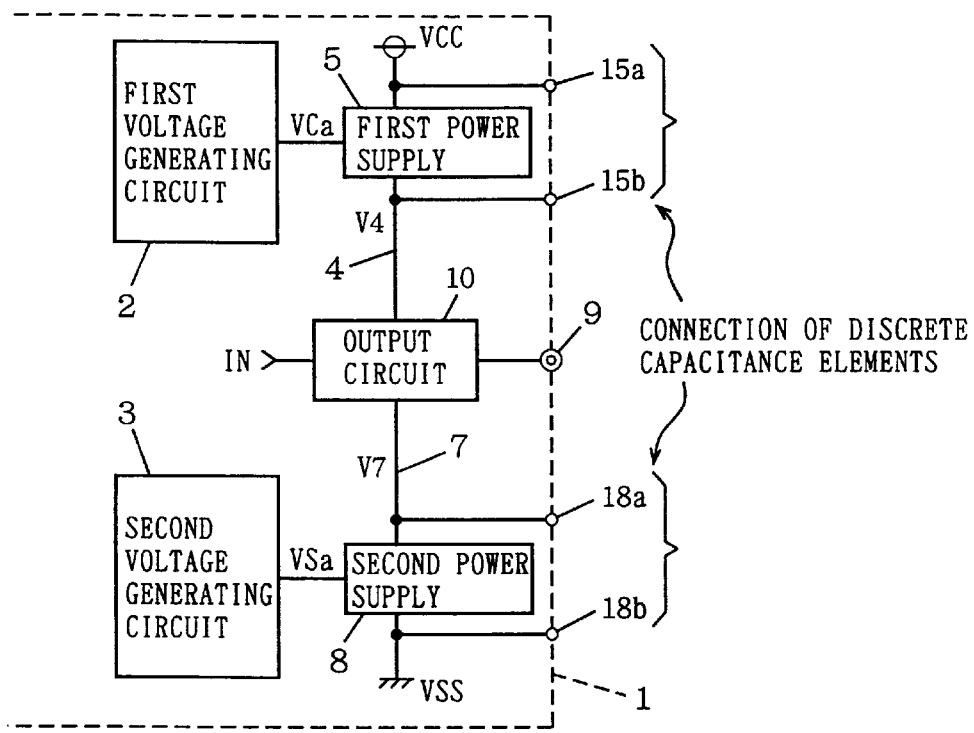

FIG. 14 shows a structure of a main portion of a semiconductor integrated circuit according to an embodiment 11 of the invention. In the semiconductor integrated circuit shown in FIG. 14, nodes 15a and 15b for connecting an external capacitance element is electrically connected respectively to the source and drain of MOS transistor 5a in the first power supply circuits. Also, nodes 18a and 18b for connecting an external capacitance element is electrically connected respectively to the source and drain of MOS transistor 8a in the second power supply circuit 8. These nodes 15a, 15b, 18a and 18b are external terminals.

Capacitances for stabilizing the voltage levels on first and second nodes 4 and 7 are not integrated on semiconductor integrated circuit 1, but are discretely arranged outside the semiconductor integrated circuit 1 in such a manner that capacitance elements which are discrete components and are used as stabilizing capacitances are connected between the nodes 15a and 15b and between nodes 18a and 18b.

According to this structure including the stabilizing capacitances outside the integrated circuit, capacitance elements which are formed of discrete components and therefore have arbitrary capacitance values can be used, so that the capacitances having much larger capacitance values than the load capacitance of output node 9 can be utilized as the stabilizing capacitances. Therefore, even in the structure that the semiconductor integrated circuit has a plurality of output terminals which are driven in parallel, as shown in FIG. 13, electric charges can be stably supplied from the external capacitance elements, so that the signal can be changed rapidly, and the semiconductor integrated circuit capable of fast and stable operation can be implemented. Since it is not necessary to arrange on the semiconductor integrated circuit a stabilizing capacitance occupying a relatively large area, the chip area can be reduced.

[Embodiment 11]

Figure 15:
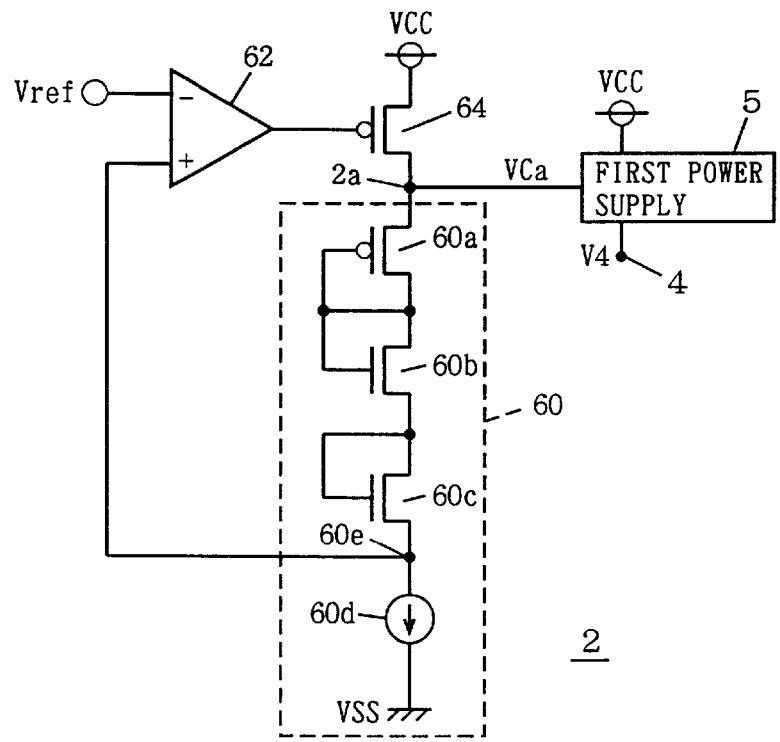

FIG. 15 shows a structure of a main portion of a semiconductor integrated circuit according to an embodiment 11 of the invention. More specifically, FIG. 15 shows a structure of first voltage generating circuit 2 for generating an internal power supply voltage at a high level. In FIG. 15, first voltage generating circuit 2 includes a comparison voltage generating circuit 60 which generates a voltage corresponding to the voltage level applied to the first power supply circuit 5, a differential amplifier 62 which compares the output voltage of comparison voltage generating circuit 60 with reference voltage Vref, and a p-channel MOS transistor 64 which supplies a current from first power supply VCC onto node 2a in accordance with the output signal of differential amplifier 62. Internal voltage VCa to be applied to first power supply circuit 5 is generated from node 2a. First power supply circuit 5 may have a structure shown in either FIG. 1 or FIG. 11. This is true also for the embodiments which will be described later.

Comparison voltage generating circuit 60 includes diode-connected p-channel MOS transistors 60a and diode-connected n-channel MOS transistors 60b and 60c which are connected in series between nodes 2a and 60a, and a constant current source 60d connected between a node 60e and the ground node (second power supply). Owing to the driving current of constant current source 60d, MOS transistors 60a–60c operate in the diode mode, and each causes the voltage drop by absolute value of its threshold voltage.

Differential amplifier 62 receives reference voltage Vref on its negative input, and also receives a voltage on node 60e on its positive input. As is well known, differential amplifier 62 includes MOS transistors as its components, and includes at its differential input stage with a MOS transistor receiving reference voltage Vref on its gate and a MOS transistor receiving on its gate a voltage on node 60e. Therefore, the differential amplifier 62 receives reference voltage Vref through a high input impedance, so that the voltage generating operation of first voltage generating circuit 2 does not adversely affect reference voltage Vref.

Differential amplifier 62 generates a signal at a high level to hold MOS transistor 64 at the off state when the voltage on node 60e is higher than reference voltage Vref. When the voltage on node 60e is lower than reference voltage Vref, differential amplifier 62 generates a signal at a low level corresponding to the voltage difference. In accordance with the output signal of differential amplifier 62, MOS transistor 64 has the conductance thereof increased to supply a current from first power supply VCC onto node 2a, so that the voltage on node 2a rises, and the voltage on node 60e rises. Therefore, differential amplifier 62 holds the voltage level on node 60e at the voltage level of reference voltage Vref.

MOS transistors 60a–60c operate in the diode mode and each cause the voltage drop equal in the absolute value to each respective threshold voltage. Therefore, internal voltage VCa from node 2a is expressed by the following representation:

$$VCa = Vref + 2 \cdot VTN + |VTP|$$

Internal power supply voltage V4 at a high level transmitted to first node 4 depends on the specific structure of first power supply circuit 5, but can be expressed by the following representation in the case of the source follower MOS transistor receiving voltage VCa on its gate.

$$V4 = VCa - VTN$$
$$= Vref + VTN + |VTP|$$

According to the embodiment 11 of the invention, as described above in the first voltage generating circuit, the differential amplifier makes a comparison between the reference voltage and the internal voltage determining the internal power supply voltage at the high level, and the level of the internal voltage is adjusted in accordance with a result of this comparison. Therefore, the feedback loop of the differential amplifier, the current supply transistors and the comparison voltage generating circuit can serve to hold stably the internal voltage, which determines the internal power supply voltage, at an intended voltage level.

[Embodiment 12]

Figure 16:
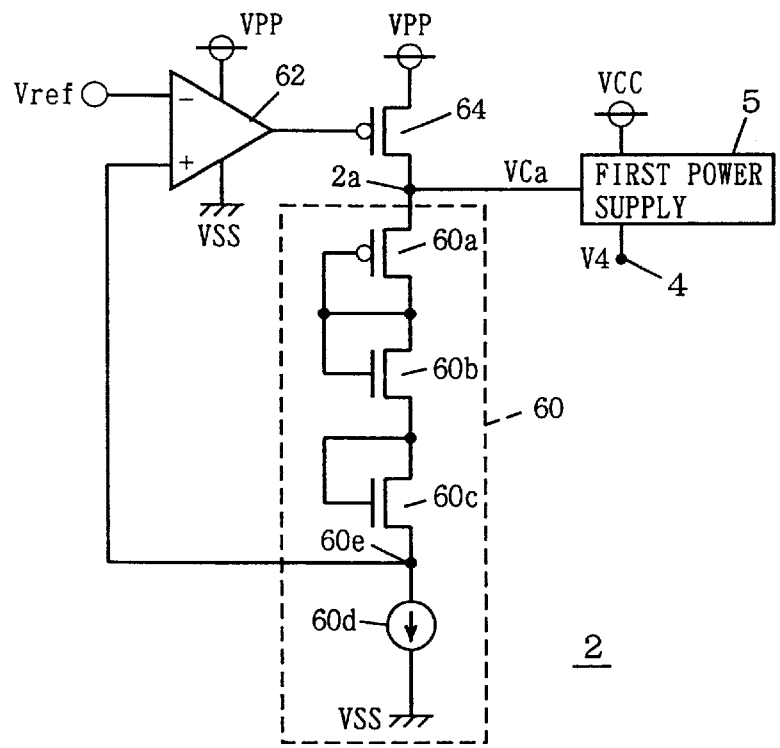

FIG. 16 shows a structure of a main portion of a semiconductor integrated circuit according to an embodiment 12 of the invention. More specifically, FIG. 16 shows a structure of the first voltage generating circuit 2 in the semiconductor integrated circuit. First voltage generating circuit 2 shown in FIG. 16 differs from the first internal voltage generating circuit shown in FIG. 15 in the following point.

In first internal voltage generating circuit 2 shown in FIG. 16, p-channel MOS transistor 64, which operates as a driving element for supplying a current to internal node 2a, has a source connected to high voltage supply VPP which supplies boosted voltage VPP higher than power supply voltage VCC. Differential amplifier 62 receives boosted voltage VPP as one operation power supply voltage. Structures other than the above are the same as those shown in FIG. 15, and corresponding portions bear the same reference numerals.

First internal voltage generating circuit 2 shown in FIG. 16 operates using, as one operation power supply voltage, boosted voltage VPP higher than power supply voltage VCC. Even when this semiconductor integrated circuit is driven with a low power supply voltage, comparison voltage generating circuit 60 can be reliably activated by boosted voltage VPP, and the internal voltage at an intended voltage level can be reliably produced even in a low power supply voltage structure.

[Embodiment 13]

Figure 17:
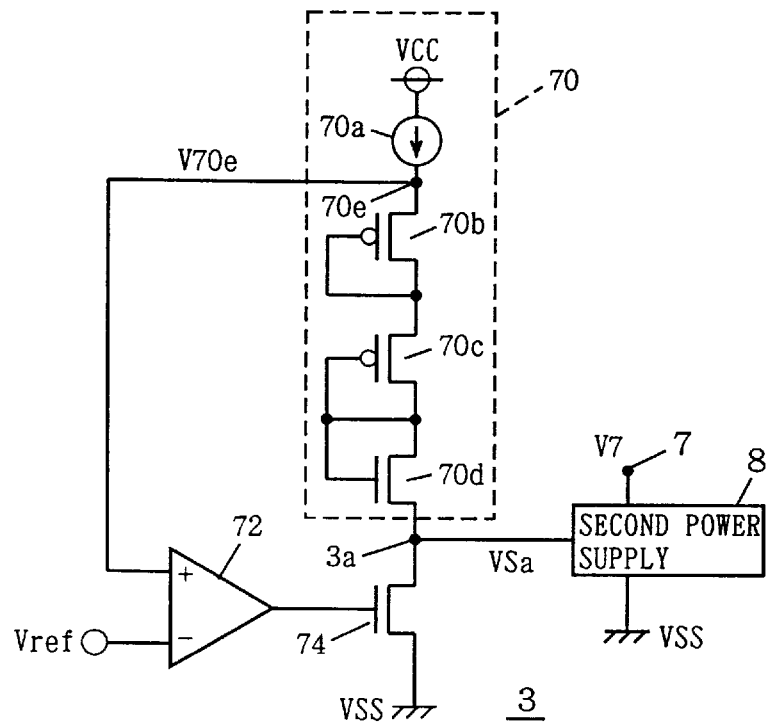

FIG. 17 shows a structure of a main portion of a semiconductor integrated circuit according to an embodiment 13 of the invention. More specifically, FIG. 17 shows a structure of a portion of second voltage generating circuit 3 which generates internal voltage VSa determining the voltage level of the lower internal power supply voltage on second node 7.

In FIG. 17, second voltage generating circuit 3 includes a comparison voltage generating circuit 70 which is coupled to the second power supply circuit 8, and generates a voltage at the voltage level corresponding to internal voltage VSa, a differential amplifier 72 making a comparison between a voltage applied from comparison voltage generating circuit 70 and reference voltage Vref, and an n-channel MOS transistor 74 which adjusts the voltage level of voltage VSa on node 3a in accordance with the output signal of differential amplifier 72. MOS transistor 74 is coupled between node 3a and ground node (second power supply) VSS, and receives on its gate the output signal of differential amplifier 72.

Comparison voltage generating circuit 70 includes a constant current source 70a which is connected between power supply node (first power supply) VCC and a node 70e, and supplies a constant current, and also includes diode-connected p-channel MOS transistors 70b and 70c as well as a diode-connected n-channel MOS transistor 70d which are connected in series between node 70e and node 3a. A comparison voltage is generated from node 70e.

Differential amplifier 72 receives on its positive input, and reference voltage Vref on its negative input.

In comparison voltage generating circuit 70, MOS transistors 70b–70d each operate in the diode mode in accordance with a constant current supplied from constant current source 70a, and cause voltage drop by the absolute value of the threshold voltage. Therefore, a voltage V70e on node 70e can be expressed by the following representation:

$$V70e = VSa + VTN + 2 \cdot |VTP|$$

Differential amplifier 72 differentially amplifies voltage V70e supplied from node 70e and reference voltage Vref. When voltage V70e is higher than reference voltage Vref, the output signal of differential amplifier 72 attains a high level in accordance with the voltage difference, so that the conductance of MOS transistor 74 increases to flow a current from node 3a to second power supply (ground node) VSS, and the voltage level of internal voltage VSa is reduced.

When voltage V70e is lower than reference voltage Vref, the output signal of differential amplifier 72 attains a low level, and MOS transistor 74 maintains the off state. Therefore, comparison voltage V70e from node 70e is set to the voltage level equal to reference voltage Vref, and internal voltage VSa generated from node 3a can be expressed by the following representation:

$$VSa = Vref - 2 \cdot |VTP| - VTN$$

Voltage V7 on second node 7 assumes various voltage levels depending on the structure of second power supply circuit 8. Second power supply circuit 8 may include the current driving or source follower MOS transistor in either FIG. 1 or FIG. 12. This is also true for the embodiments which will be described later.

In second internal voltage generating circuit 3 shown in FIG. 17, differential amplifier 72 receives reference voltage Vref on its negative input having a high input impedance. Therefore, internal voltage VSa can be produced without exerting no influence on the voltage level of reference voltage Vref. When internal voltage VSa varies, the internal voltage VSa is rapidly driven to the predetermined voltage level by the feedback loop of comparison voltage generating circuit 70, differential amplifier 72 and MOS transistor 74, so that lower internal power supply voltage V7 on second node 7 can be stably held at a constant voltage level.

When the second voltage generating circuit shown in FIG. 17 is used in combination with the first voltage generating circuit shown in FIG. 15, higher power supply voltage V4 on first node 4 is at a voltage level higher than reference voltage Vref, and lower internal power supply voltage V7 on second node 7 is at a level lower than reference voltage Vref. Therefore, the output signal has upper and lower amplitudes with respect to reference voltage Vref as a center made equal to each other. Accordingly, the signal having the amplitude of which center is provided by reference voltage Vref can be produced also in the structure which in turn uses differential amplifier 62 (see FIG. 15) and differential amplifier 72 (see FIG. 17) for generating the internal voltage.

[Embodiment 14]

Figure 18:
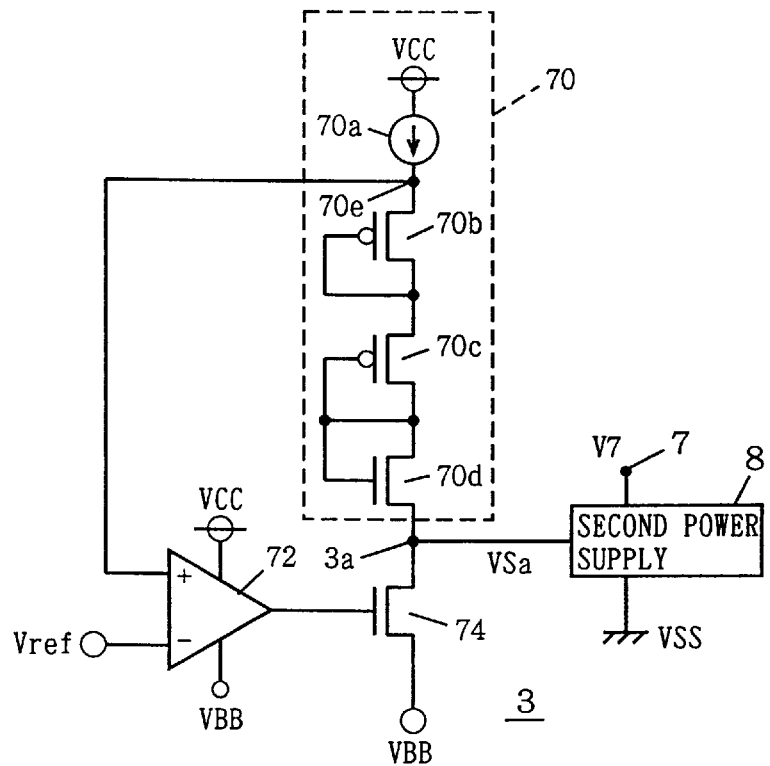

FIG. 18 shows a structure of a main portion of a semiconductor integrated circuit according to an embodiment 14 of the invention. More specifically, FIG. 18 shows a structure of a portion of second voltage generating circuit 3.

Second voltage generating circuit 3 shown in FIG. 18 differs from the second voltage generating circuit shown in FIG. 17 in the following point. In second voltage generating circuit 3 shown in FIG. 18, an n-channel MOS transistor 74 for adjusting the voltage level of internal voltage VSa receives, on its source, negative voltage VBB instead of ground voltage VSS. Structures other than the above are the same as those in FIG. 17, and corresponding portions bear the same reference numerals.

As shown in FIG. 18, the voltage level of reference voltage Vref can be made low even with a low power supply voltage owing to utilization of negative voltage VBB, and internal voltage VSa can be held at an intended voltage level even when internal voltage VSa is at a voltage level near the ground voltage. Thereby, a range of the operation power supply voltage of the voltage generating circuit can be widened.

Since negative voltage VBB is applied to the source of MOS transistor 74, differential amplifier 72 operates using power supply voltage VCC and negative voltage VBB as its operation power supply voltages. Thereby, MOS transistor 74 is reliably driven to the off state.

[Embodiment 15]

Figure 19:
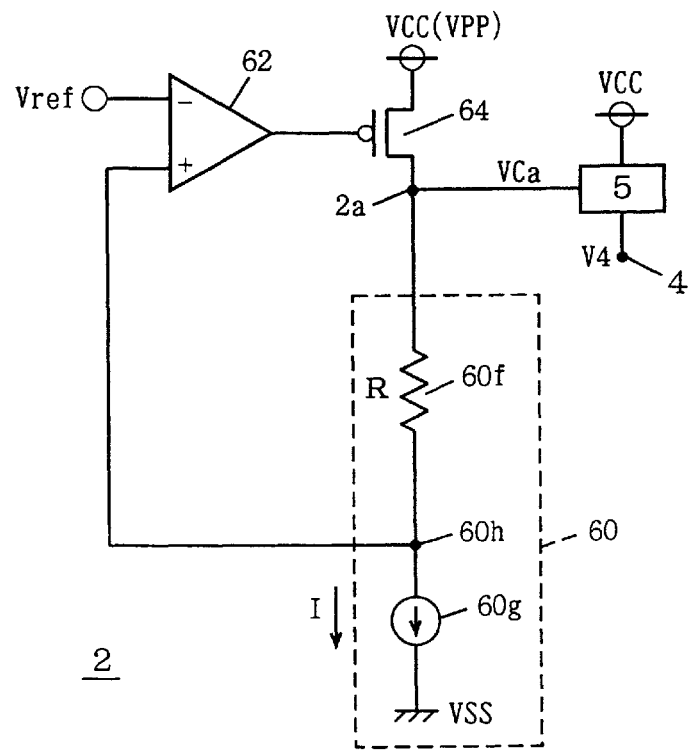

FIG. 19 shows a structure of a main portion of a semiconductor integrated circuit according to an embodiment 15 of the invention. More specifically, FIG. 19 shows a structure of a portion of first voltage generating circuit 2 which generates internal voltage VCa for producing higher internal power supply voltage V4 on first node 4. The structure of first voltage generating circuit 2 shown in FIG. 19 differs from first voltage generating circuit 2 shown in FIG. 15 in the following point. Comparison voltage generating circuit 60 includes a resistance element 60f connected between nodes 2a and 60h, and a constant current source 60g connected between node 60h and ground node (second power supply) VSS. Structures other than the above are the same as those shown in FIG. 15, and corresponding portions bear the same reference numerals.

In the structure of first voltage generating circuit 2 shown in FIG. 19, differential amplifier 62 and p-channel MOS transistor 64 perform the control such that the voltage level on node 60h becomes equal to reference voltage Vref. Therefore, the voltage level of internal voltage VCa on node 2a can be expressed by the following representation:

$$VCa = Vref + I \cdot R$$

where I represents a current driven by constant current source 60g, and R represents a resistance value of resistance element 60f. By appropriately adjusting resistance value R of resistance element 60f and drive current I of constant current source 60g, internal voltage VCa can be set to any voltage level in a range from reference voltage Vref to power supply voltage VCC. Thereby, the amplitude of output signal can be easily set to an appropriate value.

In first voltage generating circuit 2 shown in FIG. 19, boosted voltage VPP (represented inside the parentheses) may be supplied instead of power supply voltage VCC.

[Embodiment 16]

Figure 20:
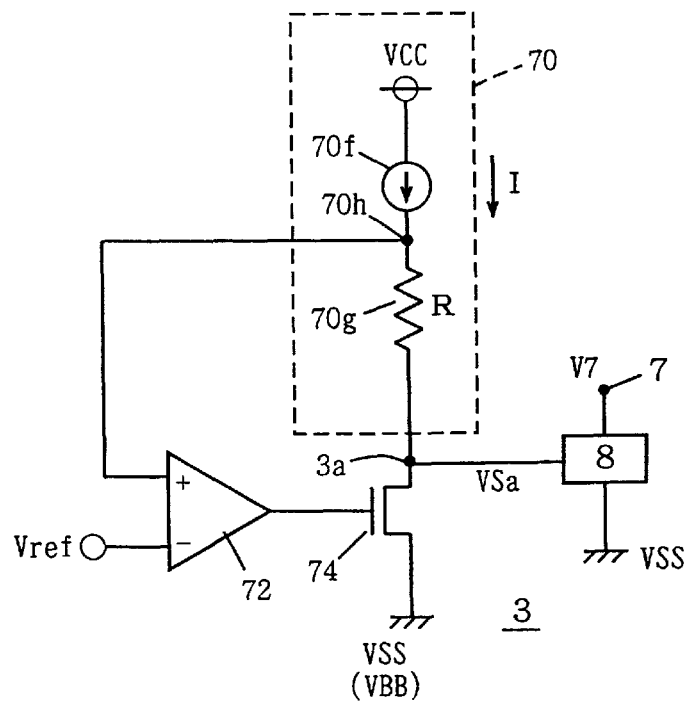

FIG. 20 shows a structure of a main portion of a semiconductor integrated circuit according to an embodiment 16 of the invention. More specifically, FIG. 20 shows a structure of a portion of second voltage generating circuit 3. Second voltage generating circuit 3 shown in FIG. 20 differs from second voltage generating circuit 3 shown in FIG. 17 in the following point. Comparison voltage generating circuit 70 includes a constant current supply 70f connected between power supply node (first power supply) VCC and a node 70h and a resistance element 70g connected between nodes 70h and 3a. Structures other than the above are the same as those shown in FIG. 17, and corresponding portions bear the same reference numerals.

In the structure of the second voltage generating circuit shown in FIG. 20, internal voltage VSa generated from node 3a can be expressed by the following representation because the voltage level on node 70h is equal to the voltage level of reference voltage Vref.

$$VSa = Vref - I \cdot R$$

where I represents a current flowing through constant current supply 70f, and R represents a resistance value of resistance element 70g.

In the structure of second voltage generating circuit 3 shown in FIG. 20, internal voltage VSa can be set to any voltage level between reference voltage Vref and ground voltage VSS. In second voltage generating circuit 3 shown in FIG. 20, negative voltage VBB (represented inside the parentheses) may be used instead of ground voltage VSS.

In the voltage generating circuits shown in FIGS. 19 and 20, if constant current sources 60g and 70g in comparison voltage generating circuits 60 and 70 supply the same magnitude of current, and if the resistance elements have the same resistance value R, the output signal from output circuit can have the equal amplitudes at upper and lower sides with respect to reference voltage Vref as a center.

[Embodiment 17]

Figure 21:
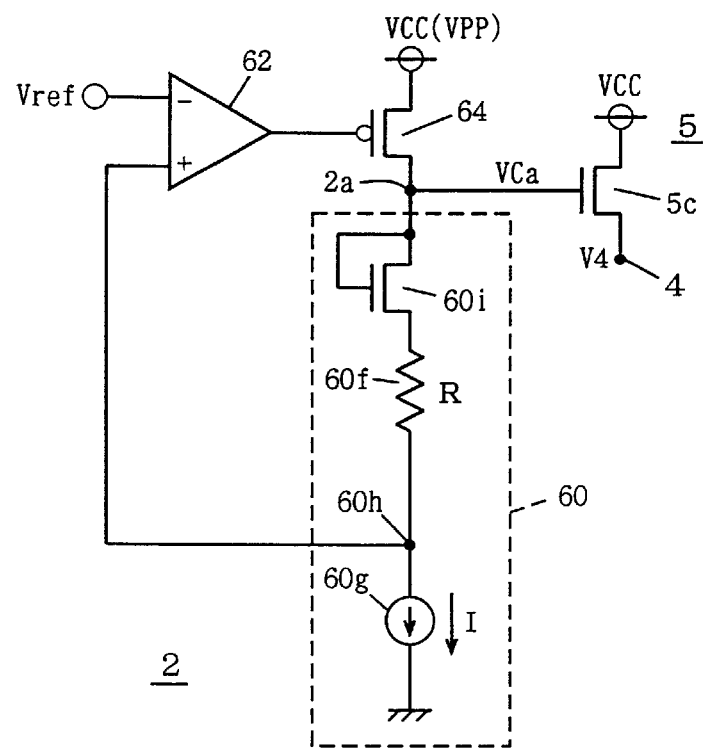

FIG. 21 shows a structure of a main portion of a semiconductor integrated circuit according to an embodiment 17 of the invention. More specifically, FIG. 21 shows a structure of a portion of first voltage generating circuit 2. First voltage generating circuit 2 shown in FIG. 21 differs from first voltage generating circuit 2 shown in FIG. 19 in the following point. A diode-connected n-channel MOS transistors 60i is arranged between node 2a and resistance element 60f. First power supply circuit 5 includes n-channel MOS transistor 5c which is connected between first power supply VCC and first node 4, and receives voltage VCa on its gate. Structures other than the above are the same as those shown in FIG. 19, and corresponding portions bear the same reference numerals.

In the structure of first voltage generating circuit 2 shown in FIG. 21, internal voltage VCa can be expressed by the following representation:

$$VCa = Vref + I \cdot R + VTN$$

Therefore, higher internal power supply voltage V4 supplied onto first node 4 can be expressed by the following representation:

$$V4 = Vref + I \cdot R$$

When the first voltage generating circuit shown in FIG. 21 is used, the voltage level of higher internal power supply voltage V4 appearing on first node 4 does not depend on the threshold voltage of MOS transistor 5c, and is determined by resistance value R of resistance element 60f and the magnitude of current I driven by constant current source 6g. Therefore, the higher internal power supply voltage at an intended voltage level can be stably produced without an influence by a variation in threshold voltage which is caused by variations in manufacturing parameters.

In the structure shown in FIG. 21, first voltage generating circuit 2 may be adapted to receive boosted voltage VPP (represented inside the parentheses) as one operation power supply voltage.

[Embodiment 18]

Figure 22:
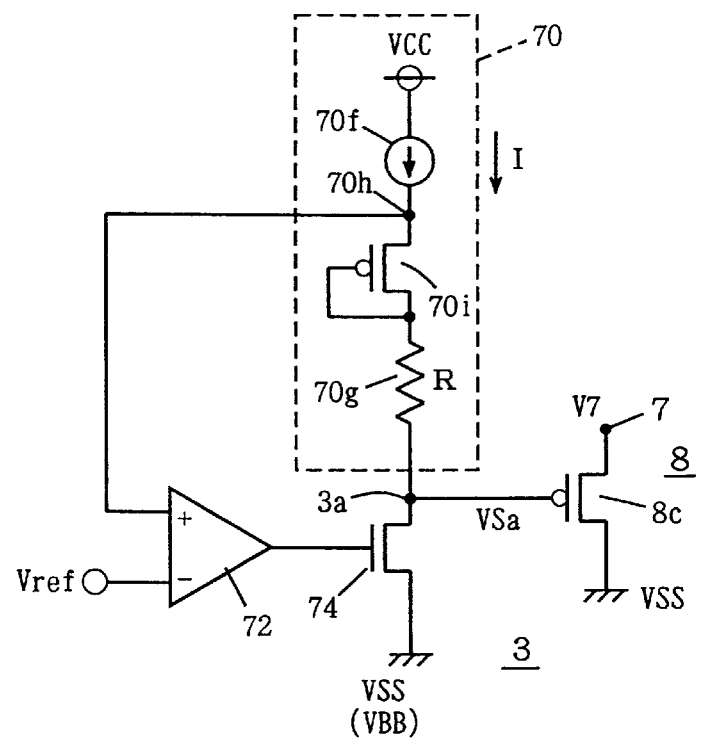

FIG. 22 shows a structure of a main portion of a semiconductor integrated circuit according to an embodiment 18 of the invention. More specifically, FIG. 22 shows a structure of a portion of second voltage generating circuit 3. Second voltage generating circuit 3 shown in FIG. 22 differs from second voltage generating circuit 3 shown in FIG. 20 in the following point. A diode-connected p-channel MOS transistor 70i is arranged between a constant current source 70f and resistance element 70g. Second power supply circuit 8 includes p-channel MOS transistor 8c which is connected between second power supply VSS and second node 7, and receives voltage VSa on its gate. Structures other than the above are the same as those shown in FIG. 20, and corresponding portions bear the same reference numerals.

In the second voltage generating circuit shown in FIG. 22, lower internal power supply voltage V7 transmitted to second node 7 can be expressed by the following representation:

$$V7 = Vsa + |VTP|$$

$$= Vref - I \cdot R$$

According to second voltage generating circuit 3 shown in FIG. 22, lower internal power supply voltage V7 appearing on second node 7 does not depend on the threshold voltage of MOS transistor 8c. Consequently, the lower internal power supply voltage at an intended voltage level can be stably produced without an influence by a variation in threshold voltage of the MOS transistor which may occur due to variations in manufacturing parameters.

In the structure of second voltage generating circuit 3 shown in FIG. 22, negative voltage VBB may be used instead of ground voltage VSS, as represented inside the parentheses. When the second voltage generating circuit shown in FIG. 22 is used in combination with the first voltage generating circuit shown in FIG. 21, both the higher and lower internal power supply voltages can be set to the voltage levels independent of the threshold voltages of the MOS transistors.

[Embodiment 19]

Figure 23:
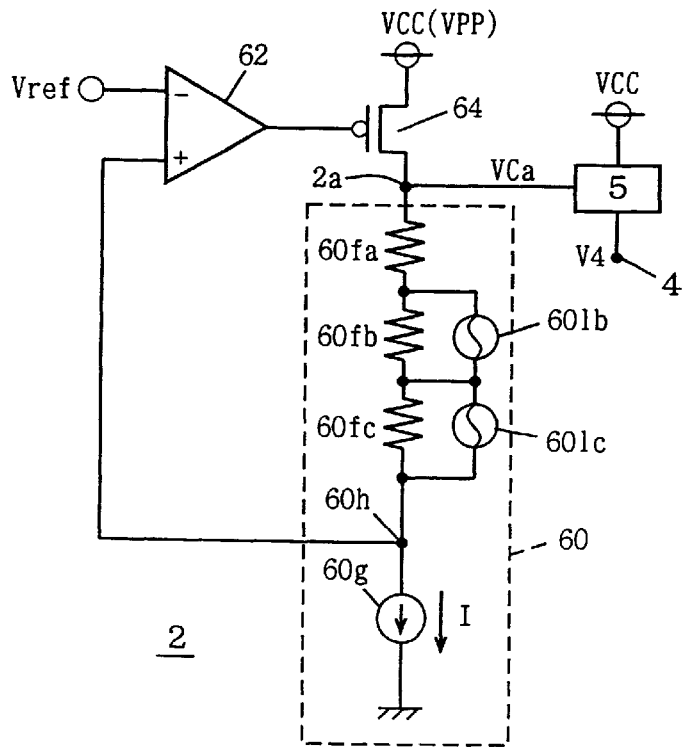

FIG. 23 shows a structure of a main portion of a semiconductor integrated circuit according to an embodiment 19 of the invention. More specifically, FIG. 23 shows a structure of a portion of first voltage generating circuit 2. First voltage generating circuit 2 shown in FIG. 23 differs from first voltage generating circuit 2 shown in FIG. 19 in the following point.

Resistance elements 60fa, 60fb and 60fc are connected in series between nodes 2a and 60h, and fusible link elements 601b and 601c are connected in parallel to resistance elements 60fb and 60fc, respectively. Link elements 601b and 601c are made of aluminum or other metal having a high melting point. Structures other than the above are the same as those of the first voltage generating circuit shown in FIG. 19, and corresponding portions bear the same reference numerals.

In first voltage generating circuit 2 shown in FIG. 23, a combined resistance value of the resistance elements between nodes 2a and 60h depends on blownout and non-blownout of link elements 601b and 601c. When both link elements 601b and 601c are blown out, a resistance element having a combined resistance value of three resistance elements 60fa, 60fb and 60fc is arranged between nodes 2a and 60h. When neither link element 601b nor 601c is blown out, resistance elements 60fb and 60fc are short-circuited by link elements 601b and 601c, and the resistance value between nodes 2a and 60h is given by the resistance value of resistance element 60fa.

By selectively blowing out link elements 601b and 601c, the resistance value between nodes 2a and 60h can be adjusted, so that higher internal power supply voltage V4 produced on first node 4 from internal voltage VCa can be adjusted. Consequently, higher internal power supply voltage V4 can be easily adjusted to an intended voltage level even when the voltage level thereof may differ from the intended voltage level due to variations in manufacturing parameters or the like.

If the semiconductor integrated circuit includes a semiconductor memory device, programming (blowout and non-blowout) of link elements 601b and 601c can be performed in the same step as programming (blowout/non-blowout) of other link elements, which in turn is performed during a defective address programming for repairing a defective memory cell. Thereby, the level adjustment of the higher internal power supply voltage can be easily performed without increasing the number of manufacturing steps.

[Embodiment 20]

Figure 24:
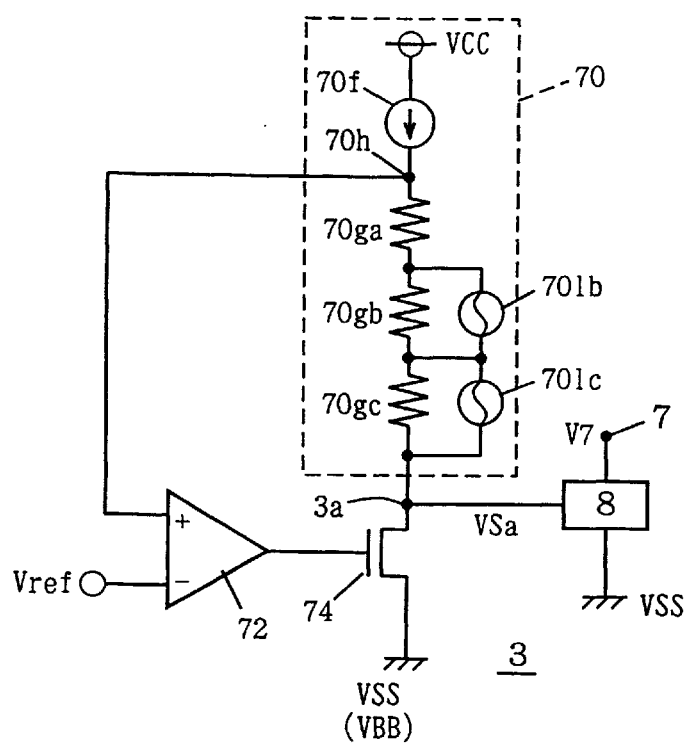

FIG. 24 shows a structure of a main portion of a semiconductor integrated circuit according to an embodiment 20 of the invention. More specifically, FIG. 24 shows a structure of a portion of second voltage generating circuit 3. Second voltage generating circuit 3 shown in FIG. 24 differs from second voltage generating circuit 3 in FIG. 20 in the following point.

Resistance elements 70ga, 70gb and 70gc are connected in series between constant current source 70f and node 3a, and fusible link elements 701b and 701c are connected in parallel with resistance elements 70gb and 70gc, respectively. Structures other than the above are the same as those of the second voltage generating circuit shown in FIG. 20, and corresponding portions bear the same reference numerals.

In second voltage generating circuit 3 shown in FIG. 24, link elements 701b and 701c are made of aluminum or other metal having a high melting point. The resistance value between nodes 70h and 3a can be adjusted by selectively blowing out link elements 701b and 701c, and thereby the voltage level of lower internal power supply voltage V7 on second node 7 based on internal voltage VSa can be adjusted.

The lower internal power supply voltage on the second node can be accurately set to an intended voltage level by selectively blowing out these link elements 701b and 701c even when variations in manufacturing parameters cause a variation in voltage level of the lower internal power supply voltage from the intended value.

[Embodiment 21]

Figure 25:
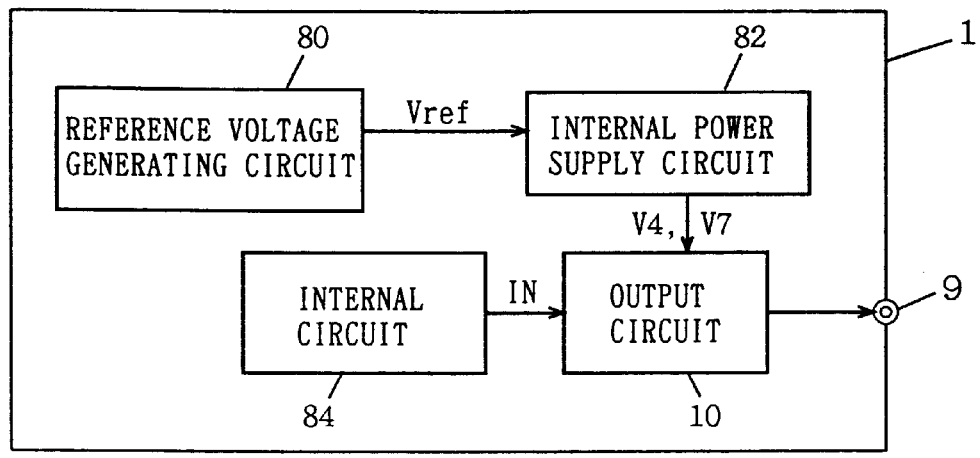

FIG. 25 schematically shows a whole structure of a semiconductor integrated circuit according to an embodiment 21 of the invention. In FIG. 25, semiconductor integrated circuit 1 includes a reference voltage generating circuit 80 generating reference voltage Vref, and an internal power supply circuit 82 which generates internal power supply voltages V4 and V7 in accordance with reference voltage Vref. Internal power supply circuit 82 has the same structure as any one of the foregoing embodiments, and includes first and second voltage generating circuits 2 and 3 including MOS transistors 5a and 7a for generating the internal power supply voltages. Internal power supply circuit 82 includes stabilizing capacitances 15 and 18 if these stabilizing capacitances 15 and 18 are not arranged outside the circuit.

Output circuit 10 receives output signal IN from an internal circuit 84, and transmits a signal at a level of voltage V4 or V7 onto output node (output terminal) 9. Internal circuit 84 operates using power supply voltage VCC and ground voltage VSS as its operation power supply voltages.

Since reference voltage generating circuit 80 is arranged within semiconductor integrated circuit 1 as shown in FIG. 25, it is not necessary to provide a pin terminal for receiving the reference voltage, so that terminals can be reduced in number.

Figure 26:
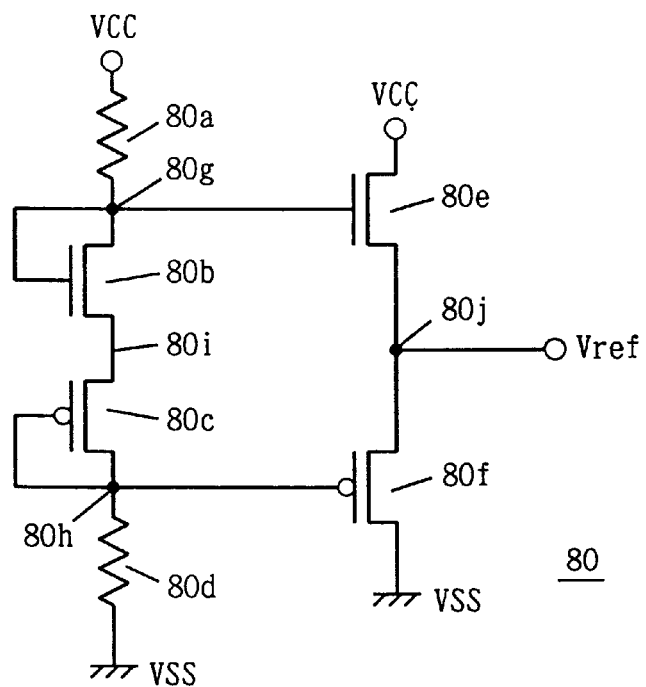
FIG. 26 shows an example of a structure of a reference voltage generating circuit shown in FIG. 25.

FIG. 26 shows an example of a structure of reference voltage generating circuit 80 shown in FIG. 25. In FIG. 26, reference voltage generating circuit 80 includes a resistance element 80a connected between power supply node (first power supply) VCC and a node 80g, an n-channel MOS transistor 80b which is connected between nodes 80g and 80i, and has a gate connected to node 80g, a p-channel MOS transistor 80c which is connected between nodes 80i and 80h, and has a gate connected to node 80h, a high-resistance resistance element 80d connected between node 80h and ground node (second power supply) VSS, an n-channel MOS transistor 80e which is connected between power supply node VCC and output node 80j, and has a gate connected to node 80g, and a p-channel MOS transistor 80f which is connected between an output node 80j and ground node VSS, and has a gate connected to node 80h. A in operation will now be described below.

Each of resistance elements 80a and 80d has a resistance value sufficiently larger than the on-resistance of each of MOS transistors 80b and 80c, and MOS transistors 80b and 80c operate in the diode mode. Resistance elements 80a and 80d have the same resistance value, and the voltage level on node 80i is VCC/2. Accordingly, voltages V80g on node 80g and voltage V80h on node 80h are expressed by the following representations:

$V80g=VCC/2+VTN$ $V80h=VCC/2-|VTP|$

MOS transistor 80e operates in the source follower mode because voltage V80g on its gate is lower than drain voltage VCC, and transmits onto output node 8j a voltage which in turn is lower by threshold voltage VTN than voltage V80g on its gate. Meanwhile, p-channel MOS transistor 80f operates in the source follower mode because voltage 80h on its gate is higher than drain voltage VSS, and transmits a voltage higher by the absolute value |VTP| of its threshold voltage than voltage V80h onto output node 80a. Therefore, reference voltage Vref is expressed by the following representation:

$Vref=VCC/2$

In the structure of reference voltage generating circuit 80 including high-resistance resistance elements 80a and 80d as shown in FIG. 26, only a minute current flows through resistance element 80a, MOS transistors 80b and 80c, and high-resistance resistance element 80d. Therefore, even when power supply voltage VCC varies during the operation of the output circuit, reference voltage generating circuit 80 responds extremely slowly to the variation, and voltage level on node 80i varies slowly, so that the voltage level on node 80i hardly varies even when power supply noises are generated, and thus it is possible to produce stable reference voltage Vref at a constant voltage level which is not affected by the rapid variation in power supply voltage.

MOS transistor 80e is turned on when reference voltage Vref becomes lower than the predetermined voltage level (VCC/2), to supply a current to output node 80j. At this time, p-channel MOS transistor 80f is off. When reference voltage Vref exceeds the predetermined voltage level (VCC/2), p-channel MOS transistor 80f is turned on to lower the voltage level on output node 80j. At this time, MOS transistor 80e is off. Therefore, MOS transistors 80e and 80f are not turned on at the same time, so that a through current does not flow. Further, MOS transistors 80e and 80f are in a boundary region between the on and off states, and the current consumption in the circuit is extremely small.

According to the embodiment 21 of the invention, as described above, the semiconductor integrated circuit is internally provided with the circuit for generating the reference voltage. Therefore, a pin terminal for receiving externally produced reference voltages is not required, so that pin terminals can be reduced in number, and therefore the chip area can be reduced.

[Embodiment 22]

Figure 27:
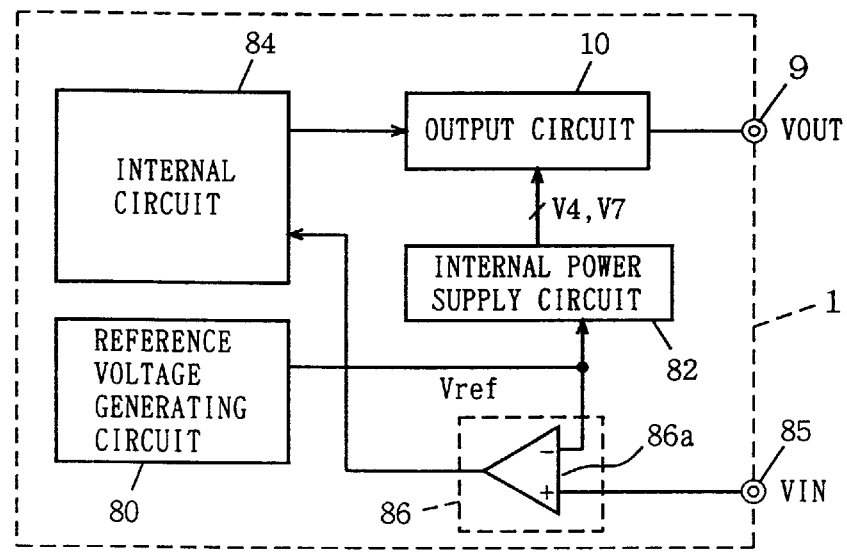
FIGS. 27 schematically shows a whole structure of a semiconductor integrated circuit according to an embodiment 22 of the invention.

FIG. 27 schematically shows a whole structure of a semiconductor integrated circuit according to an embodiment 22 of the invention. The semiconductor integrated circuit shown in FIG. 27 differs from the semiconductor integrated circuit shown in FIG. 25 in the following point.

The semiconductor integrated circuit shown in FIG. 27 includes an input circuit 86 which makes a comparison between reference voltage Vref supplied from internally provided reference voltage generating circuit 80 and input signal VIN applied to input node 85, and generates a signal in accordance with a result of the comparison. Input circuit 86 includes a differential amplifier 86a which receives reference voltage Vref on its negative input and input signal VIN from input node 85 on its positive input. Structures other than the above are the same as those shown in FIG. 25, and corresponding portions bear the same reference numbers.

Owing to the structure in which reference voltage Vref is supplied from on-chip reference voltage generating circuit 80 to both of internal power supply circuit 82 and input circuit 86, it is not necessary to supply externally the reference voltage, which in turn is used for determining the logical level of the input signal, to respective chips. Also, the reference for determining the high and low levels of the input signal is equal to the level of center of output signal VOUT generated from output circuit 10 to output node 9, so that the center levels of the input and output signals can be set to the same voltage, i.e., reference voltage Vref by arranging such reference voltage generating circuit within each chip. Thereby, signals can be transferred accurately.

In the structure shown in FIG. 27, input node 85 is separated from output node 9. However, input node 85 and output node 9 may be connected to the same external terminal.

In the reference voltage generating circuit shown in FIG. 26, reference voltage Vref is set to the voltage level equal to ½ of power supply voltage VCC. However, the determination level of the high and low levels of the input signal may be set to the voltage level of 0.45·VDDQ as is employed in the system of the class I of SSTL-3 already described. Thus, reference voltage Vref may be set to the voltage level of 0.45·VDDQ where VDDQ represents an externally supplied power supply voltage dedicated to an output circuit. By supplying the power supply voltage dedicated to the output circuit from an external power supply independent of the power supply, which in turn is used for operating the internal circuit, a variation in power supply voltage for the internal circuit can be suppressed, which variation may caused upon operation of the output circuit. Also, the output circuit supplied with the dedicated power supply voltage can drive the output node with a margin. Therefore, the output circuit can stably generates the signal.

According to the embodiment 22 of the invention, as described above, the reference voltage generating circuit is arranged within the semiconductor integrated circuit, and the reference voltage from the reference voltage generating circuit is supplied to the internal power supply circuit determining the amplitude of the output signal, and is also used as the reference voltage for determining the high and low levels of the input signal. Therefore, it is possible to transfer the signals in such a manner that the input and output signals have the center levels coinciding accurately with each other, without increasing the pin terminals in number.

In particular, when all the power supply voltages of the semiconductor integrated circuits in the system vary in a similar manner due to a variation in a system power supply, the reference voltages also vary in a similar manner. Therefore, the high and low levels of the signal can be accurately determined and the signal transfer can be performed stably and accurately even when such a variation occurs in a system power supply voltage.

[Embodiment 23]

Figure 28:
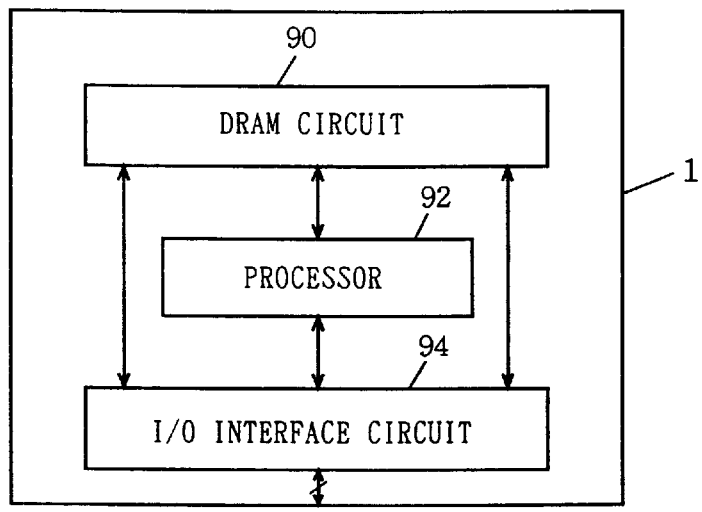
FIGS. 28 schematically shows a whole structure of a semiconductor integrated circuit according to an embodiment 23 of the invention.

FIG. 28 schematically shows a whole structure of a semiconductor integrated circuit according to an embodiment 23 of the invention. In FIG. 28, semiconductor integrated circuit 1 includes a memory element of a DRAM (Dynamic Random Access Memory) circuit 90, a processor 92 for performing a predetermined processing on data stored in DRAM circuit 90 and externally supplied data, and an I/O interface circuit 94 for externally transmitting signals into and from the integrated circuit. Processor 92 and DRAM circuit 90 can transmit data to and from I/O interface circuit 94.

In this semiconductor integrated circuit 1, processor 92 and DRAM circuit 90 are integrated. Since processor 92 and DRAM circuit 90 are formed on the same semiconductor chip, DRAM circuit 90 can transmit data to and from processor 92 through a data bus of an intended bit width without a limitation on the number of pins. This allows fast data transfer.

I/O interface circuit 94 includes output circuit 10 and internal power supply circuit 82 which limits the amplitude of the output signal of output circuit 10, as described previously. The I/O interface portion determines the logical level of the input signal based on the reference voltage.

Figure 29:
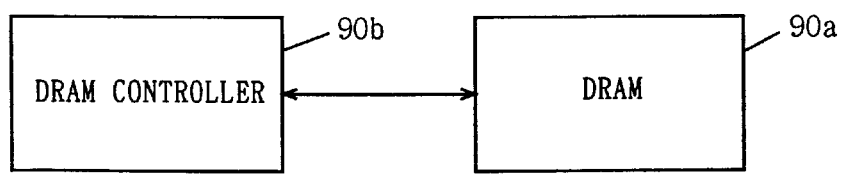
FIG. 29 schematically shows a structure of a DRAM circuit shown in FIG. 28.

FIG. 29 schematically shows a structure of DRAM circuit 90 shown in FIG. 28. In FIG. 29, DRAM circuit 90 includes a DRAM 90a having a plurality of dynamic memory cells, and a DRAM controller 90b which controls an access in accordance with an instruction supplied from processor 92 or an external unit. DRAM controller 90b controls writing and reading of data into and from DRAM 90a, and thereby perform data transfer between processor 92 and DRAM 90a and data transfer between I/O interface circuit 94 and DRAM 90a.

Figure 30:
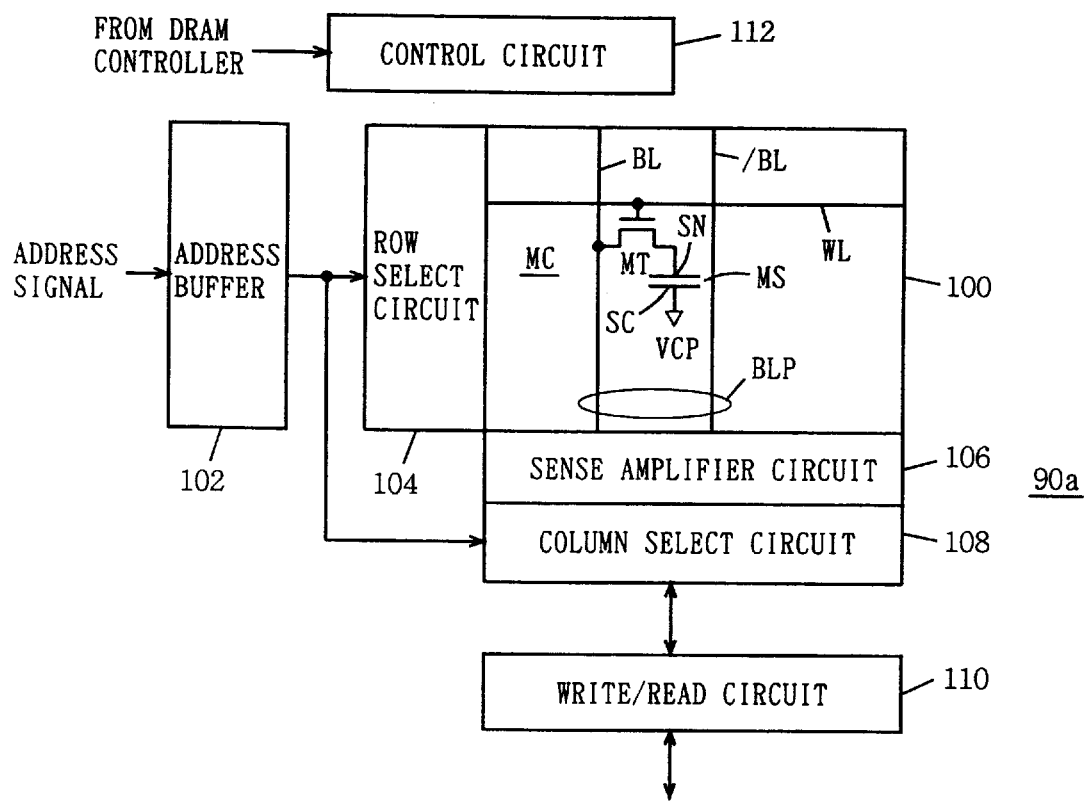
FIG. 30 schematically shows a structure of a DRAM circuit shown in FIG. 29.

FIG. 30 schematically shows a whole structure of the DRAM (Dynamic Random Access Memory) shown in FIG. 29. In FIG. 30, DRAM 90a includes a memory cell array 100 having a plurality of memory cells MC arranged in rows and columns. Memory cell array 100 includes a plurality of word lines which are arranged corresponding to the rows of memory cells and are connected to the memory cells in the corresponding rows, respectively, as well as a plurality of bit line pairs which are arranged corresponding to the columns of memory cells and are connected to the memory cells in the corresponding columns, respectively. FIG. 30 representatively shows one word line WL and one bit line pair BLP. Bit line pair BLP includes a bit line BL and a complementary bit line /BL. A plurality of memory cells MC are arranged corresponding to crossings between word lines WL and bit line pairs BLP, respectively. FIG. 30 representatively shows memory cell MC arranged corresponding to the crossing between bit line BL and word line WL.

Memory cell MC includes a memory cell capacitor MS for storing information in the form of electric charges, and an access transistor MT formed of an n-channel MOS transistor which is turned on when word line WL is selected, to connect a storage node SN of memory cell capacitor MS to the corresponding bit line (bit line BL in FIG. 30). Memory cell capacitor MS receives an intermediate voltage (cell plate voltage) VCP on the other electrode node (cell plate electrode node). Intermediate voltage VCP is at the voltage level equal to ½ of the difference between operation power supply voltage VCC of the DRAM and ground voltage GND. The operation power supply voltage of this DRAM may be the power supply voltage which is commonly supplied to processor 92 and DRAM circuit 90 of semiconductor integrated circuit 1, or may be a down-converted internal power supply voltage which is produced in the DRAM.

DRAM 90a further includes an address buffer 102 which receives and buffers an externally supplied address signal to produce an internal address signal a row select circuit 104 which drives the word line corresponding to an addressed row in memory cell array 100 to the selected state in accordance with the internal row address signal from address buffer 102, a sense amplifier circuit 106 which differentially amplifies and latches the potentials on bit line pair BLP when active, and a column select circuit 108 which selects a column in memory cell array 100 in accordance with the internal column address signal from address buffer 102. A write/read circuit 110 writes and reads data into and from the memory cell on the column selected by column select circuit 108. Write/read circuit 110 also inputs and outputs data externally from and into the DRAM.

DRAM 90a further includes a control circuit 112 which receives various control signals from the DRAM controller shown in FIG. 29 and produces control signals required for an internal operation.

In operation, row select circuit 104 drives word line WL corresponding to a selected row to the selected state, and data of the memory cells connected to word line WL thus selected are read onto the corresponding bit lines, respectively. Data of the memory cell is read onto one of bit lines BL and /BL. The other bit line is held at the voltage level of a precharge potential (VCC/2), and provides the reference voltage for the read data of the memory cell. Sense amplifier 106 is then activated to amplify differentially and latch the potentials on each bit line pair. Then, column select circuit 108 selects the column in accordance with the internal column address signal from address buffer 102, and connects the selected column to write/read circuit 110. Write/read circuit 110 writes or reads the data into or from the memory cell on the selected column.

Memory cell capacitor MS includes a thin capacitor insulating film for achieving a large capacitance value with a small occupied area. For ensuring an intended breakdown voltage of the memory cell capacitor MS having a thin capacitor insulating film, a cell plate voltage VCP at an intermediate voltage level is applied to cell plate electrode node SC. The potential on word line WL is raised to a voltage level higher than the operation power supply voltage level when word line WL is selected. Therefore, the gate insulating film of access transistor MT has a thickness larger than that of memory cell capacitor MS for ensuring an intended breakdown voltage.

Figure 31:
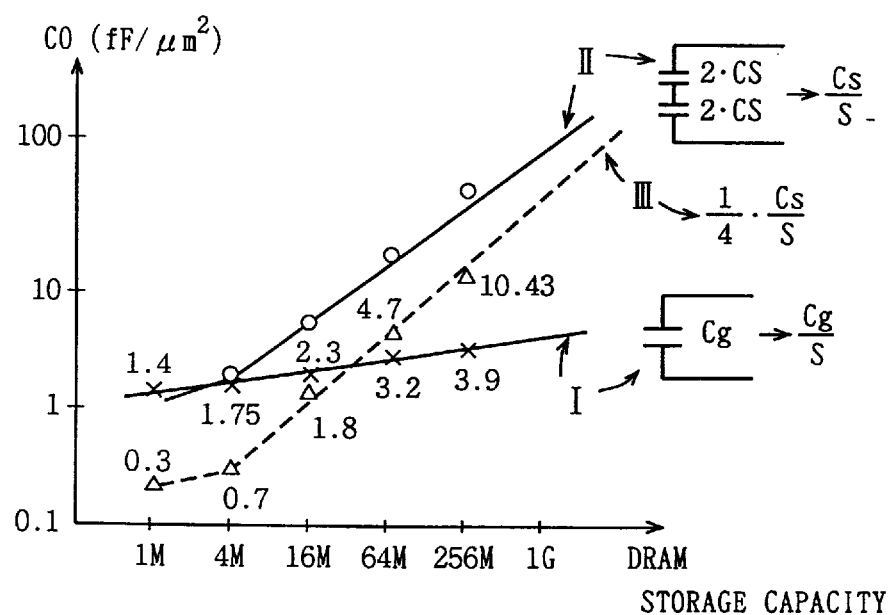
FIG. 31 shows, in the form of a function of a storage capacity, a relationship between capacitance values of a MOS capacitor and a memory cell capacitor in a DRAM.

FIG. 31 shows a relationship of capacitance values per unit area of the capacitor (gate capacitor) using access transistor MT and memory cell capacitor MS with respect to a storage capacitance of the DRAM. In FIG. 31, the abscissa gives the storage capacitance of the DRAM, and the ordinate gives the capacitance value (in a unit of fF) per unit area ($\mu m^2$). The gate capacitor using access transistor MT has the breakdown voltage higher than the power supply voltage. The transistor used for this gate capacitor may be the same as the MOS transistor in the logic circuit included in the peripheral circuit or processor 22 (see FIG. 28). Therefore, FIG. 31 shows the unit capacitance value C0 of gate capacitor Cg using access transistor MT or the MOS transistor which is a component of the logic circuit.

In memory cell capacitor MS, the cell plate receives the intermediate voltage VCP (=VCC/2) for achieving a sufficiently large capacitance value with a reduced occupied area. Therefore, memory cell capacitor MS has the breakdown voltage of VCC/2. When memory cell capacitor MS is to be used for the same purpose as the MOS transistor (gate capacitor), two memory cell capacitors MS connected in series are used for achieving the breakdown voltage equal to power supply voltage VCC. In this case, the area of memory cell capacitor MS is doubled for compensating for the lowering in capacitance value due to the series connection. When memory cell capacitors MS are used, therefore, a relationship of C0=CS/4 is satisfied as represented by a curve III in FIG. 31 where CS represents an actual capacitance value of memory cell capacitor MS. Therefore, a value equal to ¼ of the value on the ordinate in FIG. 31 gives the actual capacitance value CS of the memory cell capacitor MS (capacitance value C0 on the ordinate in FIG. 31 represents the capacitance value per unit area).

As shown in FIG. 31, both the gate capacitor using the MOS transistor and the memory cell capacitor MS have capacitance value Cg and CS which increase with increase in storage capacity of the DRAM. In the case of the gate capacitor, the film thickness of the gate insulating film and the ratio of (channel width)/(channel length) are scaled down in accordance with the scaling rule. Therefore, the capacitance value increases relatively slowly with increase in integration density (see curve I in FIG. 31). In the case of memory cell capacitor MS, it is required to maintain the substantially same capacitance value even when the area occupied thereby is reduced with increase in storage capacity of the DRAM. For this purpose, unit capacitance value C0 increases more rapidly than the MOS capacitor (gate capacitor) with increase in storage capacity of the DRAM (see curve II in FIG. 31).

In the DRAM, reading of stored information from memory cell MC is performed by sensing and amplifying a voltage (read voltage) $\Delta V$ appearing on bit line BL (or /BL). Read voltage $\Delta V$ increases in absolute value with increase in ratio (CS/CB) between capacitance value CS of memory cell capacitor MS and capacitance value CB of bit line BL (or /BL). Bit line capacitance CB depends on the length of bit line BL (or /BL) and the number of access transistors MT connected thereto. For minimizing bit line capacitance CB, a block dividing arrangement is generally used in the DRAM to reduce the bit line length and the number of memory cells connected thereto. However, bit line capacitance CB can be reduced only to a limited value. Therefore, it is necessary to increase capacitance value CS of memory cell capacitor MS as large as possible in order to increase the absolute value of read voltage DV.

In the DRAM, read voltage $\Delta D$ varies in value when the quantity of accumulated charges varies due to production of hole and electron pairs by incident a rays, in which case accurate reading of the memory cell data cannot be performed. In a static random access memory (SRAM), a memory cell has a structure of a flip-flop. In a memory cell of a flash EEPROM (flash memory: semiconductor memory device allowing a collective erasure over a chip), charges accumulated in a floating gate determine a threshold voltage of the memory cell transistor, and an influence exerted on the memory cell by incident a rays is smaller than that in the DRAM memory cell. For reducing the influence by a rays and producing a sufficient read voltage $\Delta V$, the quantity of accumulated charges of memory cell capacitor MS in the DRAM is increased as large as possible. In particular, when operation power supply voltage VCC is as low as 2.5 V or 1.2 V, the quantity of accumulated charges in the memory cell capacitor MS is reduced, and therefore memory cell MC must have a sufficiently large capacitance value.

In view of the foregoing, it is generally required that the memory cell capacitor in the DRAM has a capacitance value (30–35 fF) which is substantially constant independently of the integration density.

In FIG. 31, a straight line I represents capacitance value Cg of a MOS capacitor (gate capacitor), a straight line II represents a capacitance value per unit area in a structure including two memory cell capacitors connected in series, and a straight line III represents an actual capacitance value of the memory cell capacitor. Capacitance values C0 per unit area of memory cell capacitor MS and MS capacitor (gate capacitor) are also shown in connection with respective storage capacities.

As shown in FIG. 31, the capacitance value of the capacitor formed of memory cell capacitor MS is 0.8 times larger than that of the gate capacitor in the 16-Mbit DRAM. In the 64-Mbit DRAM, the capacitance value per unit area of the capacitor formed of memory cell capacitor MS is 1.5 times larger than that of the gate capacitor. In the 256-Mbit DRAM, the capacitance value per unit area of the capacitor formed of memory cell capacitor MS is 2.5 times larger than that of the gate capacitor. Thus, in the DRAMs of the generations of and after 64-Mbit DRAM, the capacity using memory cell capacitor MS can achieve a better area efficiency than the gate capacitor, and the difference in capacitance value between these capacitors rapidly increases with increase in storage capacity of the DRAM.

The embodiment 23 achieves the stabilizing capacitor having a high area efficiency through this feature of memory cell capacitor MS over the gate capacitor. In particular, even with the memory cell capacitor of the DRAM having a storage capacity smaller than 16 Mbits, it is possible to achieve the capacitance element which achieves a capacitance value sufficiently larger than that of the gate capacitor with a small occupation area, and thus has a good area efficiency. Particularly, as shown in FIG. 1 and others, stabilizing capacitors 15 and 18 for stabilizing internal power supply voltages V4 and V7 have to have the capacitance values which are 10 through 100 times larger than the external load capacitance, and are, for example, 5 nF. In the semiconductor integrated circuit including the DRAM, therefore, the stabilizing capacitors are achieved in the same process as that for manufacturing the memory cells in the DRAM, so that the stabilizing capacitors occupying a small area and having a good area efficiency are achieved.

Figure 32:
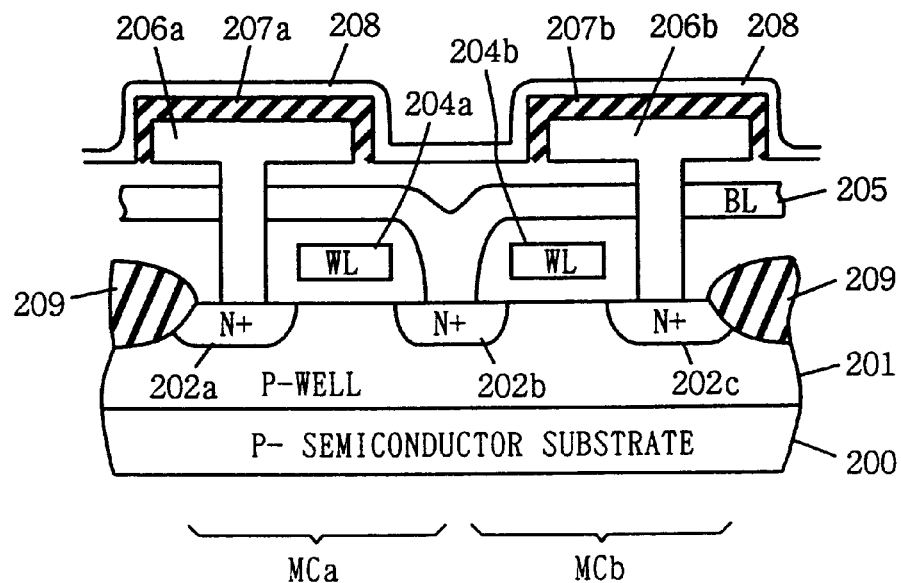
FIG. 32 schematically shows a sectional structure of a DRAM memory cell in the embodiment 23 of the invention.

FIG. 32 schematically shows a sectional structure of memory cells in a DRAM. More specifically, FIG. 32 schematically shows the sectional structures of two memory cells MCa and MCb. Memory cells MCa and MCb are formed at a surface of a P-well region 201 which is formed on a P$^-$-type semiconductor substrate 200 and is doped with impurity more heavily than substrate 200. Heavily doped N-type impurity regions 202a, 202b and 202c are separatedly formed at the surface of P-well 201. A conductive layer 204a, which is made of a first-level polycrystalline silicon layer and forms a word line (WL), is formed on a region between impurity regions 202a and 202b with a gate insulating film (not shown) therebetween. A conductive layer 204b, which is made of the first-level polycrystalline silicon layer and forms another word line, is formed on a region between impurity regions 202b and 202c with the gate insulating film (not shown) therebetween. These conductive layers 204a and 204b extend in parallel with each other in the row direction in FIG. 30.

Conductive layer 205, which is made of a first level aluminum interconnection layer and forms a bit line (BL), is arranged on conductive layers 204a and 204b, and extends in a direction perpendicular to conductive layers 204a and 204b.

For impurity region 202a, there is provided a conductive layer 206a forming one (i.e., storage node) of two electrodes of the memory cell capacitor and having a plug portion extending to impurity region 202a as well as a flat portion. For impurity region 202c, there is likewise provided a conductive layer 206b which has a plug portion and a flat portion, and forms a storage node of the capacitor. These conductive layers 206a and 206b are electrically connected to impurity regions 202a and 202c, respectively.

A conductive layer 208, which forms the other electrode (cell plate electrode node) of each memory cell capacitor, faces and covers the flat portions of conductive layers 206a and 206b forming the storage nodes of the memory cell capacitors with capacitor insulating films 207a and 207b therebetween, respectively. Conductive layer 208 forming the other electrode layer (cell plate electrode node) of each memory cell capacitor extends over all the memory cells.

Conductive layer 204a forming the word line, impurity regions 202a and 202b, conductive layer 206a forming the capacitor, capacitor insulating film 207a and conductive layer 208 form one of the memory cells, i.e., memory cell MCa. Memory cell MCb is formed of impurity regions 202b and 202c, conductive layer 204b forming the word line, conductive layer 206b forming the storage node, capacitor insulating film 207b, and conductive layer 208 forming the cell plate electrode node.

As can be understood from the structure shown in FIG. 32, the memory cell capacitor is disposed such that it overlaps with the access transistor of the memory cell in a plan view. This three-dimensional cell structure enables reduction in area occupied by the cell. Meanwhile, conductive layers 206a and 206b forming the storage nodes have the upper flat portions of a relatively large thickness. This increases an area facing to conductive layer 208 which serves as the cell plate electrode nodes. Thus, the capacitance value of the memory cell capacitor is increased by increasing the facing area without increasing the occupied area in a plan layout.

The structure of the memory cell shown in FIG. 32 is called a stacked capacitor structure, and the stacked capacitor having the three-dimensional structure can provide the capacitance element having a good area efficiency. In this embodiment, the above structure of the memory cell is utilized in the stabilizing capacitance element for stabilizing the internal power supply voltage.

[Stabilizing Capacitance Element]

Figure 33:
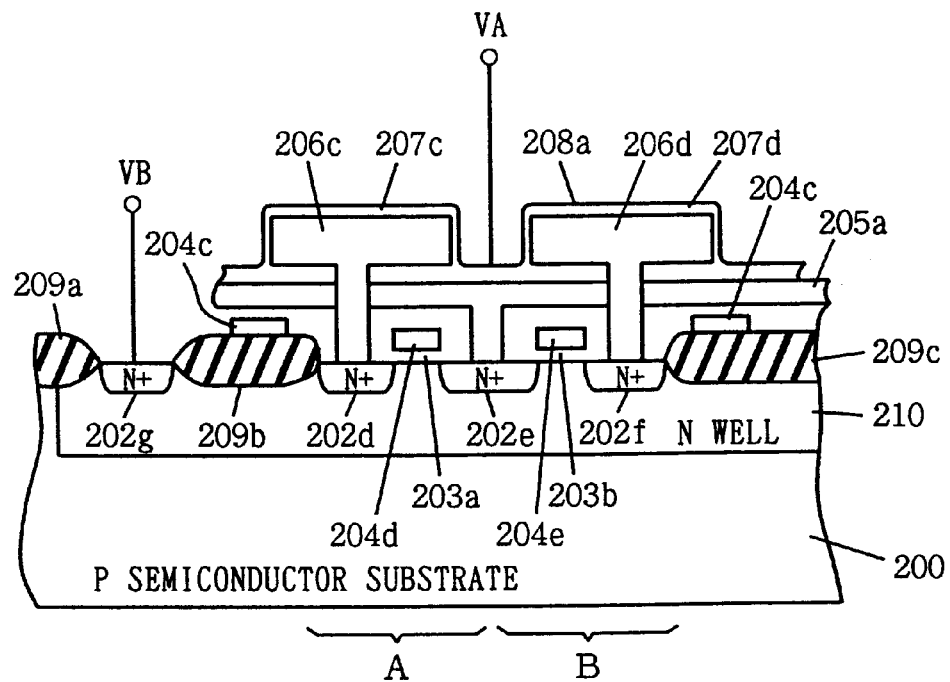
FIG. 33 schematically shows a sectional structure of a first stabilizing capacitance in the embodiment 23 of the invention.

FIG. 33 schematically shows a sectional structure of a first stabilizing capacitance element in the embodiment 23 of the invention. In FIG. 33, P$^-$-type semiconductor substrate region 200 has an N-well (N-type semiconductor layer) 210 forming the semiconductor substrate region of a first conductivity type formed on the surface thereof. At this substrate region formed of N-well 210, the capacitance element having the same structure as the memory cell shown in FIG. 32 is formed. Heavily doped N-type impurity regions 202g, 202d, 202e and 202f are separately formed at the surface of N-well 210. Impurity regions 202d through 202g are formed in the same manufacturing process as impurity regions 202a and 202b in the memory cell shown in FIG. 32. In the following description, components bearing the same reference numerals as those shown in FIG. 32 except suffixes are formed in the same manufacturing process.

An element isolating film 209c for element isolation, which is made of, e.g., a thermal oxidation film, is formed beside impurity region 202f. An element isolating film 209b is formed between impurity regions 202d and 202g, and an element isolating film 209a is formed in contact with an outer periphery of impurity region 202g. Element isolating films 209a and 209c delimits the capacitance element formation region.

A conductive layer 204d located at the same layer as the word line is formed on semiconductor substrate region (N-well) 210 between impurity regions 202d and 202e with a gate insulating film 203a therebetween. A conductive layer 204e located at the same layer as the word line is formed on semiconductor substrate region 210 between impurity regions 202e and 202f with a gate insulating film 203b therebetween. Conductive layers 204c and 204c' located at the same layer as the word line are formed on element isolating films 209b and 209c, respectively. These conductive layers 204c and 204c' are made of a material similar to that of the word line shown in FIG. 32, i.e., gate electrode layers 204a and 204b, and thus are made of an impurity-doped polycrystalline silicon of a low resistance a metal having a high melting point (refractory metal) or a refractory metal silicide. Conductive layers 204c through 204e and 204c' are conductive layers corresponding to word lines.

For impurity regions 202d and 202f, there are formed first conductive layers 206c and 206d each having a T-shape in a cross-sectional view. First conductive layers 206c and 206d are electrically connected to impurity regions 202d and 202f, respectively. Each of first conductive layers 206c and 206d has a plug portion (leg portion) electrically connected to corresponding impurity region 202d or 202f, and a flat portion having a relatively large sectional area for actually forming a capacitance. Conductive layers 206c and 206d are formed in the same manufacturing process as conductive layers 206a and 206b forming the storage nodes of the memory cells shown in FIG. 32, and have the same structures and the same material (impurity-doped polycrystalline silicon) as the conductive layers 206a and 206b. First conductive layers 206c and 206d have predetermined patterned configurations, and are isolated from each other by the interlayer insulating film.

A second conductive layer 208a is formed over first conductive layers 206c and 206d with insulating films 207a and 207b therebetween, respectively. Second conductive layer 208a is made of polycrystalline silicon of a low resistance which is heavily doped with impurity, and is formed in the same manufacturing process as cell plate conductive layer 208 forming the other electrode of the capacitor of the memory cell shown in FIG. 32.

Impurity region 202e is electrically connected to a conductive layer 205a extending laterally in the figure. Conductive layer 205a corresponds to conductive layer 205 forming the bit line shown in FIG. 32, and is formed in the same manufacturing process as bit line 205. Conductive layer 205a is made of the same material as conductive layer 205 corresponding to the bit line, and is made of, e.g., a refractory metal silicide (a silicide of a metal having a high melting point). Second conductive layer 208a is electrically connected to one (node VA) of two electrodes of this capacitance element, and impurity region 202g formed at the surface of N-well 210 is electrically connected to the other electrode node VB of the same capacitance element.

According to the structure shown in FIG. 33, second conductive layer 208a forms one electrode of the capacitance element. First conductive layers 206c and 206d are electrically connected to the N-well (semiconductor substrate region) 210 through impurity regions 202d and 202f, respectively, and further are electrically connected to the other electrode node VB of this capacitance element. Thus, the capacitances formed at regions A and B are connected in parallel with each other between electrode nodes VA and VB. These electrode nodes VA and VB are connected to the drain and source of MOS transistor 5 or 8 shown in FIG. 1, respectively.

The capacitance element shown in FIG. 33 has the same structure as the memory cell, and the capacitance elements formed at regions A and B occupy sufficiently reduced areas. Capacitor insulating films 207c and 207d each have a double layer structure formed of the silicon nitride film and the silicon oxide film, and can provide sufficiently large capacitance values with small occupied areas, capacitor insulating films 207a and 207b of the memory cells shown in FIG. 32.

Since the capacitance elements formed at regions A and B have the same structures as the memory cells, all the components thereof except semiconductor substrate region (N-well) 210 can be formed in the same manufacturing steps as the corresponding components of the memory cells, and therefore it is possible to achieve the capacitance elements having a good area efficiency without increasing the number of the manufacturing steps of the DRAM.

Figure 34:
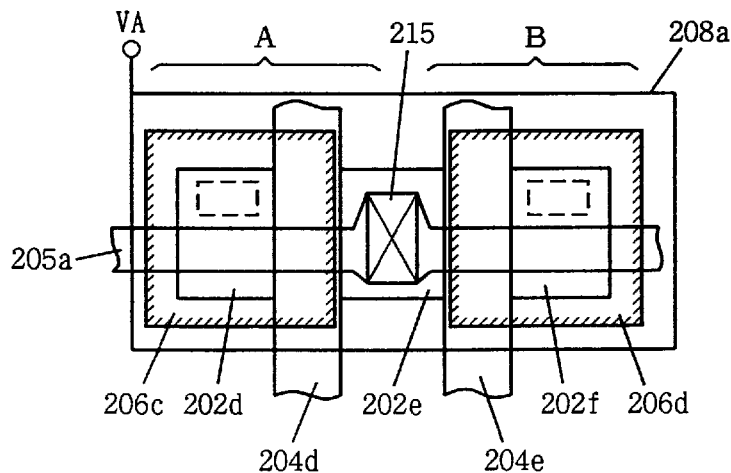
FIG. 34 shows a planar layout of the stabilizing capacitance shown in FIG. 33.

FIG. 34 shows a plan layout of the capacitance elements shown in FIG. 33. In FIG. 34, conductive layer 204d corresponding to the word line is arranged between impurity regions 202d and 202e, and conductive layer 204e corresponding to the word line is arranged between impurity regions 202e and 202f. Impurity region 202e is electrically connected to conductive layer 205a corresponding to the bit line through a contact hole 215. Conductive layers 204d and 204e are arranged perpendicularly to conductive layer 205a. This is because the capacitance elements have the same structures as the memory cells, conductive layers 204d and 204e correspond to the word lines, and conductive layer 205a corresponds to the bit line, as already described.

Impurity region 202d is electrically connected to conductive layer 206c through the plug portion represented by broken line in FIG. 34, and impurity region 202f is electrically connected to conductive layer 206d through the plug portion represented by broken line. Conductive layer 208a corresponding to the cell plate of the capacitors are arranged on conductive layers 206c and 206d. Conductive layers 206c and 206 forming the electrode nodes of the capacitance elements have extended portions located above conductive layers 204d and 204e, respectively.

As shown in FIG. 33, the flat portions of conductive layers 206c and 206d have large thicknesses and sufficiently increased side surfaces. Therefore, conductive layers 206c and 206 have large areas faced to conductive layer 208a. Thus, the capacitance element can have a feature of the memory cell capacitor of the DRAM, i.e., an advantageous feature that a large capacitance value can be achieved with a small occupied area. Capacitance elements which are the same as those shown in FIGS. 33 and 34 are arranged by a required number in rows and columns similar to the array structure of memory cells.

Figure 35A:
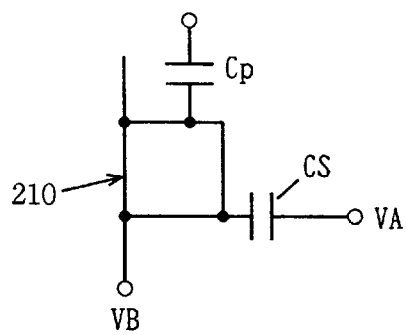
FIG. 35A shows an electrically equivalent circuit of a unit capacitance element of the stabilizing capacitance shown in FIGS. 33 and 34.
Figure 35B:
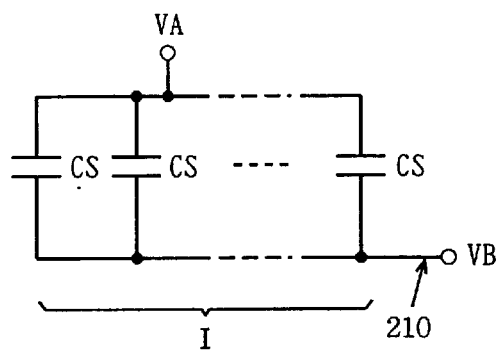
FIG. 35B shows an electrically equivalent circuit of the stabilizing capacitance.

FIGS. 35A and 35B show electrically equivalent circuits of one unit capacitance element and the first capacitance element of the embodiment 23 of the invention, respectively. As shown in FIG. 35A, one unit capacitance element includes a capacitor CS which is formed of conductive layers 208a and 206 (206c or 206d) and corresponds to memory cell capacitor MS, and a capacitor Cp which is formed of conductive layer 204 (204d or 204e) corresponding to the word line and semiconductor substrate region (N-well) 210. Capacitors Cp and CS are connected in parallel to semiconductor substrate region 210. One of two electrodes of capacitor CS is connected to node VA. Semiconductor substrate region 210 is connected to the other electrode node VB. Conductive layers 204 (204c through 204f) forming capacitors Cp and corresponding to the word lines may be electrically floated or may be fixedly connected to a constant potential source. Capacitor Cp corresponds to the gate capacitor of the access transistor of the memory cell. Therefore, capacitor Cp has the breakdown voltage of power supply voltage VCC or more, and its reliability is never impaired even when conductive layer 204 (204d or 204e) is fixedly supplied with power supply voltage VCC. Capacitor CS corresponding to the memory cell capacitor has the sufficiently thin capacitor insulating film and therefore a small breakdown voltage. However, a voltage applied across electrode nodes VA and VB is at the voltage level lower than VCC/2, and its reliability is never impaired.

In FIG. 35B, a plurality of capacitors CS are connected in parallel between power supply nodes VA and VB. FIG. 35B does not show capacitor Cp because it is smaller in capacitance value than capacitor CS. As shown in FIG. 35B, a plurality of capacitors CS are connected in parallel between nodes VA and VB. Assuming that capacitors CS are X in number, the capacitance element provides the capacitance value of X·CS. Therefore, the capacitance element having a required capacitance value can be easily achieved with a small occupied area by connecting a necessary number of unit capacitance elements CS corresponding to the memory cell capacitors in parallel.

Figure 36A:
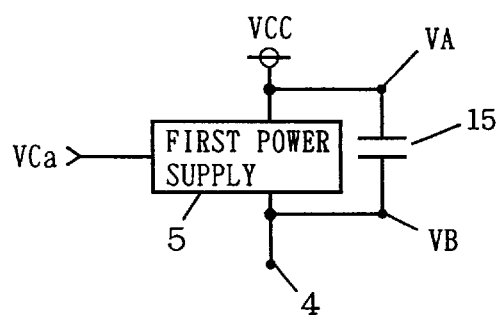
FIGS. 36A and 36B show forms of connection of the stabilizing capacitance shown in FIG. 33 to an output circuit.

FIG. 36A shows a form of connection in using the capacitance element shown in FIGS. 33 and 34 as the capacitance element for stabilizing the voltage on first node 4. In FIG. 36A, electrode node VA of capacitance element 15 is connected to first power supply VCC, and the other electrode node VB is connected to first node 4. Internal power supply voltage V4 on first node 4 is at a voltage level higher than reference voltage Vref, as already described, and a difference between power supply voltage VCC and internal power supply voltage V4 is smaller than VCC/2. Therefore, a voltage higher than VCC/2 is not applied across electrode nodes VA and VB of stabilizing capacitance element 15, and the plurality of capacitors which are the same as the memory cell capacitors can be connected in parallel while sufficiently ensuring the breakdown voltage.

Figure 36B:
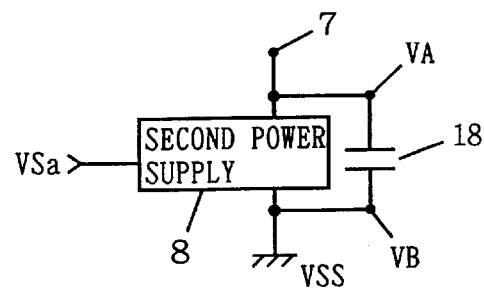

FIG. 36B shows a connection form of the capacitance element for stabilizing the lower internal power supply voltage. Capacitance element 18 is connected in parallel with p-channel MOS transistor 8. One electrode node (i.e., node VA) of capacitance element 18 is electrically connected to second node 7, and the other node VB is electrically connected to ground node (second power supply) VSS. Lower internal power supply voltage V7 on second node 7 is at a higher level than internal power supply voltage VSa. Therefore, lower internal power supply voltage V7 on second node 7 is at a level lower than reference voltage Vref. Therefore, a difference between lower internal power supply voltage V7 and ground voltage VSS is smaller than VCC/2. Accordingly, a plurality of capacitance elements shown in FIGS. 33 and 34 can be connected in parallel for use as stabilizing capacitance 18 with a sufficient reliability. The positions of electrodes VA and VB in FIGS. 36A and 36b may be replaced with each other.

As shown in FIGS. 36A and 36B, the capacitance value is achieved by utilizing the same structure as the memory cell, and particularly the same structure as the memory cell capacitor, and the stabilizing capacitance element is achieved by connecting a plurality of unit capacitance elements each having the same structure as the memory cell capacitor. Therefore, it is possible to achieve easily the stabilizing capacitor having the necessary capacitance value and occupying a small area. The stabilizing capacitance element can be achieved in the same manufacturing process as the memory cell, and increase in manufacturing process is not required at all.

[Stabilizing Capacitance Element 2]

Figure 37A:
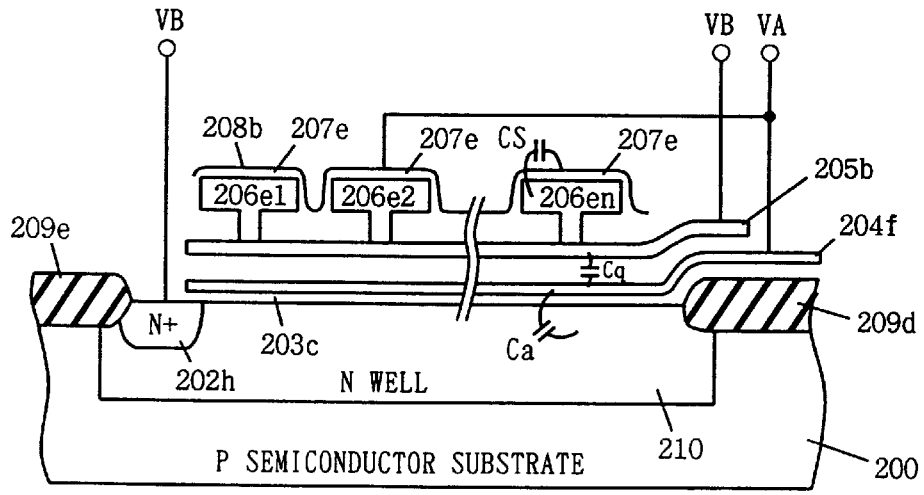
FIG. 37A schematically shows a sectional structure of a second stabilizing capacitance in the embodiment 23 of the invention.

FIG. 37A schematically shows a sectional structure of a second stabilizing capacitance element of the embodiment 23 of the invention. In the structure of the stabilizing capacitance element shown in FIG. 37A, conductive layer 204f corresponding to the word line is formed over the entire surface of N-well 210, which is formed at the surface of P-type semiconductor substrate 200 with gate insulating film 203c therebetween. Conductive layer 204c corresponding to the word line covers substantially the entire surface of N-well 210. Conductive layer 205b corresponding to the bit line is formed on the conductive layer 204f corresponding to the word line with an interlayer insulating film (not shown) therebetween. Bit-line-corresponding conductive layer 205b is faced substantially to the entire surface of conductive layer 204f corresponding to the word line. First conductive layers 206e1, 206e2, . . . 206en corresponding to the storage nodes of the memory cell capacitors are formed separatedly on the bit-line-corresponding conductive layer 205b. First conductive layers 206e1 through 206en are electrically and commonly connected to bit-line-corresponding conductive layer 205b. The capacitance forming portion (top flat portion) of the storage node of the memory cell capacitor is located at a higher layer than the bit line. In the manufacturing process of memory cells, the storage nodes of the memory cell capacitors are formed after manufacturing of the bit lines.

In the structure of the capacitance element shown in FIG. 37A, contact holes for electrically connecting first conductive layers 206e1–206en to bit-line-corresponding conductive layer 205b can be formed in a manner similar to that of formation of the contact holes for electrically connecting the unit capacitance elements shown in FIG. 33 to the corresponding impurity regions, and in other words, can be formed in the same manufacturing process as that for the memory cell capacitor and particularly as the process for forming the contact holes for the storage nodes of the memory cell capacitors. Therefore, the structure shown in FIG. 37A does not increase the numbers of masks and manufacturing steps. First conductive layers 206e1–206en are covered with second conductive layer 208b, which in turn is formed at the same level as the memory cell plate electrode layer, with a capacitor insulating film 207e therebetween.

N-well 210 is connected to electrode node VB through heavily doped N-type impurity region 202h formed at the surface thereof. Word-line-corresponding conductive layer 204f and second conductive layer 208b are connected to electrode node VA. Bit-line-corresponding conductive layer 205b is connected to electrode node VB.

In the structure of the capacitance element shown in FIG. 37A, the interlayer insulating film located between conductive layers 204f and 205b, which in turn correspond to the word line and bit line, respectively, forms a capacitor Cq. First conductive layers 206e1–206en corresponding to the storage nodes as well as second conductive layer 208b form the capacitance element formed of n unit capacitance elements connected in parallel owing to provision of capacitor insulating film 207e located between them. Thus, first conductive layers 206e1–206en, capacitor insulating film 207e and second conductive layer 208b form the capacitance element having the capacitance value of n·CS.

Although, first conductive layer 206e1–206en are electrically and commonly connected to conductive layer 205b corresponding to the bit line, the capacitance value of this capacitance element is determined by the surface areas of the top flat portions of first conductive layers 206e1–206en facing to second conductive layer 208b. Therefore, the capacitance element formed of second conductive layer 208b, first conductive layers 206e1–206en, and capacitor insulating film 207e has the capacitance value equal to that of capacitance element I shown in FIG. 35.

Conductive layer 204f corresponding to the word line, N-well 210 and gate insulating film 203c form capacitance element Ca. N-well 210 is electrically connected to electrode node VB through impurity region 202h, and the whole surface of N-well 210 functions as one of two electrodes of the capacitor.

Figure 37B:
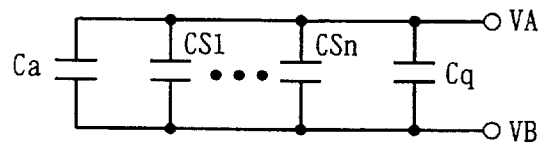
FIG. 37B shows an electrically equivalent circuit of the same.

FIG. 37B shows an electrically equivalent circuit of the capacitance element shown in FIG. 37A. As shown in FIG. 37B, capacities Ca, CS1, . . . CSn and Cq are connected in parallel between electrode nodes VA and VB. Owing to word-line-corresponding conductive layer 204f formed over substantially the whole surface of N-well 210, capacitor Ca has a larger capacitance value than the structure employing the capacitance element shown in FIG. 33, and the capacitance value thereof is further increased owing to addition of capacitor Cq formed between conductive layers 205b and 204f corresponding to the bit line and word line, respectively. The interlayer insulating film formed between conductive layer 205b corresponding to the bit line and conductive layer 204f corresponding to the word line has a film thickness which is approximately twenty times larger than that of gate insulating film 203c, in order to prevent capacitive coupling due to a parasitic capacitance between the lines. Therefore, the capacitance value of capacitor Cq is approximately 5% of the capacitance value of capacitor Ca.

Bit-line-corresponding conductive layer 205b may be formed into a composite structure of a metal having a high melting point (a refractory metal) such as tungsten or molybdenum and polycrystalline silicon, or a structure of high melting point metal (refractory metal) silicide. This is also true for conductive layer 204f corresponding to the word line.

[Stabilizing Capacitance Element 3]

Figure 38A:
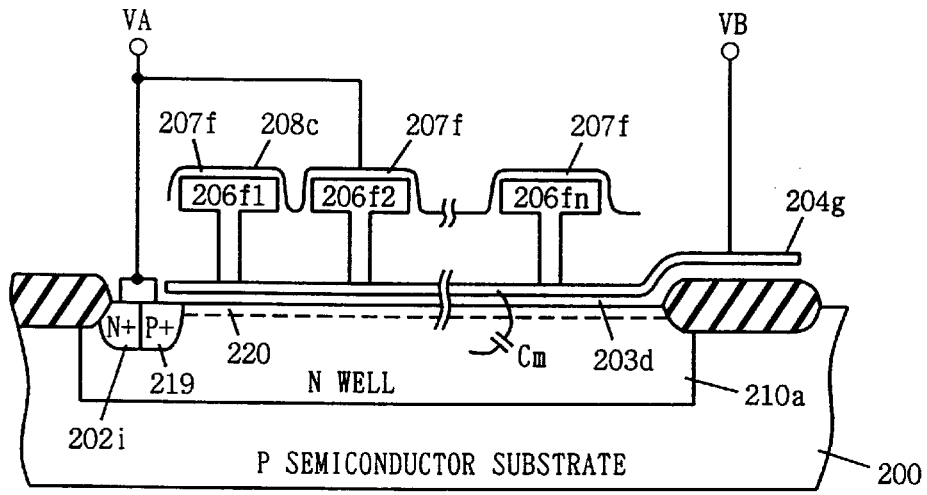
FIG. 38A schematically shows a sectional structure of a third stabilizing capacitance in the embodiment 23 of the invention.

FIG. 38A schematically shows a sectional structure of a third stabilizing capacitance element of the embodiment 23 of the invention. In FIG. 38A, P-type semiconductor substrate 200 has an N-well 210a formed on the surface thereof. The surface impurity concentration of N-well 210a is lower than that of N-well 210 shown in FIGS. 33 and 37. This low surface impurity concentration of N-well 210a facilitates formation of the channel. Conductive layer 204g corresponding to the word line is formed over a substantially entire surface of N-well 210a with a gate insulating film 203d therebetween. First conductive layers 206f1–206fn corresponding to the storage nodes are separatedly formed on conductive layer 204g corresponding to the word line. A second conductive layer 208c corresponding to the cell plate is formed on first conductive layers 206f1–206fn with a capacitor insulating film 207f therebetween. First conductive layers 206f1–206fn are electrically and commonly connected to conductive layer 204g corresponding to the word line.

A heavily doped P-type impurity region 219 and a heavily doped N-type impurity region 202i neighboring thereto are arranged at the surface of a peripheral portion of N-well 210a.

Word-line-corresponding conductive layer 204g is electrically connected to electrode node VB. Impurity regions 202i and 219 as well as second conductive layer 208c are connected to electrode node VA.

As shown in FIG. 38A, the impurity concentration at the surface of N-well 210a is set to a relatively low value for forming a channel region 220. Channel region 220 is electrically connected to heavily doped P-type impurity region 219 to form one electrode of the capacitor. Thus, word-line-corresponding conductive layer 204g, gate insulating film 203d and channel region 220 form an MOS capacitor formed of the p-channel MOS transistor. Each of N-wells 210 in FIGS. 33 and 37 already described is electrically connected to the heavily doped N-type impurity region, has a channel region not formed thereon, and has the surface thereof used as the electrode and has a reduced surface resistance.

In contrast, as shown in FIG. 38A, channel region 220 is formed at N-well 210a by reducing the impurity concentration at its surface, so that a depletion region (not shown) is formed at channel region 220. This depletion region is a region in which an electric charge is not present, and forms a depletion layer capacitance between channel region 220 and well 210a. The MOS capacitor shown in FIG. 38A, therefore, has the capacitance value equal to a sum of the capacitance value provided by gate insulating film 203d and the capacitance value of the depletion layer capacitance, so that the capacitance value of this capacitance element can be increased.

Figure 38B:
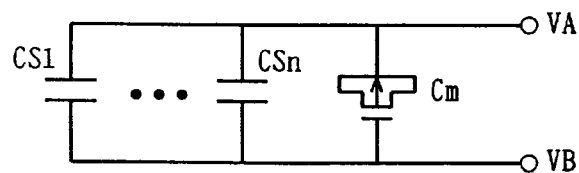
FIG. 38B shows an electrically equivalent circuit of the same.

Thus, as shown in FIG. 38B, unit capacitance elements CS1–CSn and a MOS capacitor Cm are electrically connected in parallel between electrode nodes VA and VB, so that the capacitance element having a good area efficiency can be achieved. Heavily doped P-type impurity region 219 supplies charges to channel region 220 so that channel region 220 serves as one electrode. Heavily doped N-type impurity region 202i applies the voltage on electrode node VA to N-well 210a. In the structure of the p-channel MOS transistor, therefore, the voltage on heavily doped P-type impurity region 219 forming the source/drain region is equal to the voltage on N-well 210a forming the substrate region of the MOS transistor, so that the substrate effect on the threshold voltage of the MOS transistor forming this MOS capacitor is not caused, and a capacitance value can be stably kept at a constant value independently of the voltage applied onto electrode node VA.

The capacitance element shown in FIG. 38A is used as the stabilizing capacitor for stabilizing the internal power supply voltage. In this case, the MOS capacitor has the P-type channel region formed at the surface of N-well 210a. Therefore, electrode node VB is supplied with a voltage lower than the voltage applied onto electrode node VA. Accordingly, the connection manner thereof is the same as those shown in FIGS. 36A and 36B.

According to the embodiment 23 of the invention, as described above, the capacitor having the same structure as the memory cell is used as the stabilizing capacitor. Therefore, a capacitance having a large capacitance value can be achieved with a small occupied area.

The semiconductor integrated circuit may have a structure other than that including the processor and the DRAM in an integrated form as shown in FIG. 38, and more specifically may have a structure in which a DRAM and a logic are integrated on the same semiconductor chip.

Figure 39:
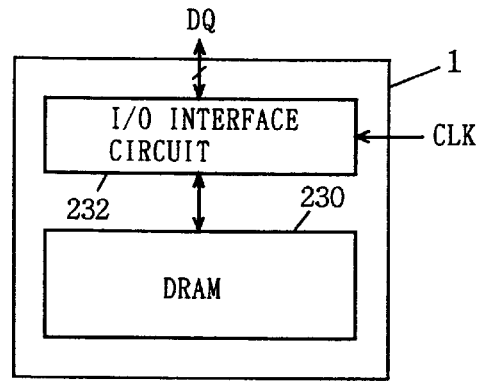
FIG. 39 schematically shows another structure of the semiconductor integrated circuit of the embodiment 23 of the invention.

As shown in FIG. 39, semiconductor integrated circuit 1 may include a DRAM 230 and an I/O interface circuit 232 which performs input/output of data in synchronization with a clock signal CLK such as a system clock. I/O interface circuit 232 transmits data to and from a selected memory cell in DRAM 230. The output portion included in I/O interface circuit 232 has a function of limiting an amplitude. DRAM 230 has a structure similar to that of a conventional DRAM.

Even in the memory shown in FIG. 39 which performs input/output of data in synchronization with the clock, if a DRAM having memory cells of the stacked capacitor type is provided in the semiconductor integrated circuit 1, the stabilizing capacitor can be achieved by using the capacitor of the same structure as the memory cell.

I/O interface circuit 232 shown in FIG. 39 may be a portion of the I/O buffer in a clock synchronous type semiconductor memory device.

[Embodiment 24]
[Connection Manner 1 of Stabilizing Capacitor]

Figure 40:
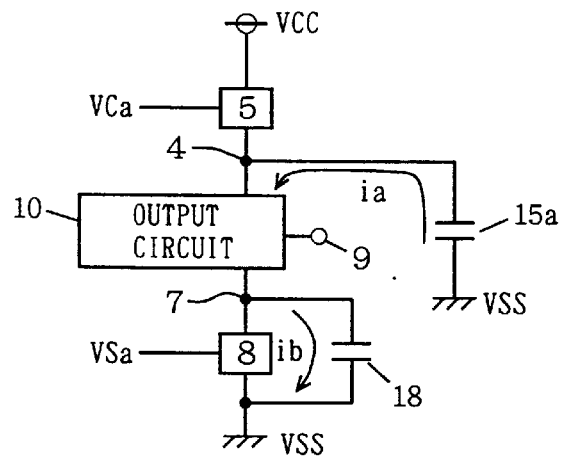
FIGS. 40 to 43 show first to fourth forms of connection of the stabilizing capacitance element in the embodiment 24 of the invention, respectively.

FIG. 40 shows a first connection manner of the stabilizing capacitors for output stabilization. In FIG. 40, a stabilizing capacitor 15a for stabilizing the voltage on first node 4 is connected between first node 4 and second power supply (which will be simply referred to as a "ground node" hereinafter) VSS. A stabilizing capacitance 18 for stabilizing the voltage on second node 7 is connected between second node 7 and ground node VSS.

When a current flows from first node 4 to output node 9 during the operation of output circuit 10, a current is supplied through MOS transistor 5a or 5c in first power supply circuit 5, and a current ia is supplied through stabilizing capacitor 15a. MOS transistor 5a or 5c has a relatively high on-resistance. When the voltage on first node 4 rapidly changes, charges accumulated in stabilizing capacitor 15a are supplied to output circuit 10 through first node 4. When the voltage on first node 4 changes, and particularly changes rapidly, the impedance (1/j·ω·c) of stabilizing capacitor 15a is smaller than the impedance (on-resistance) of MOS transistor 5a or 5c. In this case, stabilizing capacitor 15a supplies its accumulated charges to first node 4, and sinks charges from ground node VSS for supply to first node 4. When the voltage level on first node 4 rapidly changes as a result of operation of output circuit 10, current ia equivalently flows from ground node VSS to first node 4 through stabilizing capacitor 15a.

When output node 9 is discharged during the operation of output circuit 10, the voltage level on second node 7 rapidly changes. In this case, the impedance of stabilizing capacitor 18 is smaller than the on-resistance of MOS transistor 8a or 8c included in second power supply circuit 8, and the current supplied to second node 7 from output node 9 is discharged to ground node VSS through stabilizing capacitor 18. Currents ia and ib flow through stabilizing capacitors 15a and 18a in a transition state in the operation of output circuit 10, respectively, and each of the voltage levels on first and second nodes 4 and 7 in this transition state is determined by the capacitance value of the load capacitance connected to output node 9 and the capacitance value of stabilizing capacitor 15a or 18a. Thus, each of these voltage levels is determined depending on the capacitance division of charges between the load capacitance and stabilizing capacitor 15a or 18a.

In the connection manner of the stabilizing capacitors shown in FIG. 40, each of stabilizing capacitors 15a and 18 is electrically connected at one electrode to ground node VSS. In the layout of the semiconductor integrated circuit, stabilizing capacitors 15a and 18 can be easily arranged even at a region having only the ground line provided adjacently thereto.

[Connection Manner 2]

Figure 41:
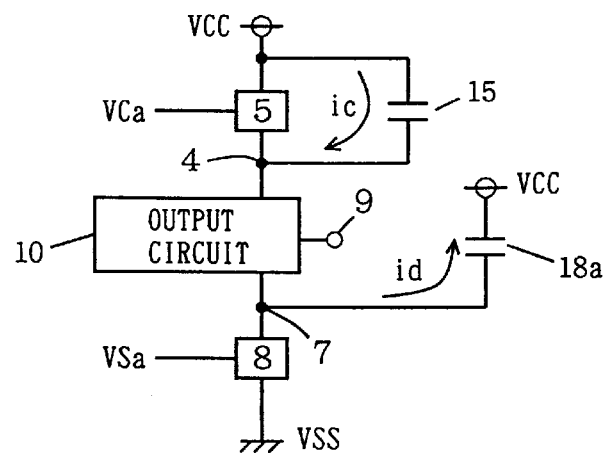

FIG. 41 shows a second connection manner of stabilizing capacitors in the embodiment 24 of the invention. In the structure shown in FIG. 41, stabilizing capacitor 18a for stabilizing the voltage on second node 7 is connected between first power supply (which will be referred to as a "power supply node" hereinafter) VCC and second node 7. Stabilizing capacitor 15 for stabilizing the voltage on first node 4 is connected between power supply node VCC and first node 4, similarly to the arrangement shown in FIG. 1.

When output node 9 is charged to a high level during the operation of output circuit 10, the impedance of stabilizing capacitor 15 is smaller than the impedance (on-resistance) of the current drive MOS transistor, and a current ic is supplied to first node 4 through stabilizing capacitor 15. This flow of current ic through stabilizing capacitor 15 occurs because the charges for compensating for the reduction in charge amount are supplied from power supply node VCC to the electrode connected to first node 4 of stabilizing capacitor 15 when the voltage level on first node 4 rapidly lowers and the charges accumulated in the electrode of stabilizing capacitor 15 decreases. Thus, the quantity Q of charges accumulated in the electrode connected to first node 4 is given by C15·V15 where C15 represents the capacitance value of stabilizing capacitor 15, and V15 represents a voltage applied across the electrodes of stabilizing capacitor 15. When the voltage on first node 4 rapidly lowers, voltage V15 applied to stabilizing capacitor 15 increases, and the quantity Q of charges equivalently increases owing to supply of charges from power supply node VCC.

When output circuit 10 discharges output node 9 to a low level, a current id flows from second node 7 to power supply node VCC through stabilizing capacitor 18a in the low impedance state, because MOS transistor 8a or 8c of second power supply circuit 8 has a large impedance. In this case, charges transmitted to stabilizing capacitor 18a are absorbed by power supply node VCC, so that current id equivalently flows.

In the connection manner shown in FIG. 41, stabilizing capacitors 15 and 18a are coupled to power supply node VCC. Therefore, stabilizing capacitors 15 and 18a can be arranged even in a region which neighbors to the region not containing the ground line. Stabilizing capacitors 15 and 18a can increase the flexibility in layout.

[Connection Manner 3]

Figure 42:
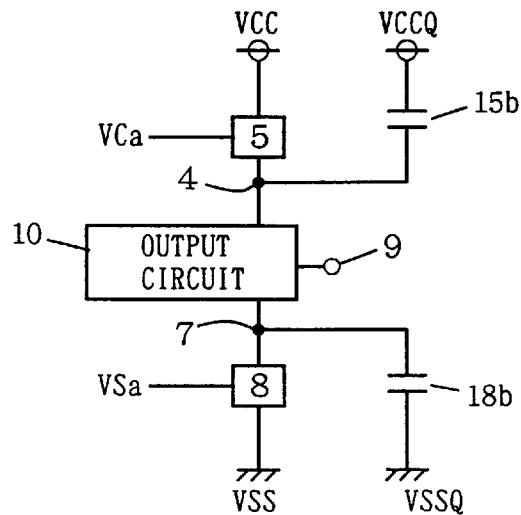

FIG. 42 shows a third connection manner of the stabilizing capacitor in the embodiment 24 of the invention. In this structure shown in FIG. 42, a stabilizing capacitor 15b for stabilizing the voltage on first node 4 is connected between first node 4 and a third power supply (which will be referred to as an "output power supply") VCCQ supplying a power supply voltage VCCQ for signal output. A stabilizing capacitor 18b for stabilizing the voltage level on second node 7 is connected between second node 7 and a fourth power supply (which will be referred to as an "output ground node") VSSQ supplying a ground voltage VSSQ for signal output.

The source of MOS transistor 5 is supplied with a power supply voltage VCC different from that supplied from output power supply node VCCQ. MOS transistor is supplied on it source with ground voltage VSS, different from ground voltage VSSQ supplied onto ground node VSSQ, from the second voltage supply.

Since large currents for signal output are consumed in operation of the output circuit, power supply voltage VCCQ and ground voltage VSSQ for output are supplied from power supplies different from the power supply for the internal circuitry so as to supply the consumed current stably. It is stabilizing capacitors 15b and 18b where large operation currents rapidly flow in operation of output circuit 10. One of the two electrodes of stabilizing capacitor 15b is connected to output power supply node VCCQ, and one of the two electrodes of stabilizing capacitor 18b is connected to output ground node VSSQ, whereby a large consumption current can be stably supplied during the operation of output circuit 10. Power supply voltage VCC and ground voltage VSS are used as operation power supply voltages for other internal circuits. Therefore, the circuitry which sets the voltage levels of internal power supply voltages on first and second nodes 4 and 7 is not required to be located near output power supply node VCCQ and output ground node VSSQ, which reduces restrictions on the layout of the circuits for setting the voltages on first and second nodes 4 and 7, and therefore the flexibility in design is improved.

Stabilizing capacitors 15b and 18b shown in FIG. 42 operate in the same manner as stabilizing capacitor 15 shown in FIG. 41 and stabilizing capacitor 18 shown in FIG. 4 except for connected nodes.

[Connection Manner 4]

Figure 43:
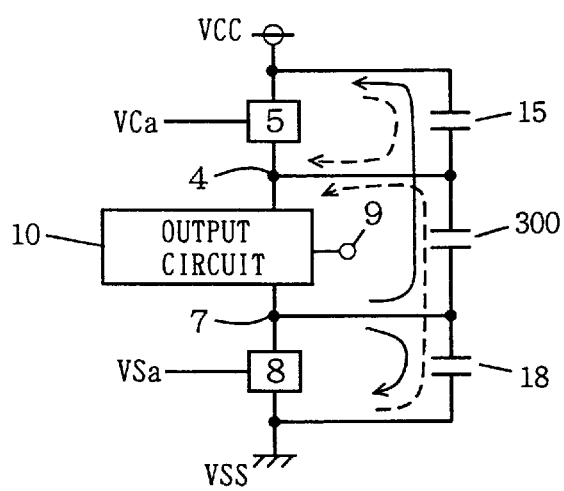

FIG. 43 shows a fourth connection manner of stabilizing capacitors in the embodiment 24 of the invention. In the structure shown in FIG. 43, stabilizing capacitor 15 is connected between power supply node VCC and first node 4, and stabilizing capacitor 18 is connected between second node 7 and ground node VSS. Further, a capacitance element 300 is connected between first and second nodes 4 and 7.

As shown in FIG. 43, connection of the additional capacitor, i.e., capacitance element 300 between first and second nodes 4 and 7 provides the following advantages effect.

When output circuit 10 operates to discharge output node 9, the discharge current supplied to second node 7 through output circuit 10 is discharged through stabilizing capacitor 18 because MOS transistor 8a or 8c in second power supply circuit 8 has a high impedance. At the same time, this discharge current is discharged to power supply node VCC through capacitance elements 300 and 15. Therefore, the current discharged to ground node VSS decreases, so that noises on ground voltage VSS can be reduced. Likewise, in the operation of charging output node 9 by output circuit 10, the current is supplied to first node 4 through stabilizing capacitor 15, because the MOS transistor 5a or 5c in first power supply circuit 5 has a high impedance. Also, a current is supplied from ground node VSS to first node 4 through capacitance elements 18 and 300. This current flow from ground node VSS to first node 4 through capacitance elements 18 and 300 occurs because one of the two electrodes of capacitance element 300 is connected to first node 4, and the current transiently flows through capacitance element 300 in accordance with reduction in quantity of charges accumulated in capacitance element 300. At this time, charges are supplied to capacitance element 300 through capacitance element 18 because MOS transistor 8a or 8c has a high impedance.

Accordingly, the charging and discharging currents can be dispersed to ground node VSS and power supply node VCC, so that the power supply noises (which occur on both power supply voltage VCC and ground voltage VSS) during the operation of output circuit 10 can be reduced. In addition, provision of stabilizing capacitance element 300 described above can increase the capacitance values of the stabilizing capacitors for first and second nodes 4 and 7 without increasing the area. Improvement of the area efficiency of the stabilizing capacitors will now be described below.

Figure 44:
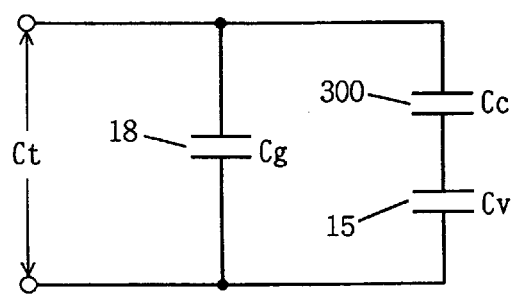
FIG. 44 shows an electrically equivalent circuit of the stabilizing capacitance shown in FIG. 43 viewed from an internal power supply node.

FIG. 44 shows an equivalent circuit of the stabilizing capacitors for the second node. For second node 7, a series connection body of capacitance elements 300 and 15 is connected in parallel with stabilizing capacitor 18. Assuming the stabilizing capacitor 15 has a capacitance value of Cv, stabilizing capacitor 18 has a capacitance value of Cg, capacitance element 300 has a capacitance value of Cc, and all the stabilizing capacitors connected to second node 7 have a total, i.e., combined capacitance of Ct. Combined capacitance value Ct can be expressed by the following representation:

$$Ct = Cg + Cv \cdot Cc/(Cv+Cc) \quad (11)$$

It is assumed that the area is constant, and therefore it is assumed that a sum of capacitance values of capacitance elements 15, 18 and 300 takes a constant value of K.

$$Cv + Cg + Cc = K \quad (12)$$

It is assumed that capacitance values Cv and Cg of capacitors 15 and 18 are equal to each other.

$$Cv = Cg \quad (13)$$

Based on the foregoing relations (12) and (13), the following relation can be obtained:

$$Cc = K - 2 \cdot Cg \quad (14)$$

By substituting the relation (14) into relation (11), the following formula is obtained:

$$Ct = Cg + Cg \cdot (K-2 \cdot Cg)/(Cg + K - 2 \cdot Cg)$$

$$= Cg + Cg1 \cdot (K-2 \cdot Cg) \cdot (K-Cg)^{-1} \quad (15)$$

For obtaining the maximum value of combined capacitance value Ct for capacitance value Cg, the above formula (15) is differentiated with respect to Cg.

$$dCt/dCg = 1 + (K-2 \cdot Cg) \cdot (K-Cg)^{-1} + Cg \cdot (-2) \cdot (K-Cg)^{-1} + Cg \cdot (K-2 \cdot Cg) \cdot (-1) \cdot (-1) \cdot (K-Cg)^{-2}$$

$$= (3 \cdot Cg^2 - 6 \cdot K \cdot Cg + 2 \cdot K^2)/(Cg-K)^2 \quad (16)$$

An extreme can be obtained by making the above formula equal to 0.

$$3 \cdot Cg^2 - 6 \cdot K \cdot Cg + 2 \cdot K^2 = 0 \quad (17)$$

By solving the above formula (17), the following relation is obtained:

$$Cg = (1 \pm \frac{1}{3}^{1/2}) \cdot K \quad (18)$$

Capacitance value Cg is in a range between 0 and K. According to the above relation (18), therefore, the value of capacitance value Cg giving the local maximum value gives the maximum value of combined capacitance Ct. Capacitance value Cg giving this maximum value can be given by the following relation:

$$Cg = (1 - \frac{1}{3}^{1/2}) \cdot K \quad (18a)$$

Substitution of the above relation (18a) into relation (14) provides the following relation:

$$Cc = (-1 + \frac{2}{3}^{1/2}) \cdot K \quad (19)$$

Capacitance value Cc is in a range of $0 \leq Cc \leq K$, and the relation (19) satisfies this condition. A maximum value Ctmax of combined capacitance Ct can be obtained by substituting relations (18a) and (19) into relation (15).

$$Ctmax = (4 - 2 \cdot 3^{1/2}) \cdot K$$

Assuming that the whole capacitance is 1, K is 1. In this case, maximum value Ctmax of combined capacitance Ct can be expressed by the following representation:

$$Ctmax = 4 - 2 \cdot 3^{1/2} = 0.5359$$

Each of the capacitance values of the stabilizing capacitors connected to first and second nodes 4 and 7 can be increased by 0.0359, compared with the cases where capacitance value Cg is 0.5 and capacitance value Cv is 0.5 only and two stabilizing capacitors 15 and 18 are used. Therefore, the whole capacitance value of the stabilizing capacitors can be increased by about 7.2%. Conversely, connection of three capacitance elements 15, 18 and 300 can reduce the area occupied by the stabilizing capacitors.

FIG. 45A shows specific values of capacitance values of these capacitance elements and combined capacitance Ct. FIG. 45B shows a relationship between capacitance value Ct of the combined capacitance and capacitance value Cg of stabilizing capacitor 18. In FIG. 45B, the ordinate gives the capacitance value (unit K=1) of combined capacitance Ct, and the abscissa gives capacitance value Cg of stabilizing capacitor 18. As shown in FIGS. 45A and 45B, the capacitance value of combined capacitance Ct is larger than 0.5 and takes the value of 0.53 when capacitance values Cv and Cg are 0.4, and capacitance value Cc is 0.2. Thus, the capacitance value of combined capacitance Ct increases in accordance with increase in values of capacitance values Cv and Cg from 0.1 to 0.4, and then decreases when capacitance values Cv and Cg exceed the above range.

FIG. 46A shows specific values of each capacitance value at the vicinity of a region DM shown in FIG. 45B, and FIG. 46B shows a relationship between the capacitance value of combined capacitance Ct and capacitance value Cg of stabilizing capacitor 18 in region DM. In FIG. 46B, the ordinate gives the capacitance value of combined capacitance Ct, and the abscissa gives capacitance value Cg of stabilizing capacitance 18. In FIGS. 46A and 46B, it is assumed that K is equal to 1.

As shown in FIG. 46A, when values of capacitance values Vc and Cg increase from 0.39 to 0.4, the capacitance value of combined capacitance Ct also increases. When capacitance values Cv and Cg exceed 0.43, the capacitance value of combined capacitance Ct decreases. As expressed in the foregoing relation, therefore, the capacitance value of the capacitance element for voltage stabilization can take the maximum value when values Cg and Cv are set to 0.4226, and Cc is set to 0.1547. Since a ratio of Cg/Ctmax is equal to 0.4226/0.5359=0.79, 79% of the current discharged from second node 7 flows to capacitance element 18, and 21% thereof flows to capacitance elements 300 and 15. Therefore, noises on ground node VSS can be reduced. This is true for first node 4. More specifically, 71% of the current is supplied from power supply node VCC through stabilizing capacitance 15 to first node 4, and 21% of the current is supplied from ground node VSS through capacitance elements 300 and 18. Thus, noises on power supply voltage VCC can be reduced.

According to the connection manner 4, the capacitance element is additionally connected between the first and second nodes. Therefore, the capacitance values of the stabilizing capacitors connected to the first and second nodes can be increased without increasing an area and, in other words, the area occupied by the stabilizing capacitors can be reduced. Further, the charging current for first node 4 and the discharging current for second node 7 can be dispersed to the power supply node and ground node, so that noises on power supply voltage VCC and ground voltage VSS can be reduced, and therefore it is possible to prevent a malfunction of internal circuitry which may occur due to the power supply noises.

[Connection Manner 5]

Figure 47:
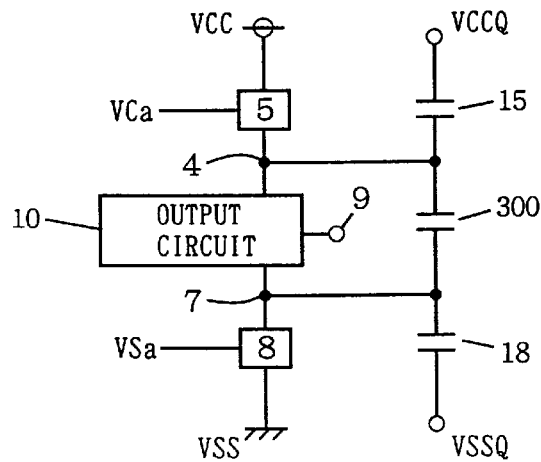
FIGS. 47 to 51 show fifth to ninth forms of connection of the stabilizing capacitance element in the embodiment 24 of the invention, respectively.

FIG. 47 shows a fifth connection manner of stabilizing capacitors in the embodiment 24 of the invention. In the structure shown in FIG. 47, stabilizing capacitor 15 is connected between output power supply node VCCQ and first node 4, stabilizing capacitor 18 is connected between second node 7 and output ground node VSSQ, and stabilizing capacitance element 300 is connected between first and second nodes 4 and 7. Structures other than the above are the same as those shown in FIG. 43.

In the structure shown in FIG. 47, stabilizing capacitors 15 and 18, which consume a large current in operation of output circuit 10, are connected to power supply node VCCQ and ground node VSSQ dedicated to the output. A circuit portion generating the internal power supply voltages on first and second nodes 4 and 7 does not consume a large current compared with capacitors 15, 18 and 300. Therefore, the source of MOS transistor 5a is connected to power supply node VCC, and the source node of MOS transistor 8a is connected to ground node VSS. Power supply voltage VCC on the power supply node and ground voltage VSS on the ground node are utilized also in the internal circuit. Therefore, the charging and discharging currents can be stably supplied from output power supply node VCCQ and output ground node VSSQ during the operation of output circuit 10 without adversely affecting the operation of the internal circuit. Thereby, the circuit generating the internal power supply voltage can be arranged at an appropriate position on the semiconductor chip, resulting in improved flexibility in layout (because it is not needed to arrange the internal power supply voltage generating circuit near the output circuit). The output power supply node VCCQ and output ground node VSSQ are dedicated to the output, and therefore can stably supply the charging and discharging currents to the output node 9.

[Connection Manner 6]

Figure 48:
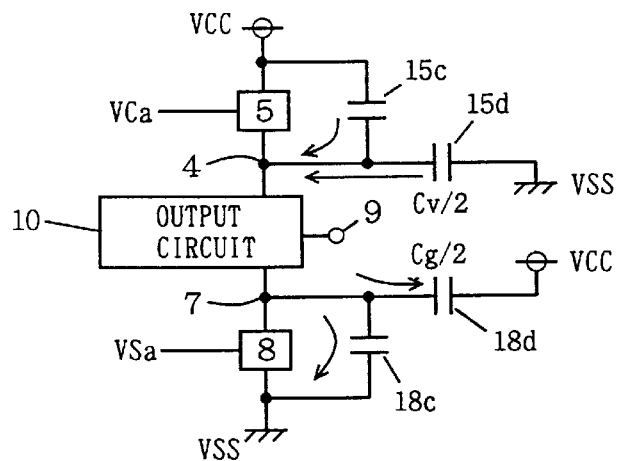

FIG. 48 shows a sixth connection manner of stabilizing capacitors in the embodiment 24 of the invention. In FIG. 48, a stabilizing capacitance element 15b is connected between power supply node VCC and first node 4, and stabilizing capacitance element 15d is connected between first node 4 and ground node VSS. A stabilizing capacitance element 18c is connected between second node 7 and ground node VSS, and a stabilizing capacitance element 18d is connected between second node 7 and power supply node VCC. Stabilizing capacitors 15c and 15d each have a capacitance value set to Cv/2, i.e., a half of capacitance value Cv of stabilizing capacitor 15. Likewise, stabilizing capacitance elements 18c and 18d each have a capacitance value set to Cg/2, i.e., a half of capacitance value Cg of stabilizing capacitor 18. Since stabilizing capacitance elements 15c and 15d are connected in parallel to first output node 4, the combined capacitance value thereof is equal to Cv. Likewise, capacitance elements 18c and 18d are connected in parallel to second output node 7, so that the capacitance value of the capacitors for second output node 7 is equal to Cg.

When output circuit 10 operates to charge output node 9, a current is supplied to first node 4 through stabilizing capacitance elements 15c and 15d. In this case, the charging current is supplied from both power supply node VCC and ground node VSS. Therefore, the magnitude of noises on power supply node VCC is nearly half the magnitude of noises which may occur when only one stabilizing capacitor of capacitance value Cv is employed. Likewise, the lowering degrees of voltage on ground node VSS can be half the magnitude in the case where the capacitor of capacitance value Cv is connected.

When output circuit 10 operates to discharge output node 9, currents flows from second node 7 through stabilizing capacitance elements 18c and 18d. The discharging currents flowing through stabilizing capacitance elements 18c and 18d are supplied into ground node VSS and power supply node VCC, respectively. In this case, therefore, the discharging currents are discharged through stabilizing capacitance elements 18c and 18d having the same capacitance value, so that the discharging currents are divided substantially equally into two sub-currents, and the degrees of voltage rising on ground node VSS and power supply node VCC, i.e., the magnitudes of noises can be made substantially half as compared to the case where the capacitor of capacitance value Cg is employed.

According to the connection manner, as described above, the capacitance element connected between the power supply node and the ground node is provided for each of the first and second nodes. Therefore, the charging and discharging currents can be dispersed to the power supply node VCC and ground node VSS, so that the magnitude of power supply noises which occur during the operation of output circuit 10 can be reduced to a substantially half, and a malfunction of the internal circuit during the operation of output circuit 10 can be prevented.

[Connection Manner 7]

Figure 49:
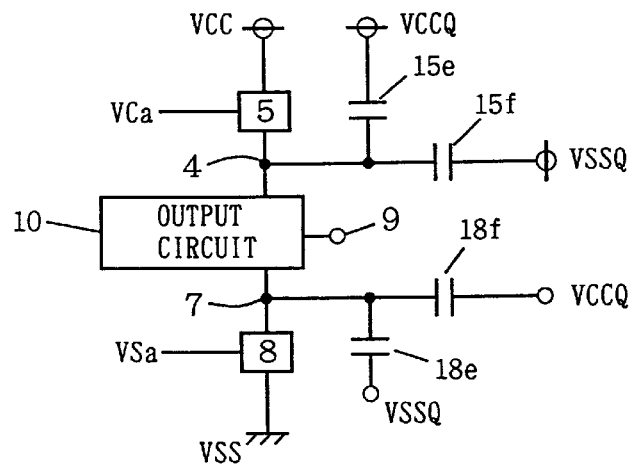

FIG. 49 shows a connection manner 7 of stabilizing capacitors in the embodiment 24 of the invention. According to the connection manner shown in FIG. 49, a stabilizing capacitance element 15e is connected between first node 4 and output power supply node VCCQ dedicated to output, and a stabilizing capacitance element 15f is connected between first node 4 and output ground node VCCQ dedicated to output. A stabilizing capacitance element 18g is connected between second node 7 and output ground node VSSQ dedicated to output, and a stabilizing capacitance element 18f is connected between second node 7 and output power supply node VCCQ. Capacitance elements 15e and 15f each have a capacitance value of Cv/2, and capacitance elements 18e and 18f each have a capacitance value of Cg/2. All of these capacitance elements have the same equal capacitance value.

In the connection manner shown in FIG. 49, when the output node 9 is charged during the operation of output circuit 10, charging currents are supplied to first node 4 from output power supply VCCQ and output ground node VSSQ through stabilizing capacitance elements 15e and 15f, respectively. Upon outputting of the signal, a current does not flow from power supply node VCC supplying the operation power supply voltage for the internal circuit (because MOS transistors 5a and 5c have relatively high impedances). In this case, the charging current is dispersed to output power supply node VCCQ and output ground node VSSQ. Therefore, noises on these nodes VCCQ and VSSQ can be reduced to a half.

Likewise, when output node 9 is discharged during the operation of output circuit 10, the discharging current flowing into second node 7 flows to output ground node VSSQ through stabilizing capacitance element 18e, and also flows to output power supply node VCCQ through stabilizing capacitance element 18f. Therefore, the discharging current flows to output ground node VSSQ and output power supply node VCCQ, and thus is dispersed, so that noises on these nodes are reduced to a half as compared with the case where only one stabilizing capacitance having capacitance value Cg is employed. Noises which may occur on output power supply voltages VCCQ and VSSQ do not affect power supply voltages VCC and VSS, and the internal circuit operates stably.

[Connection Manner 8]

Figure 50:
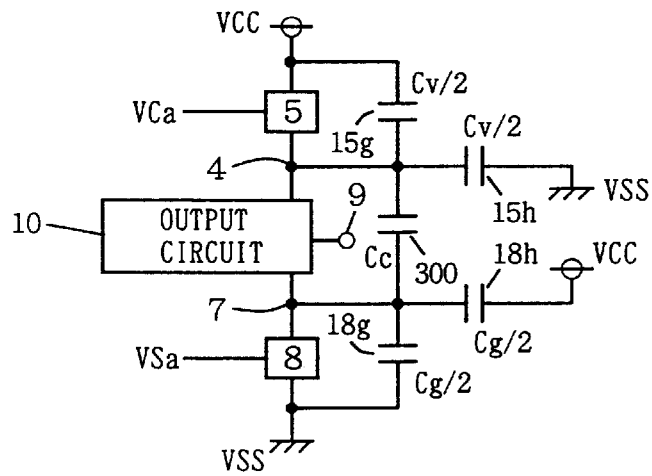

FIG. 50 shows a connection manner 8 of stabilizing capacitors in the embodiment 24 of the invention. In FIG. 50, a stabilizing capacitance element 15g having capacitance value of Cv/2 is connected between first node 4 and power supply node VCC, and a stabilizing capacitance element 15h having a capacitance value of Cv/2 is connected between first node 4 and ground node VSS. A stabilizing capacitance element 18g having a capacitance value of Cg/2 is connected between second node 2 and ground node VSS, and a stabilizing capacitance element 18h having a capacitance value of Cg/2 is connected between second node 7 and power supply node VCC. Further, stabilizing capacitance element 300 having a capacitance value Cc is connected between first and second nodes 4 and 7.

In this connection manner, when output circuit 10 operates to charge output node 9, first node 4 is supplied with a current through stabilizing capacitance elements 15g and 15h, and a charging current is supplied through stabilizing capacitance elements 18g and 18h as well as stabilizing capacitance element 300. The variation in power supply voltage VCC on power supply node VCC caused by the charging current and the variation in ground voltage VSS on ground node VSS caused by the charging current can be reduced to a half, as compared with the case where stabilizing capacitors having capacitance values Cv and Cg are employed.

In the connection manner shown in FIG. 50, the capacitance value of the stabilizing capacitors connected to first and second nodes 4 and 7 can be increased without increasing the occupied area owing to provision of capacitance element 300 between first and second nodes 4 and 7. Thereby, the voltages on first and second nodes 4 and 7 can be stable even when the on-resistances of MOS transistor 5a or 5c and MOS transistor 8a or 8b are relatively large, and therefore a signal having an intended amplitude can be rapidly and stably produced at output node 9.

[Connection Manner 9]

Figure 51:
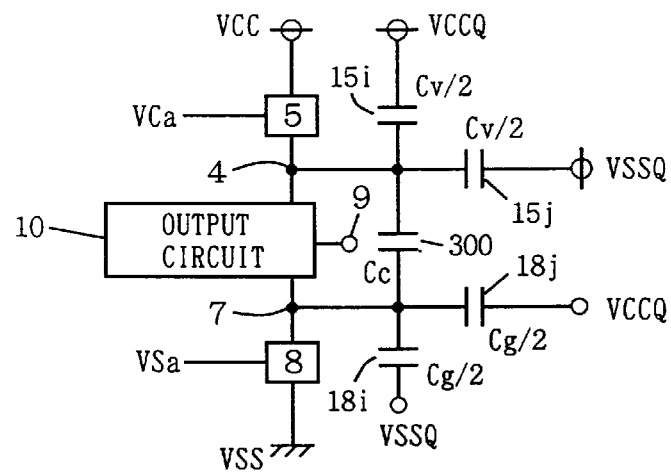

FIG. 51 shows a ninth connection manner of stabilizing capacitors in the embodiment 24 of the invention. In the structure shown in FIG. 51, the stabilizing capacitors are connected to output power supply node VCCQ and output ground node VSSQ. More specifically, stabilizing capacitance element 15i is connected between first node 4 and output power supply node VCCQ, and stabilizing capacitance element 15j is connected between first node 4 and output ground node VSSQ. A stabilizing capacitance element 18i is connected between second node 7 and output ground node VSSQ, and a stabilizing capacitance element 18j is connected between second node 7 and output power supply node VCCQ. A stabilizing capacitance element 300 is connected between first and second nodes 4 and 7. Structures other than the above are the same as those shown in FIG. 50, and the corresponding portions bear the same reference numerals.

In the structure shown in FIG. 51, output power supply node VCCQ and output ground node VSSQ are connected to the stabilizing capacitance elements, and the currents for charging and discharging output node 9 during the operation of output circuit 10 flow to output power supply node VCCQ and output ground node VSSQ, so that voltage variation on first and second nodes 4 and 7 during the operation of output circuit 10 is suppressed, and an output signal having an intended amplitude can be stably produced on output node 9. The circuit portion generating the internal power supply voltages on first and second nodes 4 and 7 utilizes power supply voltage VCC and ground voltage VSS, and therefore operates stably without an influence by noises during output of the signal. Also, the internal circuit utilizes voltages VCC and VSS, and therefore the circuit portion generating the internal power supply voltage can be arranged at an appropriate position, which improves the flexibility in layout.

By utilizing the stabilizing capacitors of the embodiment 24, variation in power supply voltages VCC and VSS can be controlled, and reference voltage Vref which is internally generated can be stably held at a constant voltage level.

[Embodiment 25]

Figure 52:
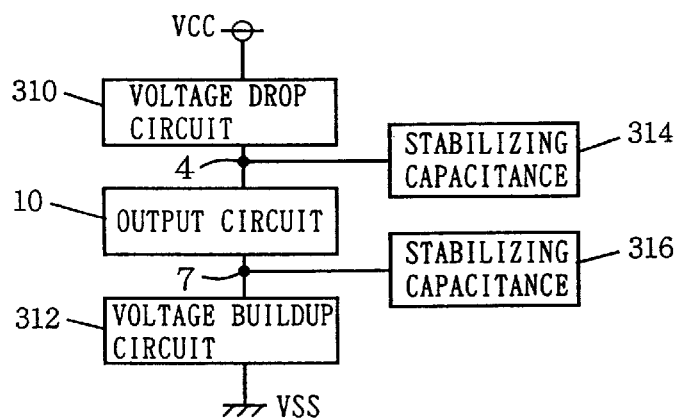
FIG. 52 schematically shows a structure of an output portion of a semiconductor integrated circuit incorporating the embodiment 24 of the invention.

FIG. 52 schematically shows a structure of a semiconductor memory device according to an Embodiment 25 of the invention. In FIG. 52, the semiconductor memory device includes a voltage down-converting circuit 310 which down-converts power supply voltage VCC to a predetermined level for transmission onto first node 4, a voltage up-converting circuit 312 which produces a voltage at a higher level than ground voltage VSS and transmits the same onto second node 7, a stabilizing capacitor 314 which stabilizes the voltage level on first node 4, and a stabilizing capacitor 316 which stabilizes the voltage on second node 7.

Output circuit 10 operates using the voltages on first and second nodes 4 and 7 as the operation power supply voltages.

Voltage down-converting circuit 310 and voltage up-converting circuit 312 produces the power supply voltages at predetermined levels onto first and second nodes 4 and 7, respectively. Voltage down-converting circuit 310 and voltage up-converting circuit 312 are only required to have functions of producing the voltages at the predetermined levels and may not receive the reference voltages on their inputs having high input impedances, respectively.

Stabilizing capacitors 314 and 316 have structures for stabilizing the voltages on first and second nodes 4 and 7, and may have any one of the connection manner in FIG. 1 and the first through ninth connection manner in the embodiment 24.

The embodiments as described above can be employed in a system in which a transmission path is provided with a terminating resistance. A driving capability of a transistor at an output stage can be increased independently of the value of this terminating resistance, so that the system capable of fast operation can be achieved.

[Embodiment 26]

Figure 53:
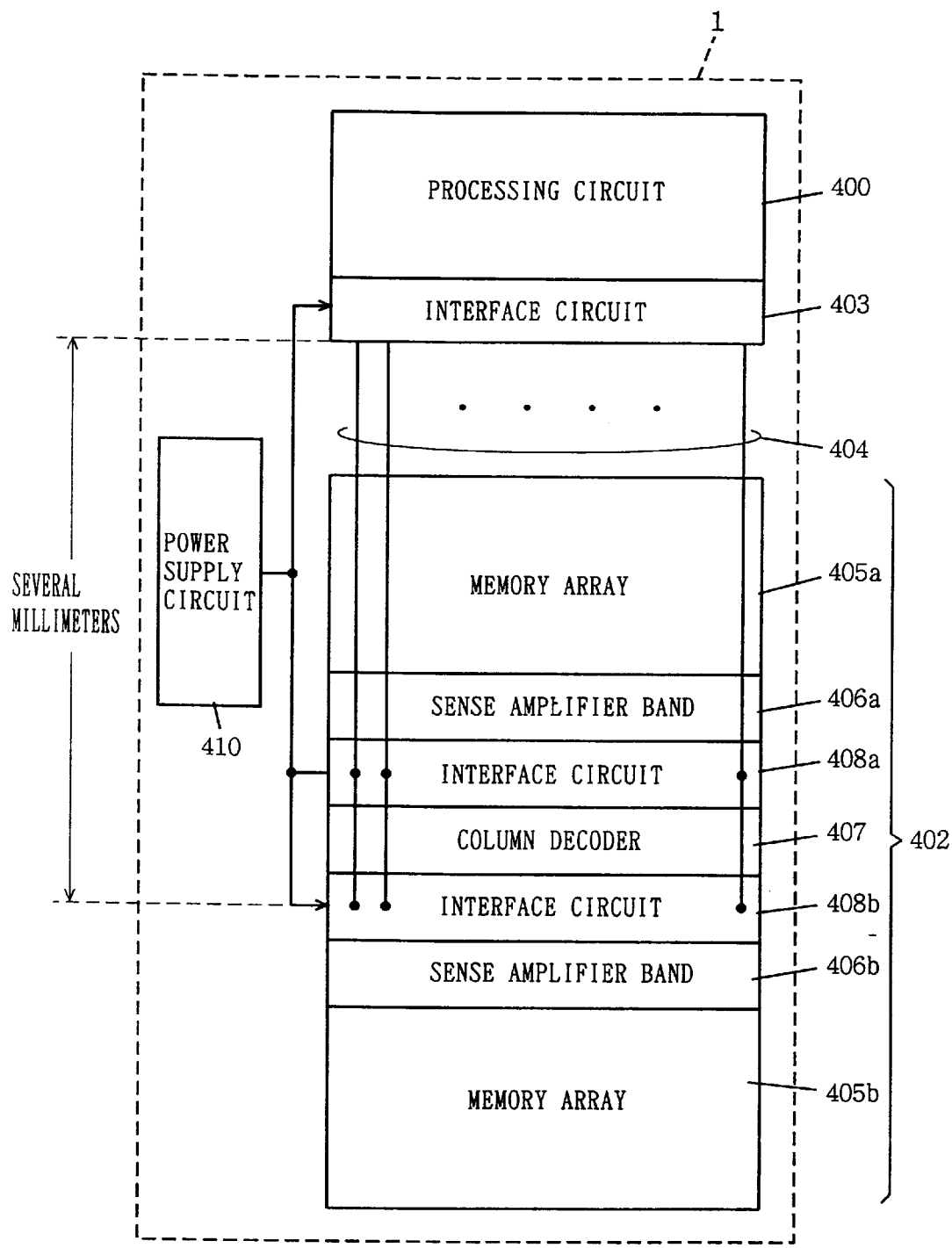
FIG. 53 schematically shows a whole structure of a semiconductor integrated circuit according to an embodiment 26 of the invention.

FIG. 53 schematically shows a whole structure of a semiconductor integrated circuit according to an embodiment 26 of the invention. In FIG. 53, a semiconductor integrated circuit 1 includes a processing circuit 400 formed of a logic or a processor and performing a predetermined processing, and a memory 402 storing data for processing circuit 400. Memory 402 is, for example, a dynamic random access memory (DRAM). Processing circuit 400 is coupled to an internal data bus 404 through an interface circuit 403. Interface circuit 403 performs input/output of signals of small amplitudes. Internal data bus 404 has a bit width within a range, e.g., from 128 bits to 1 Kbits.

Memory 402 includes memory arrays 405a and 405b each having a plurality of memory cells arranged in rows and columns, a sense amplifier band 406a including a plurality of sense amplifiers, which are provided corresponding to the columns (bit line pairs) of memory array 405a, respectively, and perform sensing, amplifying and latching of the memory cell data on the corresponding columns when active, a sense amplifier band 406b including a plurality of sense amplifiers, which are provided corresponding to the columns (bit line pairs) of memory array 405b, respectively, and perform sensing, amplifying and latching of the memory cell data on the corresponding columns when active, a column decoder 407 which selects columns in one of memory cell arrays 405a and 405b in accordance with an address signal (not shown), and interface circuits 408a and 408b for transmitting data to and from the memory cells on the columns selected by column decoder 407. Interface circuit 408a transmits data to and from the selected memory cells in memory cell array 405a. Interface circuit 408b transmits data to and from the selected memory cells in memory cell array 405b. These interface circuits 408a and 408b are coupled commonly to internal data bus 404.

Interface circuits 408a and 408b are connected commonly to the internal data bus 404 as described above, because only one of memory arrays 405a and 405b transmits data to and from processing circuit 400 in a normal operation. Therefore, memory arrays 405a and 405b may be configured into a bank structure.

Interface circuits 408a and 408b transmit signals of small amplitudes, similarly to interface circuit 403 provided for processing circuit 400. In FIG. 53, interface circuits 408a and 408b are shown transmitting signals to and from the sense amplifiers on the columns selected by column decoder 407.

Internal data bus 404 extends in the column direction over memory array 405a. Owing to this, a special region dedicated to interconnection lines is not required so that a chip area can be reduced. Interface circuits 408a and 408b are arranged in the region between memory arrays 405a and 405b. This arrangement substantially equalizes the lengths of internal data bus 404 for memory arrays 405a and 405b, to equalize the times required for data transfer (write/read) to and from the memory arrays 4-5a and 405b (and signal propagation delay times). Therefore, each bus line in internal data bus 404 is, e.g., several millimeters in length. Accordingly, the interconnection length of internal data bus 404 is relatively long so that a relatively large parasitic resistance and a relatively large parasitic capacitance are present even if a metal interconnection line such as a third level aluminum interconnection line of a low resistance is used for the bus 404. Fast data transfer is achieved by using interface circuits 403, 408a and 408b to transfer signals of small amplitudes. Further, owing to transfer of signals of small amplitudes, the signal amplitudes are reduced and charging/discharging currents of signal lines are reduced, whereby the current consumption is reduced and noises are suppressed upon driving of the internal data bus. For allowing the transfer of signals of small amplitudes with interface circuits 403, 408a and 408b, a power supply circuit 410 is provided for restricting output signal amplitudes of the circuits transmitting data to and from internal data bus 404.

Figure 54:
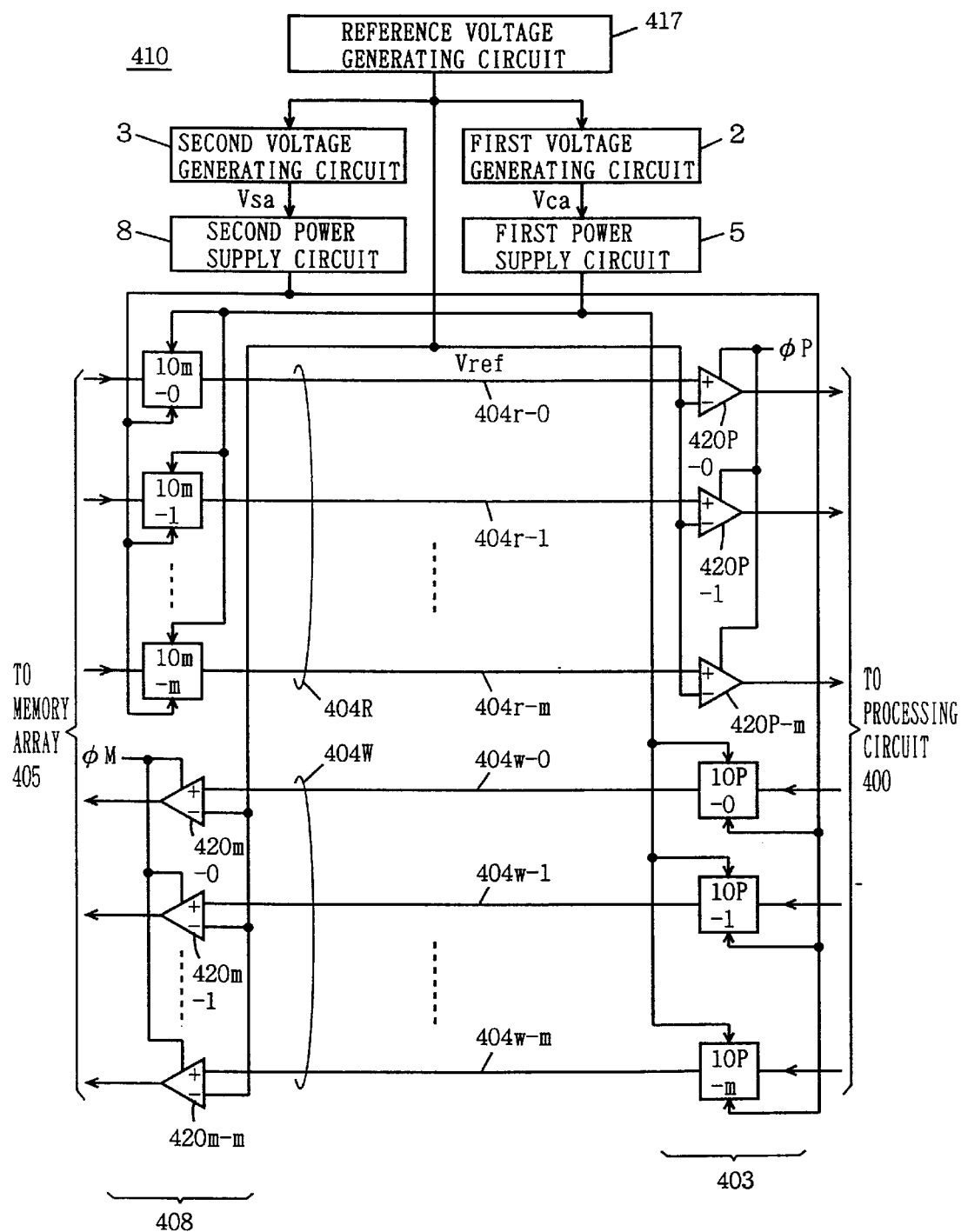
FIG. 54 shows more specifically a structure of a main portion of the semiconductor integrated circuit shown in FIG. 53.

FIG. 54 schematically shows structures of power supply circuit 401 as well as interface circuits 403, 408a and 408b shown in FIG. 53. Since interface circuits 408a and 408b for memory arrays 405a and 405b have the same structures, FIG. 54 shows interface circuit 408 for memory array 405 as a representative example.

Internal data bus 404 includes a read data bus 404R for transmitting data read from memory 402, and a write data bus 404W for transferring data to be written into memory 402. By providing read and write data buses 404R and 404W separatedly from each other, it is possible to prevent data collision upon a mode switching between the data write mode and the data read mode.

Read data bus 404R includes read data bus lines 404r-0–404r-m. Each of data bus lines 404r-0–404r-m transmits data read from a memory cell. Write data bus 404W includes write data bus lines 404w-0–404w-m. Each of write data bus lines 404w-0–404w-m transfers write data to a memory cell. The bus lines have a single line structure for reducing an area occupied by the bus.

Internal power supply circuit 410 includes a reference voltage generating circuit 417 generating a reference voltage Vref at a predetermined voltage level, a first voltage generating circuit 2 generating a first internal voltage VCa based on reference voltage Vref supplied from reference voltage generating circuit 417, a second voltage generating circuit 3 generating a second internal voltage VSa based on reference voltage Vref supplied from reference voltage generating circuit 417, a first power supply circuit 5 producing a first power supply voltage in accordance with first internal voltage VCa supplied from first voltage generating circuit 2, and second power supply circuit 8 producing a second power supply voltage in accordance with second internal voltage VSa supplied from second voltage generating circuit 3.

First and second voltage generating circuits 2 and 3 as well as first and second power supply circuits 5 and 8 have the same structures as those shown in FIGS. 1 through 24. Reference voltage generating circuit 417 produces-reference voltage Vref at half a voltage level of the power supply voltage generated by first and second power supply circuits 5 and 8 (see FIG. 3).

Interface circuit 403 provided for processing circuit 400 includes receiver circuits 420p-0–420p-m, which are provided corresponding to read data bus lines 404r-0–404r-m, respectively, and are activated in response to activation of an activating signal $\phi$P to compare signals on corresponding read data bus lines 404r-0–404r-m with reference voltage Vref generated by reference voltage generating circuit 417, and drivers (output circuits) 10p-0–10p-m, which are provided corresponding to write data bus lines 404w-0–404w-m, respectively, and transmit write data onto corresponding write data bus lines 404w-0–404w-m using the power supply voltages supplied from first and second power supply circuits 5 and 8 as operation power supply voltages thereof. These drivers (output circuits) have the same structures as that shown in FIG. 1.

The interface circuit 408 provided corresponding to memory array 405 includes drivers (output circuits), which are provided corresponding to read data bus lines 404r-0–404r-m, respectively, and transmit data read from the selected memory cells in memory array 405 onto corresponding read data bus lines 404r-0–404r-m using the power supply voltages supplied from first and second power supply circuits 5 and 8 as the operation power supply voltages thereof, and receiver circuits 420m-0–420m-m, which are provided corresponding to write data bus lines 404w-0–404w-m, respectively, and are activated in response to activation of an activating signal $\phi$M to compare signals on write data bus lines 404w-0–404w-m with reference voltage Vref generated by reference voltage generating circuit 417.

Each of receiver circuits 420p-0–420p-m and 420m-0–420m-m is formed of a differential amplifier circuit, and compares the applied signal with reference voltage Vref. Reference voltage Vref is nearly equal to half the sum of the voltage generated by first and second power supply circuits. Each of input signals of receiver circuits 420p-0–420p-m and 420m-0–420m-m is varied with reference voltage Vref its center. Therefore, even if the input signal applied thereto has a small amplitude, the logical level can be precisely determined for producing data sent to processing circuit 400 or memory array 405.

Reference voltage Vref supplied from reference voltage generating circuit 417 is utilized as a reference for comparison of the logical level of input signals applied to receiver circuits 420p-0–420p-m and 420m-0–420m-m, and is the same as the reference voltage which provides a base of the power supply voltage applied to drivers (output circuits) 10m-0–10m-m and 10p-0–10p-m. Thereby, even when the reference voltage Vref supplied from reference voltage generating circuit 417 varies, the variation of reference voltage Vref is canceled in the drivers and receiver circuits so that precise data transfer can be implemented.

For example, the amplitude of input signal is set to 0.5 V (having voltage differences of ±0.25 V with respect to the reference voltage) with the operation margins of receiver circuits 420p-0–420p-m and 420m-0–420m-m accounted for. When all the output signals of drivers (output circuits) 10m-0–10m-m and 10p-0–10p-m change from L-level to H-level, first power supply circuit 5 charging each bus line in bus 404R or 404W, in which case a maximum charge current flows. Even in this case, the power supply current on the data bus can be reduced to ⅕=0.5/2.5 times, compared with the case where the input signal amplitude is 2.5 V. It is now assumed that the data bus lines are 1000 in number, the bus line has a parasitic capacitance of 1 pF, the power supply voltage is 2.5 V and the operation frequency is 100 MHz. In this case, a power supply current I which flows during the bus operation (e.g., data reading) can be expressed by the following expression:

$$I = f \cdot C \cdot Vcc$$
$$= 100 \text{ MHz} \cdot (1\text{pF} \times 1000) \times 2.5 \text{ V}$$
$$= 250 \text{ (mA)}$$

Therefore, in the structure shown in FIG. 54, the signal amplitude is 0.5 V, and a current of only 50 mA flows so that the current consumption is significantly reduced, and variations in power supply voltage can be suppressed. Current consumption Pd which is given by I·V is likewise reduced to ⅕ times (⅕ of 625 mW in the foregoing conditions), and heat generation can be suppressed. Accordingly, the current flowing through the power supply line is reduced to ⅕ times, and therefore the magnitude of noises can be substantially reduced to ⅕ times, which ensures a stable operation.

Meanwhile, by utilizing a dynamic latch circuit structure, the current consumption of receiver circuits 420p-0–420p-m and 420m-0–420m-m can be substantially reduced to zero so that the current consumed during the operation of receiver circuits 420p-0–420p-m and 420m-0–420m-m does not cause a problem related to increase in power and noises.

Figure 55:
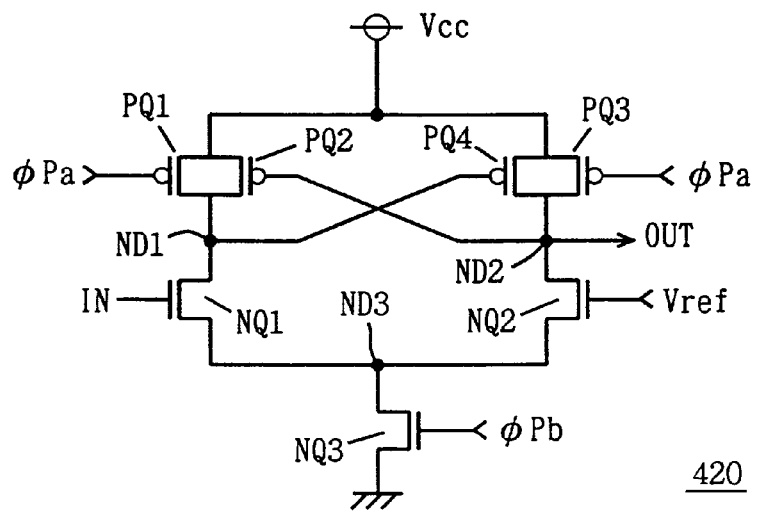
FIG. 55 shows a structure of a receiver circuit shown in FIG. 54.

FIG. 55 shows an example of the structures of receiver circuits 420p-0–420p-m and 420m-0–420m-m shown in FIG. 54. Since receiver circuits 420p-0–420p-m and 420m-0–420m-m have the same common structure, FIG. 55 shows only one of the receiver circuits and the one is indicated by a reference number 420.

In FIG. 55, receiver circuit 420 includes a p-channel MOS transistor PQ1 connected between the power supply node and a node ND1 and turned on in response to a precharge instructing signal $\phi$pa, a p-channel MOS transistor PQ2 connected between the power supply node and node ND1 and having a gate connected to a node ND2, a p-channel MOS transistor PQ3 connected between the power supply node and node ND2 and receiving precharge instructing signal $\phi$pa on its gate, a p-channel MOS transistor PQ4 connected between the power supply node and node ND2 and having a gate connected to node ND1, an n-channel MOS transistor NQ1 connected between nodes ND1 and ND3 and receiving an input data signal IN on its gate, an n-channel MOS transistor NQ2 connected between nodes ND2 and ND3 and receiving reference voltage Vref on its gate, and an n-channel MOS transistor NQ3 connected between node ND3 and the ground node and receiving an activating signal $\phi$pb on its gate.

Figure 56:
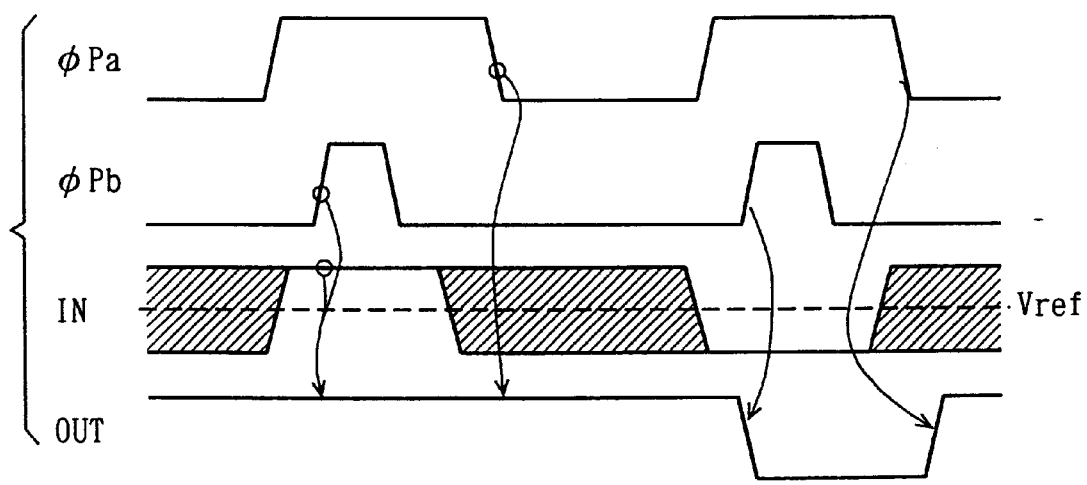
FIG. 56 is a signal waveform diagram representing an operation of the receiver circuit shown in FIG. 55.

An operation of receiver circuit 420 shown in FIG. 55 will be described below with reference to a signal waveform diagram of FIG. 56.

When precharge instructing signal Spa is at L-level, p-channel MOS transistors PQ1 and PQ3 are on, and nodes ND1 and ND2 are coupled to the power supply node so that output signal OUT from node ND2 attains H-level at the level of power supply voltage Vcc. In this state, activating signal φpb is at L-level, and n-channel MOS transistor NQ3 is off.

When precharge instructing signal Spa attains H-level, p-channel MOS transistors PQ1 and PQ3 are off so that the latched states on nodes ND1 and ND2 are released. Even when the voltage level of input data signal IN changes, activating signal φpb is inactive at L-level, and n-channel MOS transistor NQ3 is off so that output signal OUT maintains H-level. When activating signal φpb attains H-level, n-channel MOS transistor NQ3 is turned on to form a current path from nodes ND1 and ND2 to the ground node. When input data signal IN is at a voltage level higher than reference voltage Vref, the voltage level on node ND1 lowers, and the conductance of p-channel MOS transistor PQ4 exceeds the conductance of p-channel MOS transistor PQ2 so that the voltage level on node ND1 lowers. Node ND2 maintains the power supply voltage Vcc level, and p-channel MOS transistor PQ2 maintains the off state. Thereby, the voltage on node ND1 rapidly lowers to the ground voltage level, and is latched by MOS transistors PQ2 and PQ4. In this case, therefore, output signal OUT from node ND2 maintains H-level.

When activating signal φpb attains H-level of the active state, and input data signal IN is at a level lower than reference voltage Vref, p-channel MOS transistor PQ4 maintains the off state, and output signal OUT from node ND2 lowers to L-level. Node ND1 is maintained at power supply voltage Vcc level.

In the structure of receiver circuit 420 shown in FIG. 55, when activating signal φpb is activated, one of nodes ND1 and ND2 is discharged and the current is consumed. However, when the voltage level on node ND1 is discharged to the ground voltage level, MOS transistors PQ2 and PQ4 hold the voltage levels on nodes ND1 and ND2, respectively, and the current does not flow. Therefore, the current consumption can be sufficiently reduced in receiver circuit 420 of this dynamic latch type.

In particular, the current consumption can be extremely reduced by making the current driving capabilities of MOS transistors PQ1–PQ3 much lower than those of n-channel MOS transistors NQ1–NQ3. Thereby, the current consumption of receiver circuit 420 during operation thereof can be reduced to a substantially negligible value. Particularly, the average DC current can be reduced substantially to zero, and the current consumption during operation of receiver circuits 420p-0–420p-m and 420m-0–420m-m can be substantially ignorable.

[Modification 1]

Figure 57:
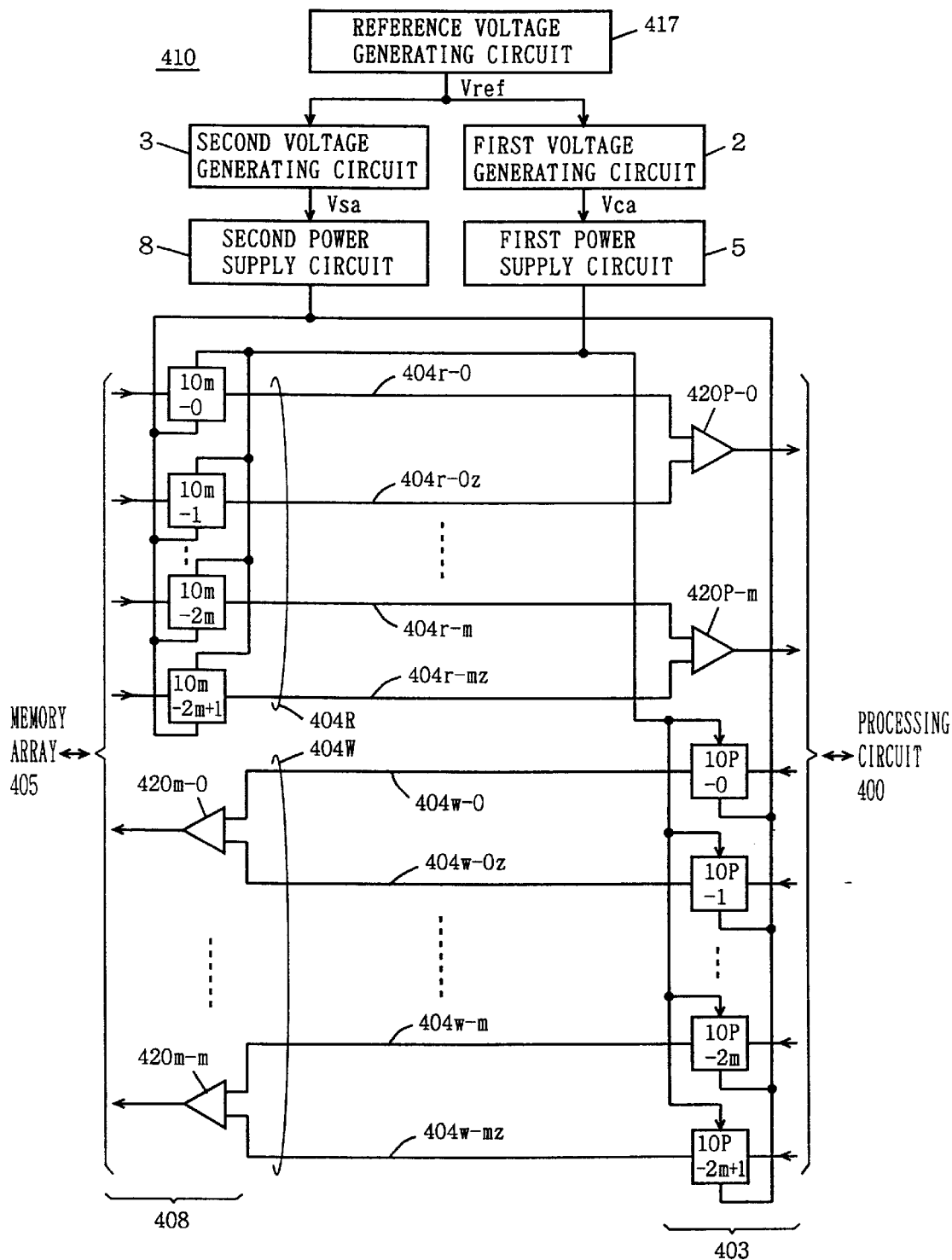
FIG. 57 shows a structure of a modification 1 of the embodiment 26 of the invention.

FIG. 57 schematically shows a structure of a modification 1 of the embodiment 26 of the invention. A semiconductor integrated circuit shown in FIG. 57 differs from the semiconductor integrated circuit shown in FIG. 54 in the following points.

In the semiconductor integrated circuit shown in FIG. 57, each of read and write data buses 404R and 404W includes bus line pairs transmitting complementary data signals. More specifically, read data bus 404R includes read data bus line pairs 404r-0 and 404r-0z–404r-m and 404r-mz. Write data bus 404W includes bus line pairs 404w-0 and 404w-0z–404w-m and 404w-mz. Correspondingly to these complementary signal bus line pairs, receiver circuits 420p-0–420p-m and 420m-0–420m-m each are formed of differential amplifier circuits, and reference voltage Vref generated by reference voltage generating circuit 417 is not applied to receiver circuits 420p-0–420p-m and 420m-0–420m-m.

In the interface circuit 408 for the memory array, drivers (output circuits) 10m-0–10m-2m+1 are provided corresponding to the read data bus lines, respectively. In interface circuit 403 for the processing circuit, drivers (output circuits) 10p-0–10p-2m+1 are provided corresponding to the write data bus lines, respectively. These drivers 10m-0–10m-2m+1 and 10p-0–10p-2m+1 are supplied with the power source voltages from first and second power supply circuits 5 and 8.

In the structure shown in FIG. 57, the bus lines in each of read and write data buses 404R and 404W increase in number, but the signal amplitude on the bus line can be reduced by transmitting complementary data signals through each respective bus line pair. For example, if the input voltage difference in each of receiver circuits 420p-0–420p-m and 420m-0–420m-m is set to a value equal to that in the case where the data signal is transmitted through a single bus line as shown in FIG. 54, the signal amplitude on the bus line can be halved (|Vref−Vin|=|Vin−zVin|, with Vin representing the data signal voltage transmitted to a bus line).

Therefore, the charging/discharging currents of each bus line are reduced to ½ times, and can be equal to those in the bus structure shown in FIG. 54 even if the bus lines are doubled in number.

Since the amplitude on each bus line can be set to ½ times compared with the structure shown in FIG. 57, each of the charging and discharging currents of the bus lines is reduced to ½ times, and the noises on the power supply line and ground line can be further reduced to ½ times.

Figure 58:
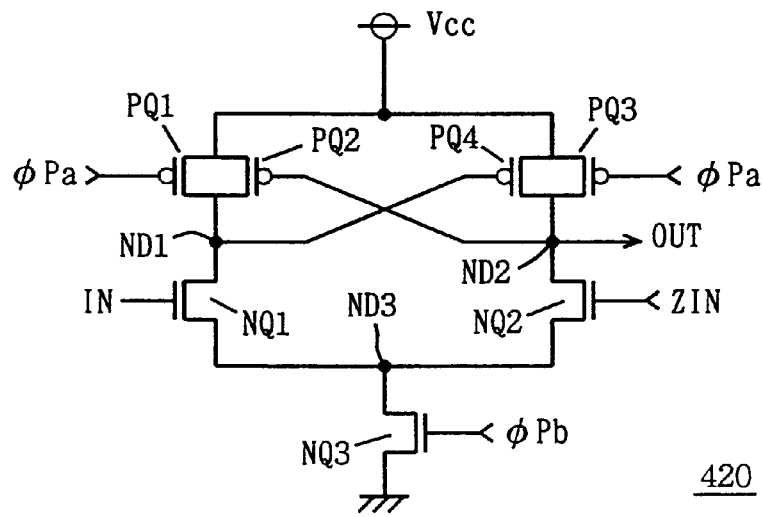
FIG. 58 shows a structure of a receiver circuit shown in FIG. 57.

FIG. 58 shows a structure of one of receiver circuits 420p-0–420p-m and 420m-0–420m-m shown in FIG. 57. Receiver circuit 420 shown in FIG. 58 has the same structure as the receiver circuit shown in FIG. 55 except for that it receives a complementary input signal ZIN instead of reference voltage Vref.

Figure 59:
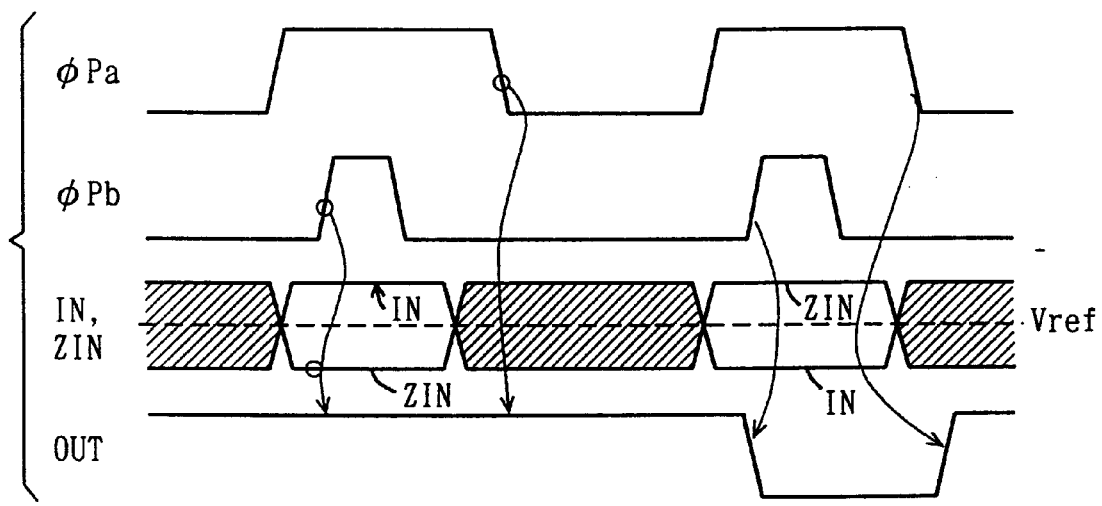
FIG. 59 is a signal waveform diagram representing an operation of the receiver circuit shown in FIG. 58.

Therefore, as is apparent from the operation waveform shown in FIG. 59, output signal OUT at H-level is produced when input data signal IN is higher than complemental input data signal ZIN, and output signal OUT at L-level is produced when input signal IN is lower than complemental input data signal ZIN. In this case, each of input data signals IN and ZIN varies with reference voltage Vref its center value. Therefore, the data can be stably amplified even if the voltage difference of |IN−ZIN| between those complementary signals is reduced.

In the structure shown in FIG. 58, the current consumption is sufficiently small, similarly to the structure shown in FIG. 55, and the average DC current takes a substantially negligible value.

[Modification 2]

Figure 60:
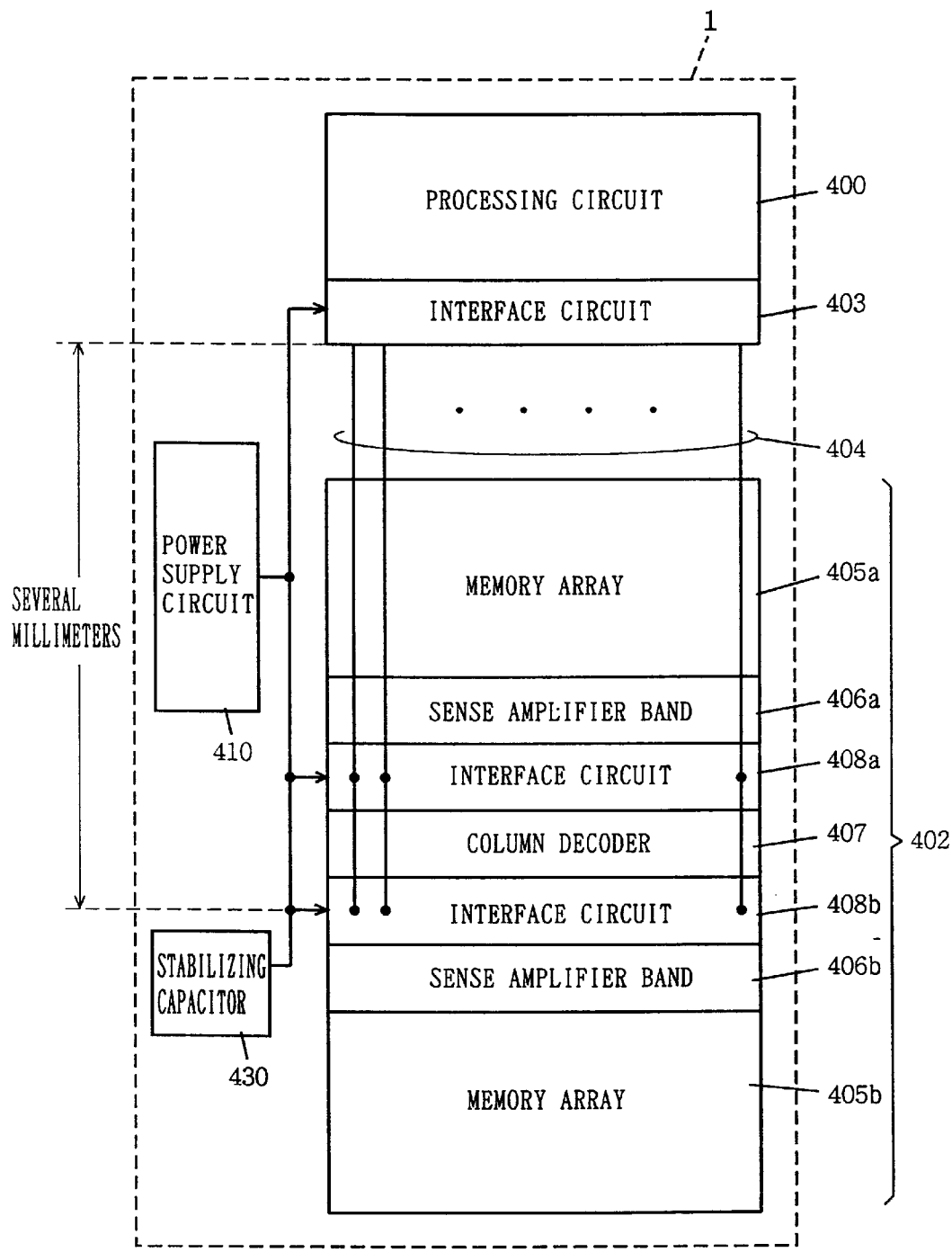
FIG. 60 schematically shows a structure of a modification 2 of the embodiment 26 of the invention.

FIG. 60 schematically shows a structure of a modification 2 of the embodiment 26 of the invention. In the semiconductor integrated circuit shown in FIG. 60, a stabilizing capacitor 430 is arranged at an output node of power supply circuit 410. This stabilizing capacitor 430 has the same structure as one of the stabilizing capacitors shown in FIGS. 6 and 33 through 51.

Since stabilizing capacitor 430 is arranged at the output node of power supply circuit 410, the output voltage of power supply circuit 410 can be stabilized, and fast charging and discharging can be performed in each of interface circuits 403, 408a and 408b.

Figure 61:
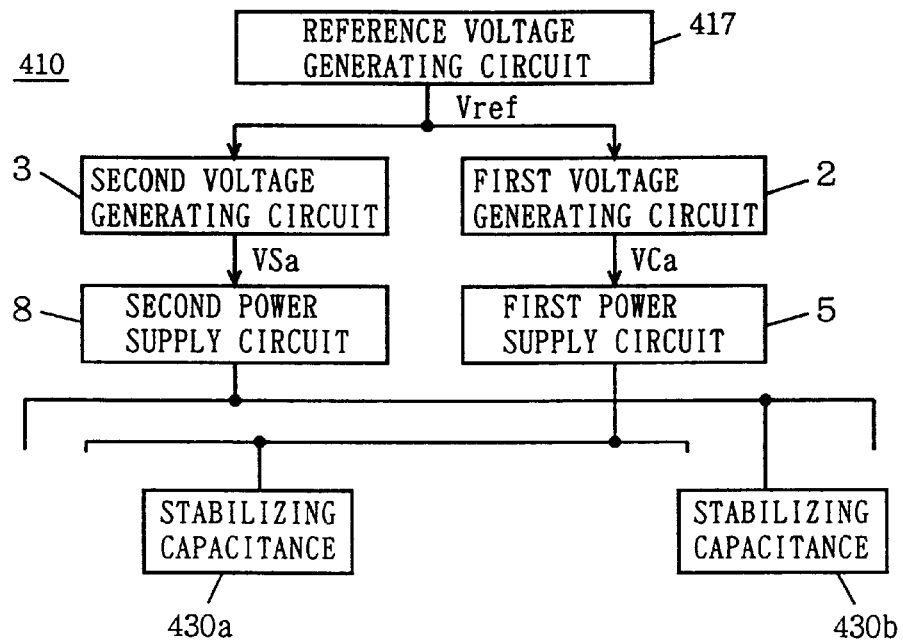
FIG. 61 schematically shows a structure of a stabilizing capacitor shown in FIG. 60.

FIG. 61 shows an example of a structure of stabilizing capacitor 430 shown in FIG. 60. In the structure shown in FIG. 61, stabilizing capacitor 430 includes a stabilizing capacitance 430a arranged at the output node of first power supply circuit 5, and a stabilizing capacitance 430b arranged at the output node of second power supply circuit 8. The other electrode node of each of stabilizing capacitances 430a and 430b is connected in any one of the manners employed in the structures shown in FIG. 32 et seq. The output nodes of first and second power supply circuits 5 and 8 are connected to the power supply nodes of many output circuits. Owing to provision of these stabilizing capacitances 430a and 430b, the power supply voltage can be supplied more stably to the output circuits (drivers), and the bus lines can be driven more rapidly.

Figure 62:
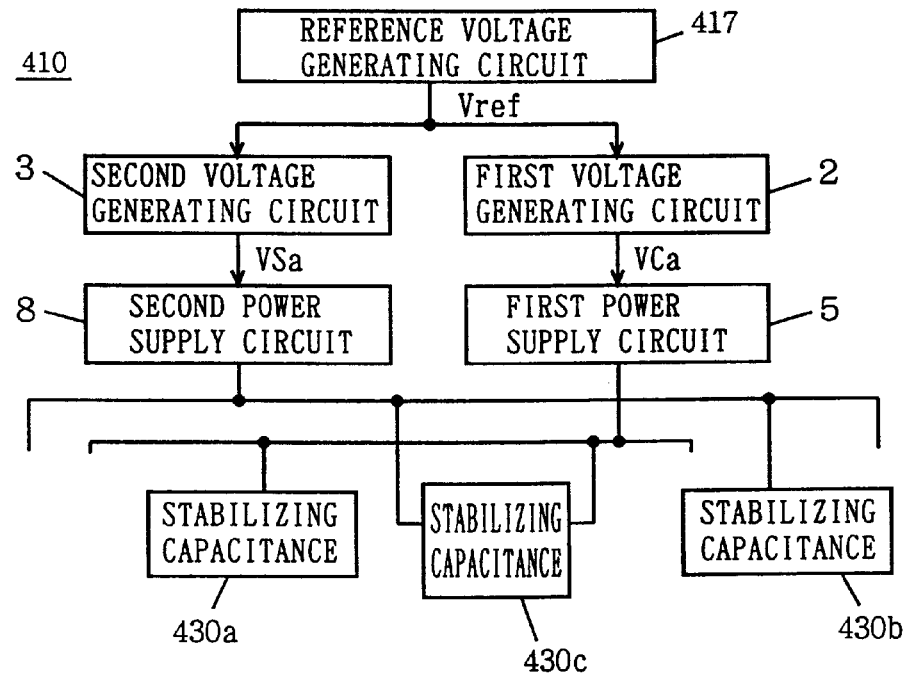
FIG. 62 schematically shows another structure of the stabilizing capacitor shown in FIG. 60.

FIG. 62 shows another structure of the stabilizing capacitor shown in FIG. 60. In FIG. 62, a stabilizing capacitance 430c is provided between the output nodes of first and second power supply circuits 5 and 8 in addition to stabilizing capacitances 430a and 430b. Owing to arrangement of stabilizing capacitance 430c between first and second power supply circuits 5 and 8, the charging/discharging currents of stabilizing capacitances 430a and 430b can be reduced, and each driver can rapidly drive the corresponding bus line.

[Modification 3]

Figure 63:
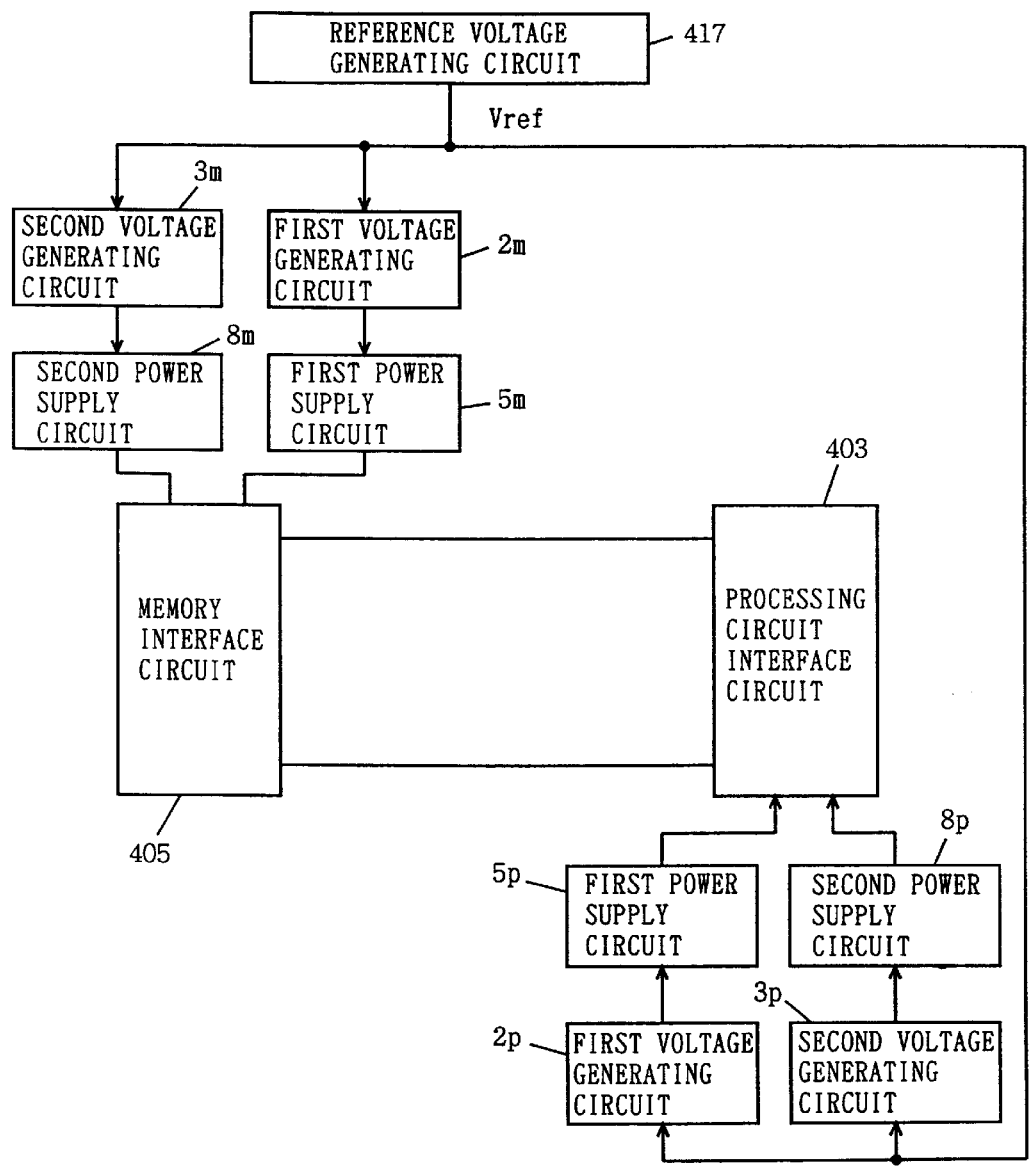
FIG. 63 schematically shows a structure of a modification 3 of the embodiment 26 of the invention.

FIG. 63 shows a structure of a modification 3 of the semiconductor integrated circuit according to the embodiment 26 of the invention. In FIG. 63, power supply circuits for interface circuit 405 coupled to the memory are independent from power supply circuits for interface circuit 403 coupled to the processing circuit.

For the memory interface circuit 405, first and second power supply circuits 2m and 3m which generate first and second voltages respectively in accordance with the reference voltage supplied from reference voltage generating circuit 417 are provided and also first and second power supply circuits 5m and 8m which produce first and second power supply voltages respectively in accordance with the voltages supplied from first and second voltage generating circuits 2m and 3m are provided. Memory interface circuit 405 includes a driver (output circuit) which receives, as the operation power supply voltages, the power supply voltages from first and second power supply circuits 5m and 8m.

For the processing circuit interface circuit 403, first and second voltage generating circuits 2p and 3p which generate first and second voltages respectively based on reference voltage Vref supplied from reference voltage generating circuit 417 are provided, and also first and second power supply circuits 5p and 8p which produces first. and second power supply voltages respectively based on the voltages supplied from first and second voltage generating circuits 2p and 3p are provided. A driver (output circuit) included in processing circuit interface circuit 403 receives, as the operation power supply voltages, the power supply voltages from first and second power supply circuits 5p and 8p.

In the structure in which the power supply circuits independent from each other are provided for memory interface circuit 405 and for processing circuit interface circuit 403, as shown in FIG. 63, the drivers included in memory interface circuit 405 and in processing circuit interface circuit 403 may operate simultaneously, for example, upon the mode change from the data write mode to the data read mode. However, even in this case, interface circuits 405 and 403 can be stably supplied with the power supply voltages, and data can be transferred precisely.

In the structure shown in FIG. 63, a stabilizing capacitor may be provided for each power supply circuit.

[Modification 4]

Figure 64:
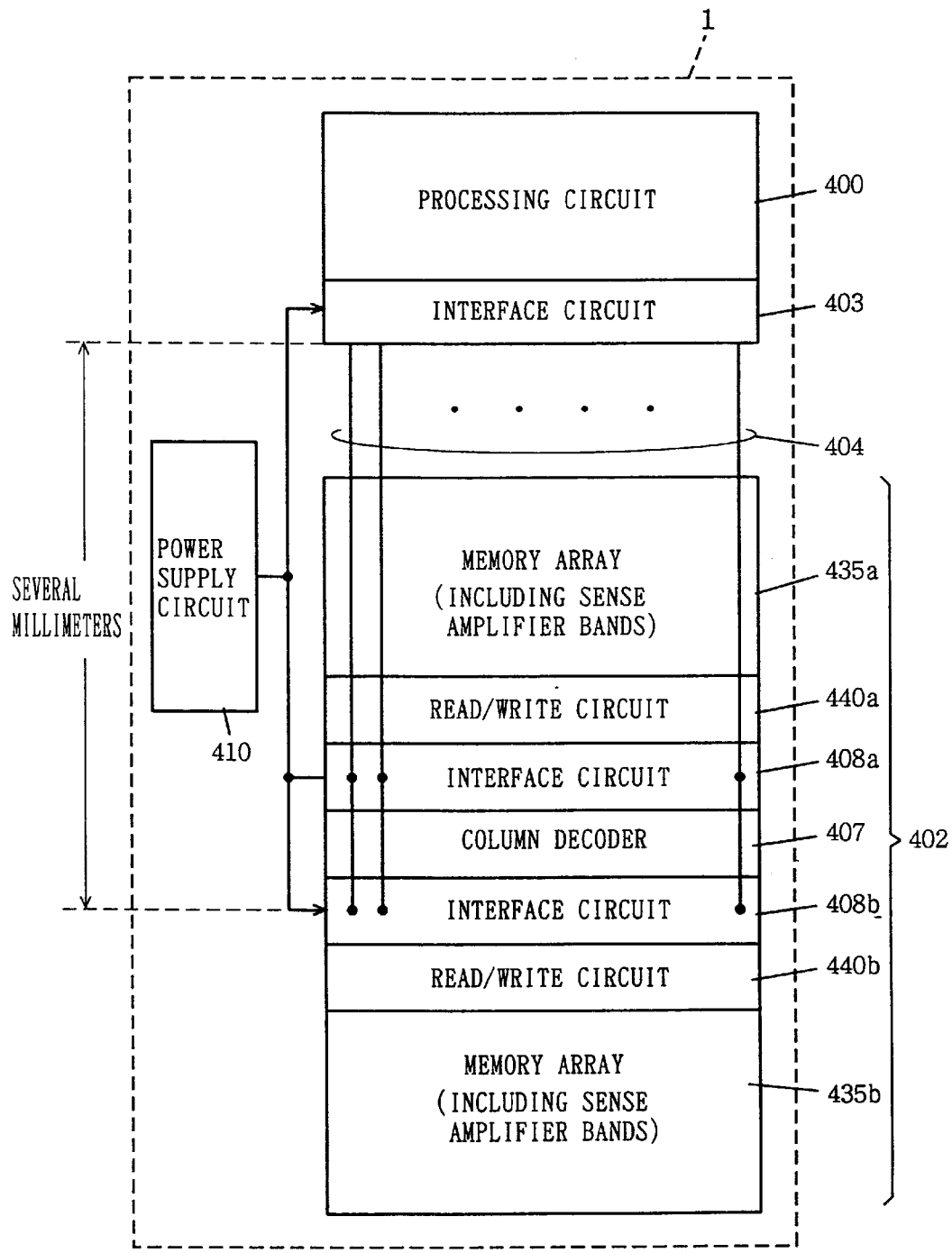
FIG. 64 schematically shows a structure of a modification 4 of the embodiment 26 of the invention.
Figure 65:
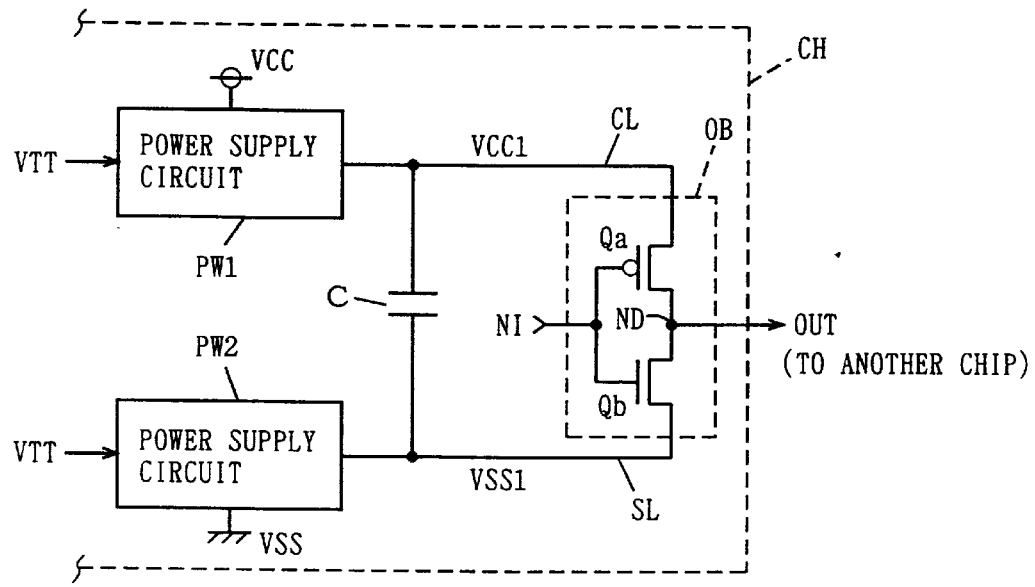
FIG. 65 schematically shows a structure of an output portion of a semiconductor integrated circuit in the prior art.
Figure 66:
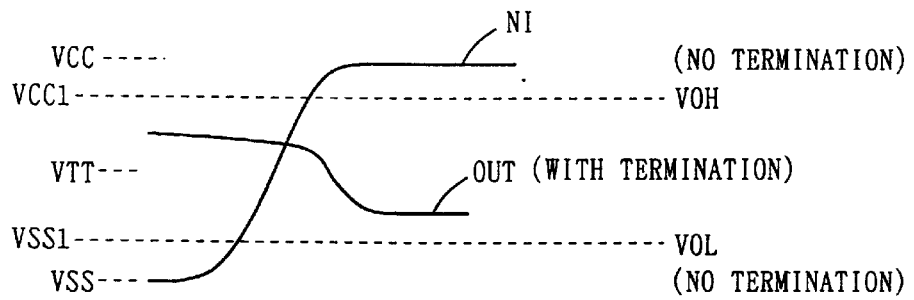
FIG. 66 is a signal waveform diagram representing an operation of the semiconductor integrated circuit shown in FIG. 65.
Figure 67:
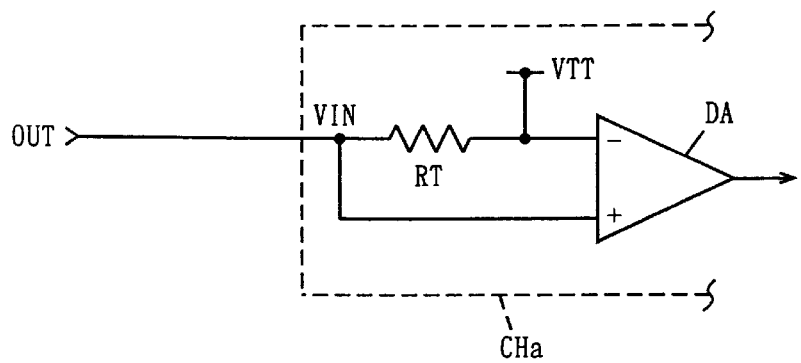
FIG. 67 schematically shows a structure of an input portion of the semiconductor integrated circuit in the prior art.
Figure 68:
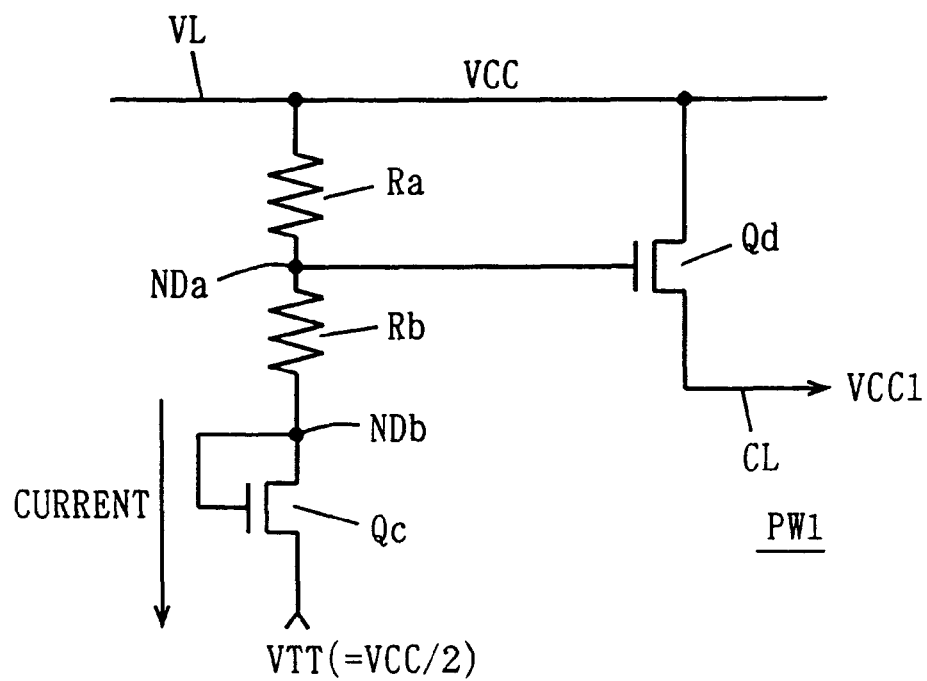
FIG. 68 shows a structure of a power supply circuit shown in FIG. 65.

FIG. 64 schematically shows a structure of a modification 4 of the embodiment 26 of the invention. In the structure of an integrated circuit 1 shown in FIG. 64, sense amplifier bands are dispersed within memory arrays 435a and 435b. More specifically, each of memory arrays 435a and 435b is divided into a plurality of blocks in row and column directions, and each sense amplifier band is arranged between the blocks neighboring to each other in the column direction. A read/write circuit 440a for reading and writing data from and into a selected memory cell in memory array 435a is arranged between memory array 435a and interface circuit 408a. A read/write circuit 440b for transmitting data from and into a selected memory cell in memory array 435b is arranged between memory array 435b and interface circuit 408b.

Each of read/write circuits 440a and 440b includes a main amplifier for reading data read from the selected memory cell, and a write drive circuit for writing data into the selected memory cell. These main amplifier and the write driver are provided corresponding to each driver (output circuit) and each receiver included in the interface circuit, respectively.

In the structure shown in FIG. 64, each of memory arrays 435a and 435b has a bank structure, and one of memory arrays 435a and 435b transmit the data with the processing circuit.

In the structure shown in FIG. 64, internal data transfer timings in memory arrays 435a and 435b are controlled by control circuits (not shown) so as to be matched with the data read/write timings in read/write circuits 440a and 440b operating at the CMOS level, respectively, and interface circuits 408a and 408b can operate independently of the timing of actual internal data transfer (actual data transfer to and from each memory array) so that data transfer control can be made easy. The receiver circuits included in interface circuits 408a and 408b are not required to drive the sense amplifiers directly, and therefore the required current driving cap ability thereof can be reduced so that an area occupied by these circuits can be reduced.

The Structures other than the above are the same as those shown in FIG. 53. Owing to data bus driving by interface circuits 403, 408a and 408b, it is possible to achieve the low current consumption, low power supply noises, low power consumption and fast data signal transfer.

The structure of the memory array in the present embodiment has not been specifically described. However, the memory cells included in the memory array may be either static memory cells or dynamic memory cells, and also may be flash memory cells. Thus, the memory may be any one of an SRAM (Static Random Access Memory), a DRAM (Dynamic Random Access Memory) and a flash memory (collectively erasable EEPROM). Also, the memory may be a clock synchronous memory which operates in synchronization with a clock signal.

According to the embodiment 26 of the invention, in the semiconductor integrated circuit having a processing circuit and a memory integrated together, a driver (output circuit) generating a signal of a small amplitude is provided at each bus line between the memory and the processing circuit. Therefore, the semiconductor integrated circuit can operate fast and stably.

[Another Example of Application]

The invention may be used in a system including a terminating resistance arranged on a transmission line. A driving capability of a transistor in an output stage can be increased independently of a residence value of this terminating resistance so that a system allowing fast operation can be implemented.

As described above, the invention can provide a semiconductor integrated circuit which can stably produce the internal power supply voltage at a predetermined voltage level according to the reference voltage, and can operate stably and fast.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:

a first insulated gate field effect transistor coupled between a first node and an output node for electrically connecting said output node and said first node in accordance with a supplied internal signal;

a second insulated gate field effect transistor coupled between a second node and said output node for being turned on complementarily with said first insulated gate field effect transistor to connect electrically said output node and said second node in accordance with the internal signal;

first voltage generating circuitry for receiving a reference voltage at an input having a high input impedance, to produce a constant voltage between said reference voltage and a voltage of a first voltage source;

first internal power supply circuitry for supplying a current from a first power supply to said first node in accordance with a difference between an output voltage of said first voltage generating circuitry and a voltage on said first node;

second voltage generating circuitry for receiving said reference voltage at an input having a high input impedance, to generate a constant voltage between said reference voltage and a voltage of a second voltage source; and second internal power supply circuitry for supplying a current from said second node to a second power supply different from said first power supply in accordance with a difference between an output voltage of said second voltage generating circuitry and a voltage on said second node.

2. The semiconductor integrated circuit according to claim 1, further comprising:

a first capacitance element coupled to said first node for stabilizing the voltage on said first node; and a second capacitance element provided independently of said first capacitance element and coupled to said second node for stabilizing the voltage on said second node.

3. The semiconductor integrated circuit according to claim 1, wherein said first internal power supply circuitry includes, a third insulated gate field effect transistor coupled between said first power supply and said first node, and a first comparison circuit for making a comparison between the output voltage of said first voltage generating circuitry and the voltage on said first node, to generate a signal according to a result of the comparison to a gate of said third insulated gate field effect transistor; and said second internal power supply circuitry includes, a fourth insulated gate field effect transistor coupled between said second power supply and said second node, and having a conductivity type different from that of said third insulated gate field effect transistor, and a second comparison circuit for making a comparison between the output voltage of said second voltage generating circuitry and the voltage on said second node, to generate a signal according to a result of the comparison to a gate of said fourth insulated gate field effect transistor.

4. The semiconductor integrated circuit according to claim 1, wherein said first internal power supply circuitry includes a third insulated gate field effect transistor connected between said first node and said first power supply, and receiving at a gate thereof the output voltage of said first voltage generating circuitry, and said second internal power supply circuitry includes a fourth insulated gate field effect transistor connected between said second node and said second power supply, and receiving at a gate thereof the output voltage of said second voltage generating circuitry.

5. The semiconductor integrated circuit according to claim 1, wherein said first voltage generating circuitry includes a resistance element, and a series body of at least one diode-connected insulated gate field effect transistor and an insulated gate field effect transistor receiving at a gate thereof said reference voltage connected in series between the first voltage source supplied with a predetermined voltage equal to or higher than the voltage of said first power supply and the second voltage source supplied with a voltage equal to or lower than the voltage of said second power supply, a voltage determining the voltage level on said first node being generated from a connection node between said resistance element and said at least one diode-connected transistor.

6. The semiconductor integrated circuit according to claim 1, wherein said second voltage generating circuitry includes an insulated gate field effect transistor receiving at a gate thereof said reference voltage, and a series body of at least one diode-connected insulated gate field effect transistor and a resistance element connected in series between the first voltage source supplied with a voltage equal to or higher than the voltage of said first power supply and the second voltage source supplied with a voltage equal to or lower than the voltage of said second power supply, a voltage determining the voltage level on said second node being generated from a connection node between said at least one diode-connected transistor and said resistance element.

7. The semiconductor integrated circuit according to claim 1, wherein said output node is provided in plurality, the output nodes are each coupled to each respective pair of the first and second insulated gate field effect transistors, and the first and second nodes are arranged commonly to the output nodes.

8. The semiconductor integrated circuit according to claim 1, further comprising connection nodes for connecting discrete first and second capacitance elements arranged outside a semiconductor chip having said semiconductor integrated circuit formed thereon to the first and second nodes, respectively.

9. The semiconductor integrated circuit according to claim 1, wherein said first voltage generating circuitry includes:

comparison voltage generator coupled to said first internal power supply circuitry for generating a voltage corresponding to a voltage applied to an input node of said first internal power supply circuitry, comparator for making a comparison between said reference voltage and the output voltage of said comparison voltage generator, and a drive element connected between a drive node supplied with a voltage equal to or higher than the voltage of said first power supply and the input node of said first internal power supply circuitry for supplying a current from said drive node to the input node of said first internal power supply circuitry in accordance with the output signal of said comparator.

10. The semiconductor integrated circuit according to claim 1, wherein said second voltage generating circuitry includes:

comparison voltage generator coupled to an input node of said second internal power supply circuitry for generating a voltage corresponding to a voltage on said input node, comparator for making a comparison between said reference voltage and the output voltage of said comparison voltage generator, and a drive element connected between a drive node supplied with a voltage equal to or lower than the voltage of said second power supply and the input node of said second internal power supply circuitry for supplying a current from the input node of said second internal power supply to said drive node in accordance with the output signal of said comparator.

11. The semiconductor integrated circuit according to claim 2, further comprising:

a plurality of stacked capacitor type memory cells arranged in rows and columns, a plurality of word lines arranged correspondingly to said rows, respectively, each of the word lines connected to the memory cells in a corresponding row, and a plurality of bit line pairs arranged correspondingly to said columns, respectively, each of the bit line pairs connected to the memory cells in a corresponding column, wherein each of the first and second capacitance elements includes:

a semiconductor substrate region of a first conductivity type;

a plurality of impurity regions of the first conductivity type formed separatedly at the surface of said semiconductor substrate region, said plurality of impurity regions including a first impurity region corresponding to regions electrically connected to a corresponding to bit lines of the memory cells, and second impurity regions corresponding to regions electrically connected to capacitors of the memory cells;

a plurality of first conductive layers electrically connected to each respective second impurity region, formed at a same common level as one electrode of the capacitor, and separated from each other;

a a bit-line-corresponding conductive layer electrically connected to said first impurity region, and formed at a same common level as the bit line;

a word-line-corresponding conductive layer formed on said semiconductor substrate region and at a same common level as said word line; and a second conductive layer formed covering the first conductive layers at a same common level as the other electrode of the capacitor, said semiconductor substrate region serving as one electrode of the capacitance element, and said second conductive layer serving as the other electrode.

12. The semiconductor integrated circuit according to claim 2, further comprising:

a plurality of stacked capacitor type memory cells arranged in rows and columns;

a plurality of word lines arranged correspondingly to said rows, respectively, each of the word lines connected to the memory cells in a corresponding row; and a plurality of bit line pairs arranged correspondingly to said columns, respectively, each of the bit line pairs connected to the memory cells in a corresponding column, wherein each of said first and second capacitance elements includes:

a semiconductor substrate region;

a word-line-corresponding conductive layer formed on said semiconductor substrate region and at a same common level as the word lines;

a bit-line-corresponding conductive layer formed on said word-line-corresponding conductive layer, facing to said word-line-corresponding conductive layer, and formed at a same common level as said bit-line-corresponding conductive layer;

a plurality of first conductive layers separatedly formed on said bit-line-corresponding conductive layer and at a same common level as one electrode layer of a capacitor of each of the memory cells, and electrically connected to said bit-line-corresponding conductive layer; and a second conductive layer formed at a same common level as the other electrode of the capacitor of each of the memory cells, said bit-line-corresponding conductive layer and said semiconductor covering said plurality of first conductive layers substrate region being electrically interconnected to form one electrode of the capacitance element, and said word-line-corresponding conductive layer and said second conductive layer being electrically interconnected to form the other electrode of the capacitance element.

13. The semiconductor integrated circuit according to claim 2, further comprising:

a plurality of stacked capacitor type memory cells arranged in rows and columns;

a plurality of word lines arranged corresponding to said rows, respectively, each of the word lines connected to the memory cells in a corresponding row; and a plurality of bit line pairs arranged correspondingly to said columns, respectively, each of the bit line pairs connected to the memory cells in a corresponding column, wherein each of said first and second capacitance elements includes:

a semiconductor substrate region of a first conductivity type;

a first impurity region of a second conductivity type formed at a peripheral portion of a surface of said semiconductor substrate region;

a second impurity region of a first conductivity type formed neighboring to said first impurity region at a peripheral portion of the surface of said semiconductor substrate region;

a word-line-corresponding conductive layer formed on said semiconductor substrate region and at a same common level as the word lines;

first conductive layers formed separatedly on said word-line-corresponding conductive layer and at a same level as one electrode layer of a capacitor of each of the memory cells and electrically connected to said word-line-corresponding conductive layer; and a second conductive layer formed covering said first conductive layers at a same common level as the other electrode of the capacitor of each of the memory cells, said first conductive layer being electrically connected to one electrode node of the capacitance element, and said second conductive layer and the first and second impurity regions being electrically connected to the other electrode node of the capacitance element.

14. A semiconductor integrated circuit comprising:

a first voltage generating circuit for generating and transmitting a voltage lower than a voltage of a first power supply to a first node;

a second voltage generating circuit for generating and transmitting a voltage higher than a voltage of a second power supply to a second node;

an output circuit connected between the first and second nodes for transmitting a voltage at a voltage level on one of the first and second nodes to an output node in accordance with a supplied internal signal;

a first capacitance element coupled to said first node for stabilizing the voltage on said first node;

a second capacitance element coupled to said second node for stabilizing the voltage on said second node; and a third capacitance element connected between the first and second nodes.

15. The semiconductor integrated circuit according to claim 14, wherein the first and second capacitance elements have capacitance values equal to each other.

16. The semiconductor integrated circuit according to claim 14, wherein the first and second capacitance elements have a capacitance value equal to each other and wherein said semiconductor integrated circuit further comprises:

a fourth capacitor element coupled to said first node, and having a same common capacitance value as said first capacitance element; and a fifth capacitance element coupled to said second node, and having a same common capacitance value as said second capacitance element.

17. A semiconductor integrated circuit comprising:

a first voltage generating circuit for generating and transmitting a voltage lower than a voltage of a first power supply to a first node;

a second voltage generating circuit for generating and transmitting a voltage higher than a voltage of a second power supply to a second node;

an output circuit receiving as operation power supply voltages the voltages on the first and second nodes, for driving an output node in accordance with a supplied internal signal;

a first capacitance element connected between said first node and a first reference node receiving a voltage of a same common polarity as the voltage of said first power supply;

a second capacitance element connected between said second node and a second reference node receiving a voltage of a same common polarity as the voltage of said second power supply;

a third capacitance element connected between said first node and said second reference node; and a fourth capacitance element connected between said second node and said first reference node.

18. The semiconductor integrated circuit according to claim 1, further comprising:

a memory array having a plurality of memory cells, a plurality of internal data bus lines for transferring data with a selected memory cell in said memory array, and a processing circuit for transferring the data with said memory array through said plurality of internal data bus lines, wherein output means formed of a pair of the first and second insulated gate field effect transistors is provided corresponding to each of said plurality of internal data bus lines and is arranged between said memory array and said processing circuit.

19. The semiconductor integrated circuit according to claim 14, further comprising:

a memory array having a plurality of memory cells, a plurality of internal data bus lines for transferring data with a selected memory cell in said memory array, and a processing circuit for transferring the data with said memory array through said plurality of internal data bus lines, wherein said output circuit is provided corresponding to each of said plurality of internal data bus lines and is arranged between said memory array and said processing circuit.

20. The semiconductor integrated circuit according to claim 17, further comprising:

a memory array having a plurality of memory cells, a plurality of internal data bus lines for transferring data with a selected memory cell in said memory array, and a processing circuit for transferring the data with said memory array through said plurality of internal data bus lines, wherein said output circuit is provided correspondingly to each of said plurality of internal data bus lines and is arranged between said memory array and said processing circuit.

* * * * *